(12) United States Patent
Rogerson et al.

(10) Patent No.: US 7,436,899 B2
(45) Date of Patent: Oct. 14, 2008

(54) METHOD AND APPARATUS FOR DATA TRANSFER USING WIDEBAND BURSTS

(75) Inventors: Gerald D. Rogerson, Poway, CA (US);
Jason L. Ellis, San Diego, CA (US);
David S. Furuno, San Diego, CA (US);
Michael L. Walker, San Diego, CA (US); Stephan W. Gehring, Menlo Park, CA (US)

(73) Assignee: General Atomics, San Diego, CA (US)

( * ) Notice: Subject to any disclaimer, the term of this patent is extended or adjusted under 35 U.S.C. 154(b) by 423 days.

(21) Appl. No.: 11/131,826

(22) Filed: May 17, 2005

(65) Prior Publication Data
US 2005/0232371 A1    Oct. 20, 2005

Related U.S. Application Data

(63) Continuation of application No. 10/255,111, filed on Sep. 26, 2002, now Pat. No. 6,895,059.

(60) Provisional application No. 60/359,147, filed on Feb. 20, 2002, provisional application No. 60/359,064, filed on Feb. 20, 2002, provisional application No. 60/359,045, filed on Feb. 20, 2002, provisional application No. 60/359,044, filed on Feb. 20, 2002, provisional application No. 60/326,093, filed on Sep. 26, 2001.

(51) Int. Cl.
*H04L 27/04* (2006.01)

(52) U.S. Cl. ...................................... 375/295; 375/265

(58) Field of Classification Search ................. 375/295, 375/265, 257, 267
See application file for complete search history.

(56) References Cited

U.S. PATENT DOCUMENTS

| | | | |
|---|---|---|---|
| 3,299,427 A | 1/1967 | Kondo et al. | |
| 3,728,632 A | 4/1973 | Ross | |

(Continued)

FOREIGN PATENT DOCUMENTS

WO    WO 01/22672    3/2001

(Continued)

OTHER PUBLICATIONS

PCT International Search Report, European Patent Office International Search Authority (EP/ISA), from corresponding PCT Application No. PCT/US02/30515, mailed Jun. 3, 2003, 5 pages.

(Continued)

*Primary Examiner*—Emmanuel Bayard
(74) *Attorney, Agent, or Firm*—Fitch, Even, Tabin & Flannery

(57) ABSTRACT

A method of data transmission according to one embodiment of the invention includes transmitting a plurality of bursts to transmit data, each burst occupying at least one of a plurality of frequency bands. Specifically, a bandwidth of at least one of the plurality of bursts is at least two percent of the center frequency of the burst. In one preferred embodiment, a bandwidth of at least one of the plurality of bursts is at least 100 MHz. In another preferred embodiment, each burst occupies at least one of the plurality of frequency bands, but less than all of the plurality of frequency bands.

29 Claims, 59 Drawing Sheets

U.S. PATENT DOCUMENTS

| | | | |
|---|---|---|---|
| 3,806,795 | A | 4/1974 | Morey |
| 3,945,012 | A | 3/1976 | Cooper |
| 4,105,950 | A | 8/1978 | Dingwall |
| 4,309,703 | A | 1/1982 | Blahut |
| 4,354,269 | A | 10/1982 | Vries et al. |
| 4,486,882 | A | 12/1984 | Piret et al. |
| 4,517,532 | A | 5/1985 | Neidorff |
| 4,614,945 | A | 9/1986 | Brunius et al. |
| 4,743,906 | A | 5/1988 | Fullerton |
| 4,813,057 | A | 3/1989 | Fullerton |
| 4,891,609 | A | 1/1990 | Eilley |
| 4,978,927 | A | 12/1990 | Hausman et al. |
| 4,979,186 | A | 12/1990 | Fullerton |
| 4,980,897 | A | 12/1990 | Decker et al. |
| 5,013,944 | A | 5/1991 | Fischer et al. |
| 5,045,811 | A | 9/1991 | Lewis |
| 5,050,188 | A | 9/1991 | Dirr |
| 5,208,557 | A | 5/1993 | Kersh, III |
| 5,262,735 | A | 11/1993 | Hashimoto et al. |
| 5,274,629 | A | 12/1993 | Helard et al. |
| 5,331,294 | A | 7/1994 | Watanabe et al. |
| 5,345,471 | A | 9/1994 | McEwan |
| 5,361,070 | A | 11/1994 | McEwan |
| 5,363,108 | A | 11/1994 | Fullerton |
| 5,418,499 | A | 5/1995 | Nakao |
| 5,420,546 | A | 5/1995 | Watanabe et al. |
| 5,455,593 | A | 10/1995 | Ross |
| 5,465,076 | A | 11/1995 | Yamauchi et al. |
| 5,471,176 | A | 11/1995 | Henson et al. |
| 5,471,223 | A | 11/1995 | McCorkle |
| 5,475,344 | A | 12/1995 | Maneatis et al. |
| 5,475,677 | A | 12/1995 | Arnold et al. |
| 5,504,783 | A | 4/1996 | Tomisato et al. |
| 5,523,758 | A | 6/1996 | Harmuth |
| 5,523,760 | A | 6/1996 | McEwan |
| 5,526,343 | A | 6/1996 | Aizawa et al. |
| 5,553,064 | A * | 9/1996 | Paff et al. ............... 370/478 |
| 5,586,145 | A | 12/1996 | Morgan et al. |
| 5,592,170 | A | 1/1997 | Price et al. |
| 5,592,177 | A | 1/1997 | Barrett |
| 5,648,967 | A | 7/1997 | Shulz |
| 5,661,762 | A | 8/1997 | Petranovich et al. |
| 5,666,382 | A | 9/1997 | Thakore |
| 5,672,007 | A | 9/1997 | Brown et al. |
| 5,677,927 | A | 10/1997 | Fullerton et al. |
| 5,710,765 | A | 1/1998 | Lee et al. |
| 5,739,796 | A | 4/1998 | Jasper, Jr. et al. |
| 5,764,690 | A | 6/1998 | Blanchard et al. |
| 5,774,450 | A | 6/1998 | Harada et al. |
| 5,790,527 | A | 8/1998 | Janky et al. |
| 5,815,794 | A | 9/1998 | Williams |
| 5,854,603 | A | 12/1998 | Heger |
| 5,880,699 | A | 3/1999 | McCorkle |
| 5,883,591 | A | 3/1999 | McEwan |
| 5,901,172 | A | 5/1999 | Fontana et al. |
| 5,952,956 | A | 9/1999 | Fullerton |
| 5,963,581 | A | 10/1999 | Fullerton et al. |
| 6,002,708 | A | 12/1999 | Fleming et al. |
| 6,008,700 | A | 12/1999 | Pietrzyk |
| 6,026,125 | A | 2/2000 | Larrick, Jr. et al. |
| 6,031,862 | A | 2/2000 | Fullerton et al. |
| 6,054,950 | A | 4/2000 | Fontana |
| 6,061,406 | A | 5/2000 | Carson et al. |
| 6,075,415 | A | 6/2000 | Milton et al. |
| 6,151,296 | A | 11/2000 | Vijayan et al. |
| 6,154,501 | A | 11/2000 | Friedman |
| 6,185,258 | B1 | 2/2001 | Alamouti et al. |
| 6,191,724 | B1 | 2/2001 | McEwan |
| 6,198,781 | B1 | 3/2001 | Ohno et al. |
| 6,204,694 | B1 | 3/2001 | Sunter et al. |
| 6,233,205 | B1 | 5/2001 | Wells et al. |
| 6,252,909 | B1 | 6/2001 | Tzannes et al. |
| 6,275,544 | B1 | 8/2001 | Aiello et al. |
| 6,289,038 | B1 | 9/2001 | Park |
| 6,353,637 | B1 | 3/2002 | Mansour et al. |
| 6,377,566 | B1 | 4/2002 | Cupo et al. |
| 6,407,986 | B1 | 6/2002 | Dutta |
| 6,438,115 | B1 | 8/2002 | Mazur et al. |
| 6,442,211 | B1 | 8/2002 | Hampel et al. |
| 6,442,214 | B1 | 8/2002 | Boleskei et al. |
| 6,445,425 | B1 | 9/2002 | Limberg |
| 6,459,703 | B1 * | 10/2002 | Grimwood et al. .......... 370/442 |
| 6,487,258 | B1 | 11/2002 | Jedwab et al. |
| 6,603,818 | B1 | 8/2003 | Dress, Jr. et al. |
| 6,608,552 | B1 * | 8/2003 | Fogel et al. ............ 340/310.11 |
| 6,625,222 | B1 | 9/2003 | Bertonis et al. |
| 6,791,966 | B1 * | 9/2004 | Mikkola et al. ............. 370/343 |
| 6,810,023 | B1 | 10/2004 | Dillinger et al. |
| 6,885,694 | B1 | 4/2005 | He et al. |
| 6,895,059 | B2 * | 5/2005 | Rogerson et al. ............ 375/295 |
| 6,937,674 | B2 | 8/2005 | Santhoff et al. |
| 6,987,815 | B2 | 1/2006 | Denno |
| 7,187,647 | B1 | 3/2007 | Gerakoulis et al. |
| 7,187,715 | B2 | 3/2007 | Balachandran et al. |
| 2002/0097185 | A1 | 7/2002 | Hershey et al. |
| 2002/0154620 | A1 * | 10/2002 | Azenkot et al. ............. 370/347 |
| 2002/0155811 | A1 | 10/2002 | Prismantas et al. |
| 2002/0168003 | A1 | 11/2002 | Richards |
| 2002/0168991 | A1 * | 11/2002 | Kochanski et al. .......... 455/505 |
| 2003/0069025 | A1 | 4/2003 | Hoctor et al. |
| 2003/0090407 | A1 | 5/2003 | Santhoff et al. |
| 2003/0099299 | A1 | 5/2003 | Rogerson et al. |
| 2003/0202537 | A1 | 10/2003 | Rogerson et al. |
| 2004/0002347 | A1 | 1/2004 | Hoctor et al. |
| 2004/0008729 | A1 | 1/2004 | Rogerson et al. |
| 2004/0028011 | A1 | 2/2004 | Gehring et al. |
| 2004/0028012 | A1 | 2/2004 | Walker et al. |
| 2004/0048574 | A1 | 3/2004 | Walker et al. |

FOREIGN PATENT DOCUMENTS

| | | |
|---|---|---|
| WO | WO 01/39451 | 5/2001 |
| WO | WO 02/31986 | 4/2002 |
| WO | WO 0328255 | 4/2003 |
| WO | WO 0328255 A3 | 4/2003 |
| WO | WO 03/071682 | 8/2003 |
| WO | WO 03/071728 | 8/2003 |
| WO | WO 2004/032600 | 4/2004 |
| WO | WO 2004/032600 A3 | 8/2004 |

OTHER PUBLICATIONS

PCT International Search Report, United States International Search Authority (US/ISA), from corresponding PCT Application No. PCT/US03/05327, mailed Sep. 22, 2003, 5 pages.

PCT International Search Report, United States International Search Authority (US/ISA), from corresponding PCT Application No. PCT/US03/05309, mailed Sep. 23, 2003, 5 pages.

PCT International Search Report, United States International Search Authority (US/ISA), from corresponding PCT Application No. PCT/US03/05160, mailed May 21, 2004, 5 pages.

Barrett, History of Ultra WideBand (UWB) Radar & Communications: Pioneers and Innovators, Progress In Electromagnetics Symposium 2000 (PIERS2000), Jul. 2000, Cambridge, MA, 42 pages.

Foerster, Jeff, et al., Ultra-Wideband Technology for Short- or Medium-Range Wireless Communications, Intel Technology Journal Q2, 2001, 11 pages.

Hirt, Walter, Ultra-Wideband (UWB) Radio Technology (UWB-RT) Short-Range Communication and Location Tracking, Apr. 12, 2001, 4 pages.

Kahney, Leander, The Third-Generation Gap, Scientific American. com (http://www.sciam.com/print_version.cfm?articleID=00031A96-ADF7-1C73-9B81809EC588EF21), Oct. 20, 2000, 4 pages.

McCorkle, John, Project: IEEE P802.15 Working Group For Wireless Personalk Area Networks (WPANS)—A Tutorial on Ultrawideband Technology, XtremeSpectrum, Inc., Mar. 2000, 34 pages.

Siwiak; Ultra-Wide Band Radio: Introducing a New Technology; 2001; IEEE; pp. 1088-1093.

Uspto; Notice of Allowance from U.S. Appl. No. 10/255,111; mailed Jan. 3, 2005; 6 pages; FETF.

Uspto; Office Action from U.S. Appl. No. 10371,065; mailed Apr. 29, 2004; 14 pages; FETF.

Uspto; Office Action from U.S. Appl. No. 10/371,065; mailed Jun. 13, 2007; 12 pages; FETF.

Uspto; Final Office Action from U.S. Appl. No. 10/371,065; mailed Jan. 4, 2008; 12 pages; FETF.

Uspto; Office Action from U.S. Appl. No. 10/372,075; mailed Feb. 22, 2007; 6 pages; FETF.

Uspto; Notice of Allowance from U.S. Appl. No. 10/372,075; mailed Aug. 8, 2007; 10 pages; FETF.

Wipo; International Preliminary Examination Report from International App. No. PCT/US02/30515; mailed Apr. 18, 2005; 3 pages; FETF.

* cited by examiner

|  | band 1 | band 2 | band 3 | band 4 |
|---|---|---|---|---|
| time slot 1 | 1 | 0 | 0 | 1 |
| time slot 2 | 1 | 0 | 1 | 0 |
| time slot 3 | 1 | 0 | 1 | 0 |
| time slot 4 | 1 | 0 | 1 | 0 |

FIGURE 10

METHOD AND APPARATUS FOR DATA TRANSFER USING WIDEBAND BURSTS

RELATED APPLICATIONS

This application is a continuation of U.S. application Ser. No. 10/255,111 ("METHOD AND APPARATUS FOR DATA TRANSFER USING A TIME DIVISION MULTIPLE FREQUENCY SCHEME", filed Sep. 26, 2002), which claims the benefit of U.S. Provisional Patent Applications Nos. 60/326,093 ("FREQUENCY SHIFT KEYING WITH ULTRAWIDEBAND PULSES," filed Sep. 26, 2001); 60/359,044 ("POLARITY SIGNALING METHODS BASED ON TDMF UWB WAVEFORMS," filed Feb. 20, 2002); 60/359,045 ("CHANNELIZATION METHODS FOR TIME-DIVISION MULTIPLE FREQUENCY COMMUNICATION CHANNELS," filed Feb. 20, 2002); 60/359,064 ("HYBRID SIGNALING METHODS BASED ON TDMF UWB WAVEFORMS," filed Feb. 20, 2002); and 60/359,147 ("TRANSMITTER AND RECEIVER FOR A TIME-DIVISION MULTIPLE FREQUENCY COMMUNICATION SYSTEM," filed Feb. 20, 2002).

BACKGROUND

1. Field of the Invention

This invention relates to data transfer over wired, wireless, and/or optical transmission channels.

2. Background Information

As computing and communications applications become richer and more complex, it becomes desirable to support transfers of data between devices at higher and higher rates. The increasing popularity of consumer electronics, computing, and communicating devices, in various forms (e.g. mobile, hand-held, wearable, and fixed) and possibly with associated peripherals, indicates a clear demand for these types of devices and for connectivity (e.g. peer-to-peer and/or networked) between them. Unfortunately, present-day communications technologies fall short of providing the technical requirements necessary to support such demands.

Wireless connectivity may enable greater user experiences and possibly spur an increased demand for such devices. For example, wireless connectivity can provide enhanced capability; is expected to be easier to use; may encompass cost savings and increases in efficiency and productivity; and may increase possible device applications and/or deployments.

Use of such devices may include large data transfers and/or multimedia applications. For example, a cable replacement scenario for a computer, a consumer electronics device, or a similar device may need to support transfers of large amounts of data. Multimedia applications may handle multiple simultaneous streams of high-definition audio and/or video coming from devices such as business/entertainment systems and gateways.

Most existing wireless schemes transfer data via modulated continuous-wave carriers. In many cases, a portion of the radio-frequency spectrum is reserved for the exclusive use of the scheme. Such reservations allow these transfer schemes (e.g. commercial radio and TV broadcasts) to operate free of interference from other devices and without interfering with other systems.

Data transfers may be conducted over very narrow frequency bands in an attempt to occupy less of the frequency spectrum. However, such schemes may be more susceptible to increases in background noise level and to multipath interference. Some narrowband schemes may also be more likely to interfere with other systems (e.g. due to a higher concentration of energy in the particular frequency band being used).

Although battery technology is steadily improving, operating times between charges or replacement are still important factors in the design of portable devices. Complexity and cost of transmitter and receiver implementations are other important factors for consumer applications. Present-day solutions offer only a few of the necessary technical requirements. For example, some may provide low cost and low power consumption but only at low bit rate, while others may have higher bit rates but be unacceptable in terms of cost and/or rate of power consumption.

It is desirable to support high rates of data transfer. It may also be desirable for a scheme that supports high, medium, and/or low rates of data transfer to obtain one or more advantages such as 1) low power consumption, 2) low cost of implementation, and/or 3) an ability to coexist with interferers and/or with other frequency use. Other desirable advantages may include scalability with potential capability for backwards compatibility and/or an ability to determine position and/or location.

SUMMARY

A method of data transmission according to one embodiment of the invention includes transmitting a plurality of bursts to transmit data, each burst occupying at least one of a plurality of frequency bands. Specifically, a bandwidth of at least one of the plurality of bursts is at least two percent of the center frequency of the burst.

A method of data transmission according to another embodiment of the invention includes defining a plurality of frequency bands and transmitting a plurality of bursts, each burst occupying at least one of a plurality of frequency bands. Specifically, one of the plurality of bursts occupies a different one of the plurality of frequency bands than another one of the plurality of bursts, and a bandwidth of each of the plurality of bursts is at least two percent of the center frequency of the burst. The plurality of bursts transmit data.

BRIEF DESCRIPTION OF THE DRAWINGS

FIG. 10 shows a representation of one correspondence between an encoded symbol and burst activity over time slots and across different frequency bands for the series of FIG. 9.

DETAILED DESCRIPTION

In the description and claims that follow, certain terms may be defined as follows:

The term 'frequency band' denotes a portion of the frequency spectrum. The term 'center frequency' as applied to a frequency band denotes a frequency at the arithmetic mean of the frequencies of the boundaries of the frequency band. As defined herein, frequency bands may be adjacent to one another but are distinct from one another and do not overlap.

The term 'burst' denotes the emission of an amount of energy within a particular range of frequencies and over a limited period of time. A burst may include one or more cycles of a waveform (e.g. a sine wave). A burst may even be limited to less than one cycle of a waveform. In some applications, two or more bursts may be transmitted simultaneously. Beginning the transmission of a burst is also referred to as 'triggering' the burst. Transferring a burst from the generating circuitry (e.g. as described herein) to the transmission medium or channel is also referred to as 'launching' the burst.

Figure 59:
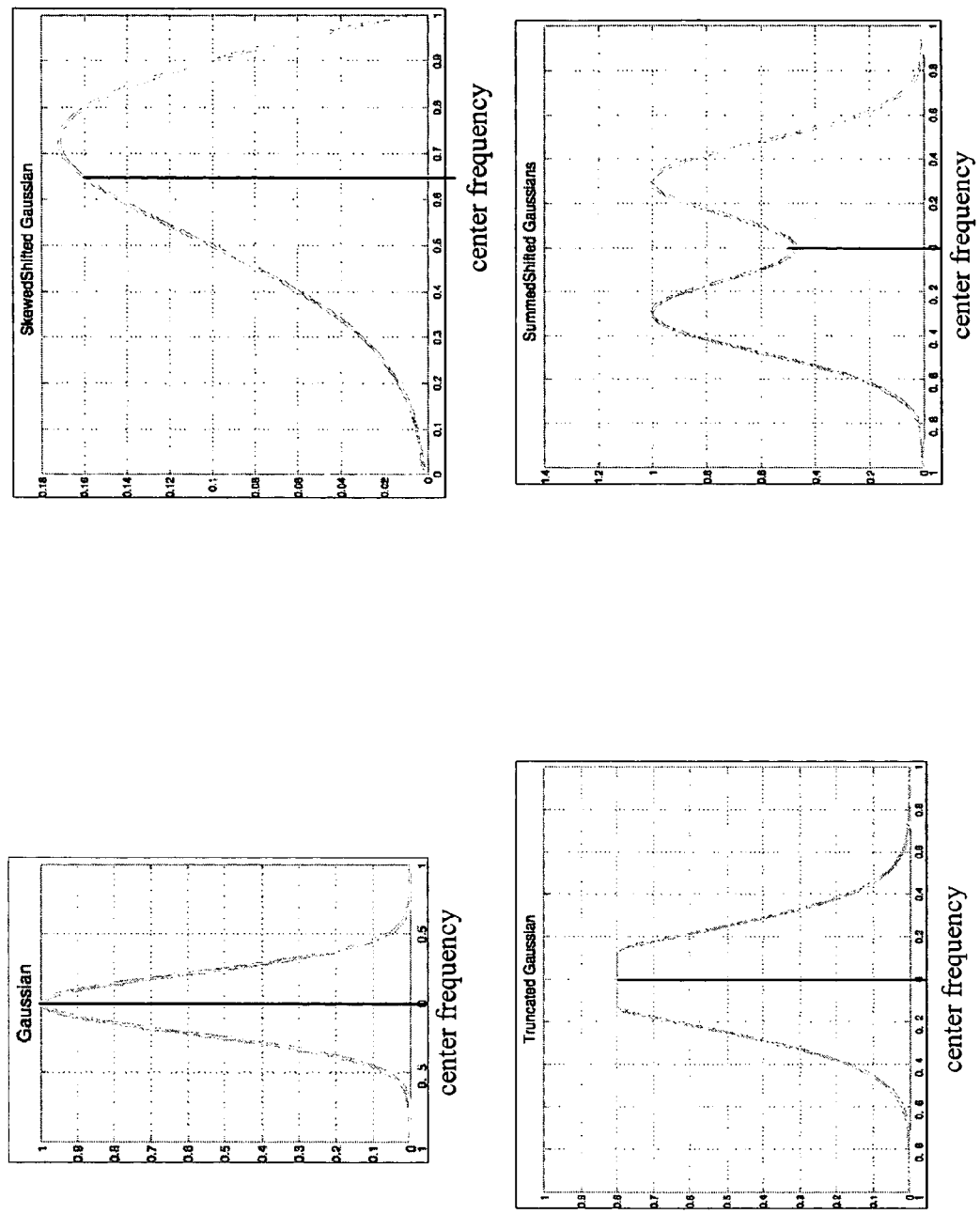
FIG. 59 shows examples of several bursts and their center frequencies.

The term 'bandwidth' denotes a continuous range of frequencies that contains at least 90% and not more than 95% of the total energy of a signal. The bandwidth of a burst may lie within more than one frequency band at a time. The term 'center frequency' as applied to a burst denotes the midpoint (along the frequency axis) of the energy distribution of the burst: i.e. the frequency at which the total energy of the burst on either side is fifty percent of the total energy of the burst (as in the examples illustrated in FIG. 59). A burst 'occupies' a frequency band when the center frequency of the burst is within the frequency band, such that a burst occupies no more than one frequency band at a time.

The term 'wideband' denotes a signal whose bandwidth is not less than 2% of its center frequency, and the term 'ultra- 'wideband' denotes a signal whose bandwidth is not less than 20% of its center frequency. For example, the bandwidth of an ultra-wideband signal may be up to 50% or more of the signal's center frequency. Ultra-wideband signals may be used at frequencies from less than tens of hertz to terahertz and beyond. Although most ultra-wideband use currently falls between 100 MHz and 10 GHz primarily due to present-day regulatory allocations, it is envisioned that future allocations will extend far beyond this frequency range.

Figure 1:
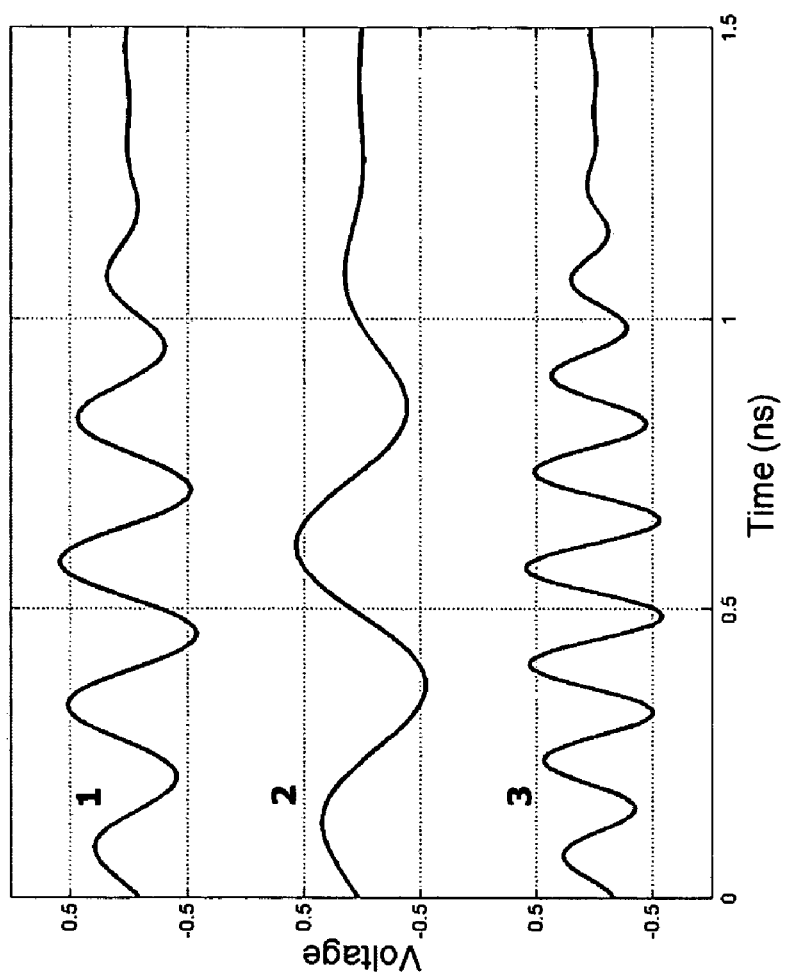
FIG. 1 shows examples of three ultra-wideband bursts at different frequencies.
Figure 2:
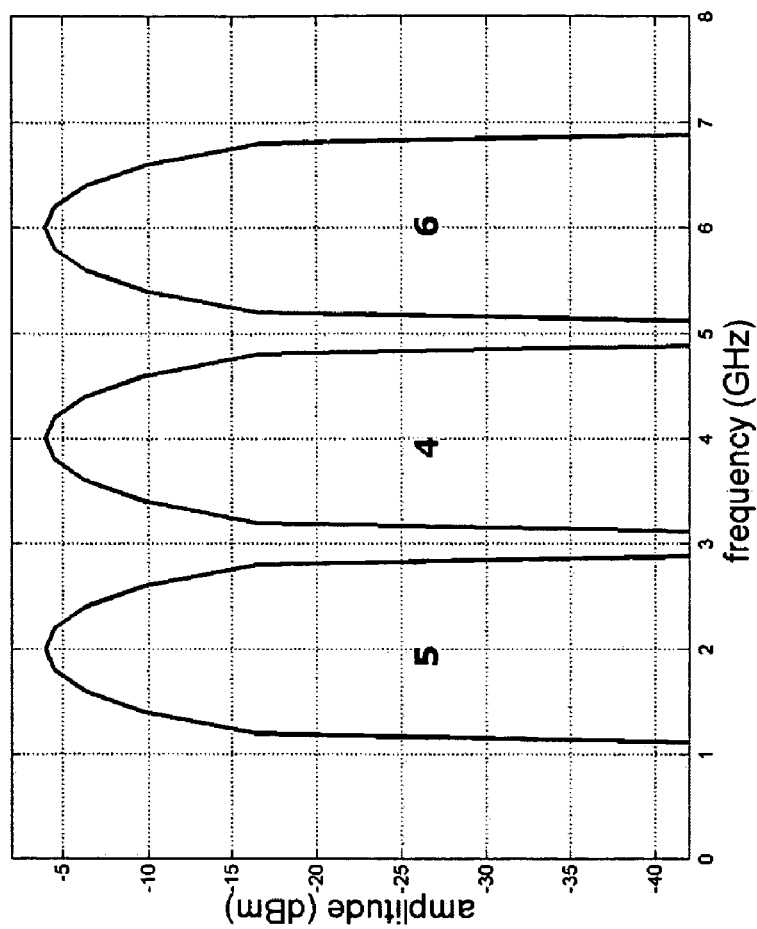
FIG. 2 shows the three bursts of FIG. 1 in the frequency domain.

FIG. 1 shows an example in the time domain of bursts in three different frequency bands. FIG. 2 shows an alternative representation of these three bursts in the frequency domain, where frequency bands 4, 5, and 6 correspond to waveforms 1, 2, and 3, respectively. In this example, the three frequency bands are easily distinguished from one another in the frequency domain.

The term 'time slot' denotes a defined period of time that separates moments at which bursts may be triggered. It may be desirable to observe a convention of triggering bursts only at the start of a time slot, such that during each time slot, no more than one burst is triggered per frequency band.

A period of time may be divided into a continuous series of consecutive and non-overlapping time slots of equal duration. Alternatively, sets of consecutive and non-overlapping time slots of one duration may be separated in time by one or more time slots of a different (e.g. a longer or even a shorter) duration. In a complex high-speed system, the length of a time slot may be measured in picoseconds. In a lower-speed system of less complexity, the length of a time slot may be in the nanosecond range. In other applications, time slots of shorter or greater length may be used as desired.

In the implementations described herein, the same time slot boundaries are observed across the various frequency bands. However, it is contemplated that two or more different time slot arrangements may be applied among the various frequency bands (e.g. that time slots in one frequency band may be longer than time slots in another frequency band, or that time slots in one frequency band may have constant length while time slots in another frequency band have varying length) in other implementations.

Figure 3:
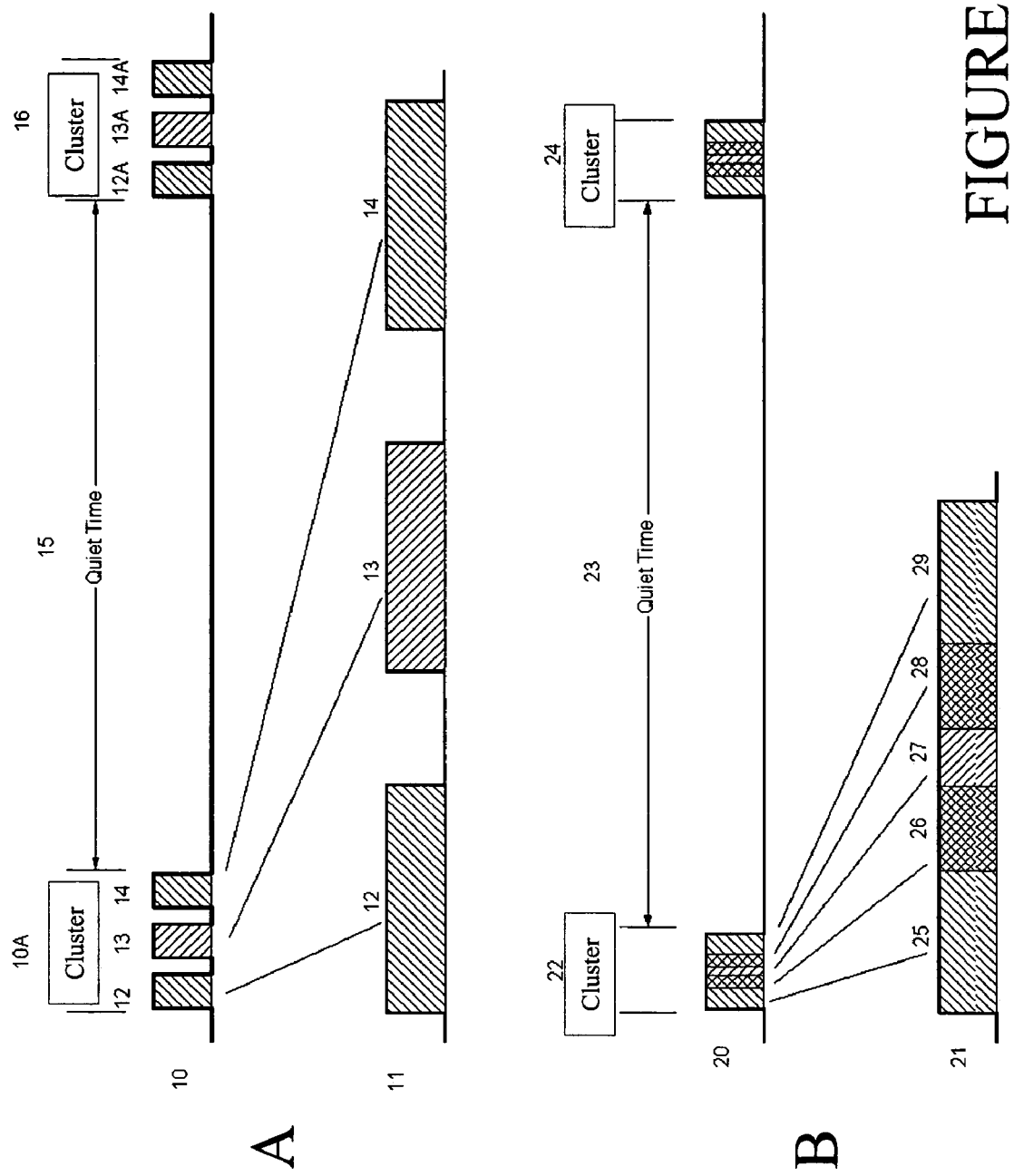
FIG. 3 shows a timing diagram.

FIG. 3 is an illustration of two examples in which sets of time slots are separated by periods during which no bursts are launched ('quiet time'). In example 3A (where different shadings indicate different frequency bands), each burst has a duration shorter than that of a time slot. However, it is also contemplated that in some applications a burst may have a duration longer than a time slot (e.g. as in example 3B), such that two or more bursts may overlap even if their corresponding time slots do not. In such cases, a series of bursts triggered during consecutive time slots in the same frequency band may represent different information than a single burst that extends over the same number of time slots.

Figure 4:
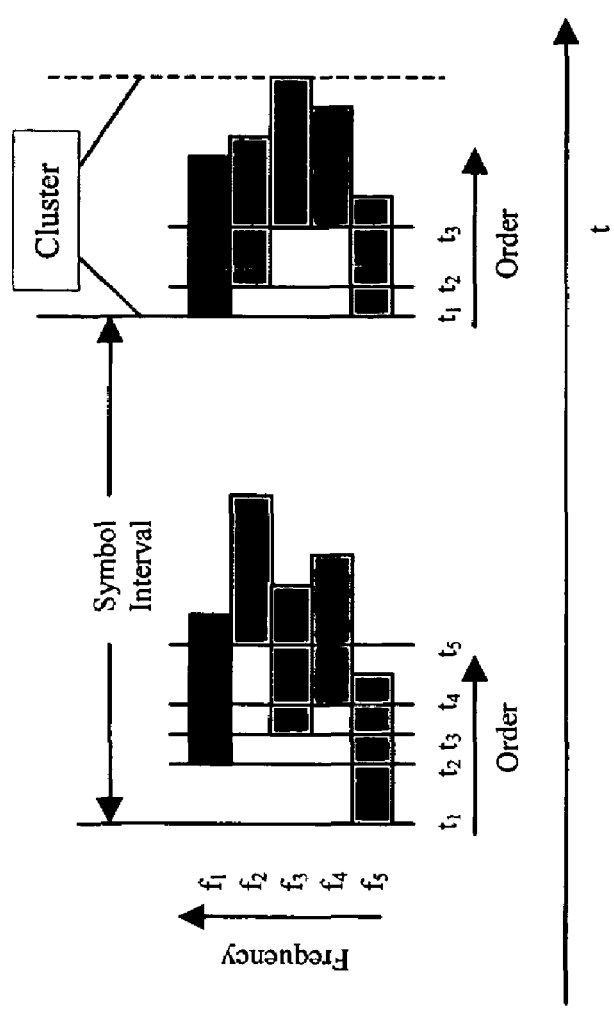
FIG. 4 shows a timing diagram.

The term 'symbol' denotes an ordered series of n-tuples that corresponds to an ordered set of data values. The term 'cluster' denotes a set of bursts corresponding to a symbol. The term 'symbol interval' denotes the period between the start of transmission of a cluster and the start of transmission of the next cluster and includes any 'quiet time' between the clusters. These terms are also illustrated by example in FIG. 3 and in FIG. 4, which shows consecutive clusters that each include overlapping bursts. In some applications as described herein, it is possible for no bursts to be launched during one or more of the time slots in each cluster.

'Quiet time' periods between clusters may be especially useful, for example, in asynchronous applications. In such cases, it may be desirable for the duration of a quiet time period to be greater than the duration of a time slot.

Figure 5:
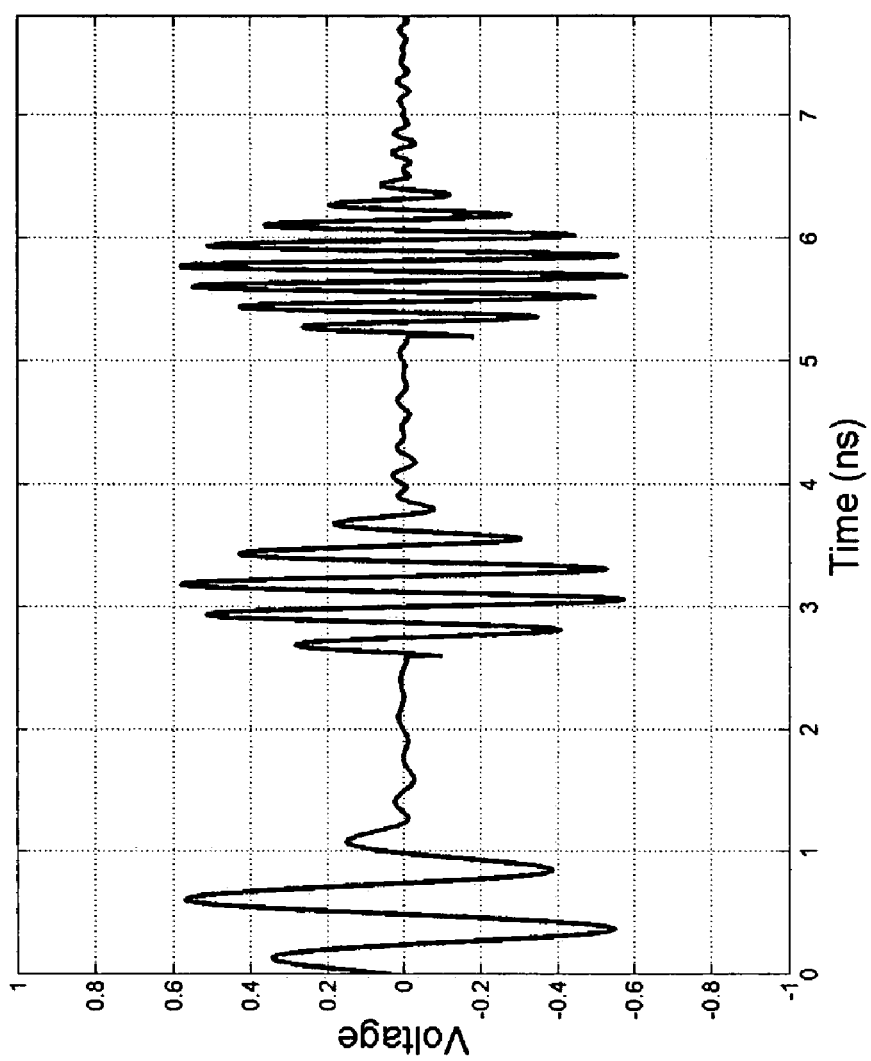
FIG. 5 shows a sequence of three ultra-wideband bursts in time.

In some applications clusters may not overlap (e.g., to reduce interference). FIG. 5 shows one example of a cluster that includes three bursts triggered at consecutive time slots. In this example, the start of each burst is delayed by about 2.5 nanoseconds from the start of the previous burst.

Figure 6:
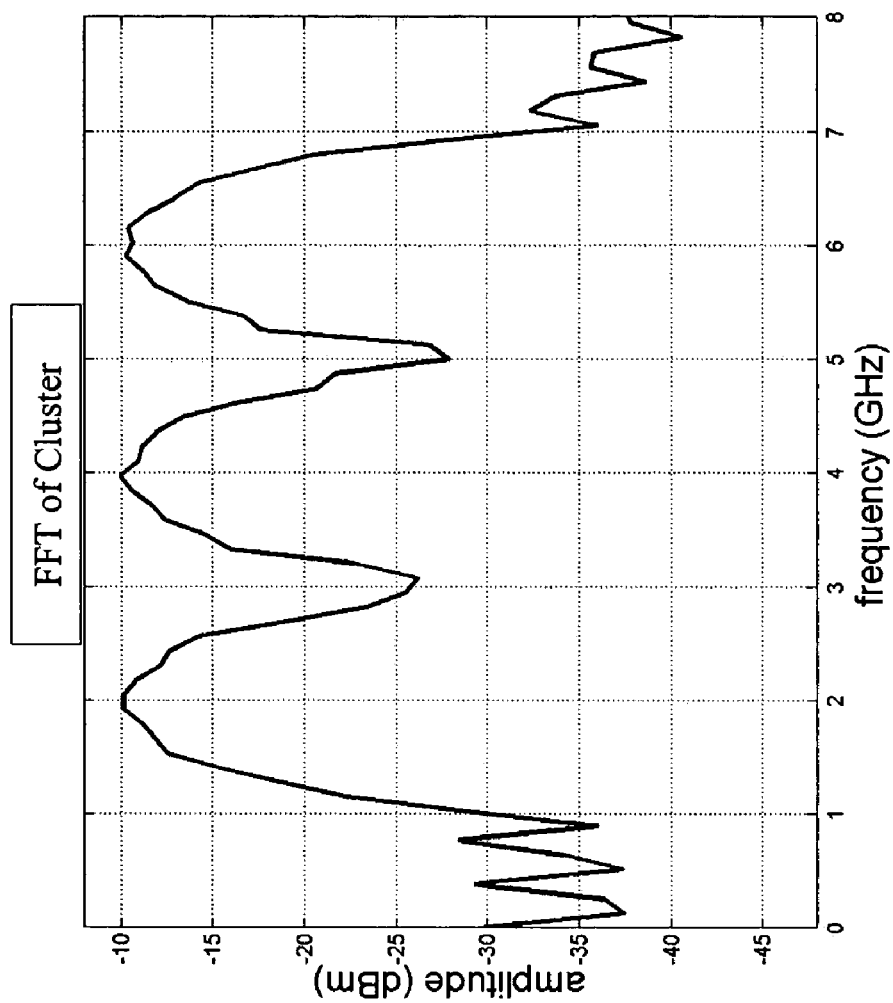
FIG. 6 shows the sequence of FIG. 5 in the frequency domain.
Figure 7:
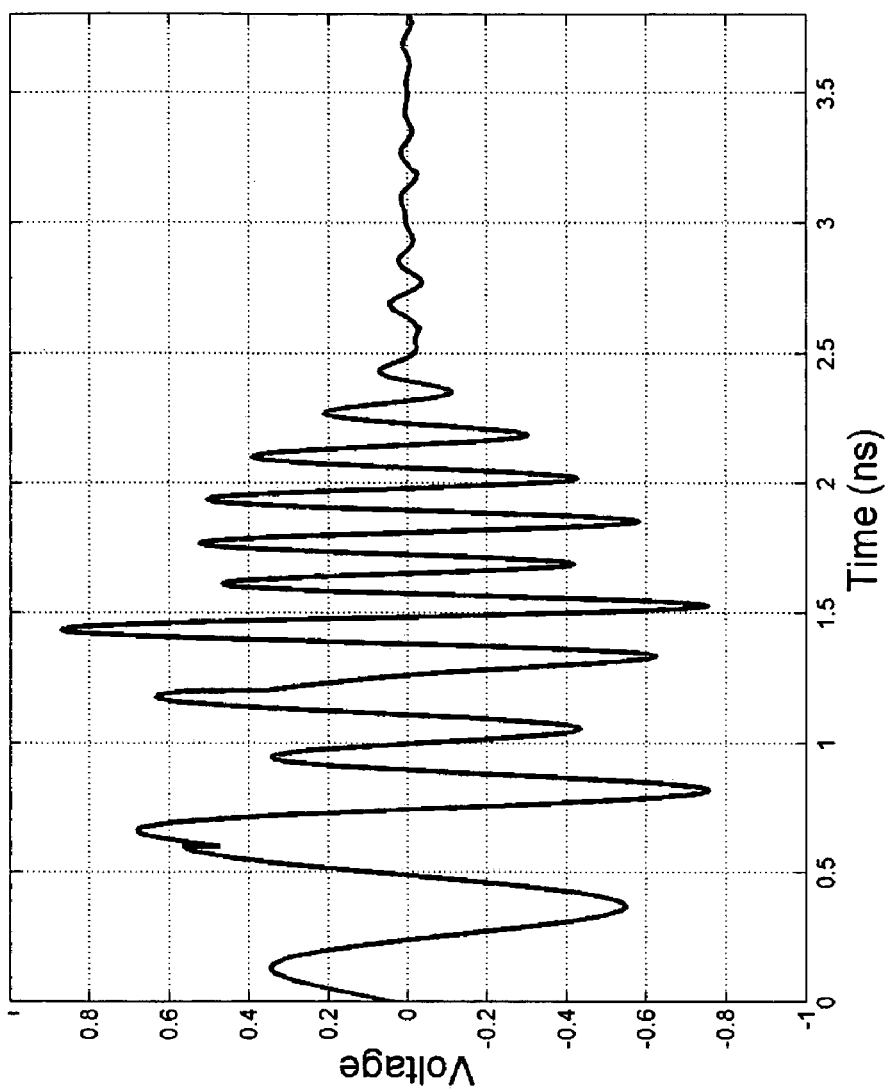
FIG. 7 shows a time-domain plot of overlapping ultra-wideband bursts.

FIG. 6 shows the cluster of FIG. 5 in the frequency domain. Although the three bursts overlap in frequency, they may still be distinguished at, e.g., their center frequencies. FIG. 7 shows a time-domain plot of a cluster that includes bursts which overlap in time. In some applications, bursts that overlap in time may be used (e.g. to support higher rates of data transfer) and/or bursts that overlap in frequency may be used (e.g. to support higher data density).

Figure 8:
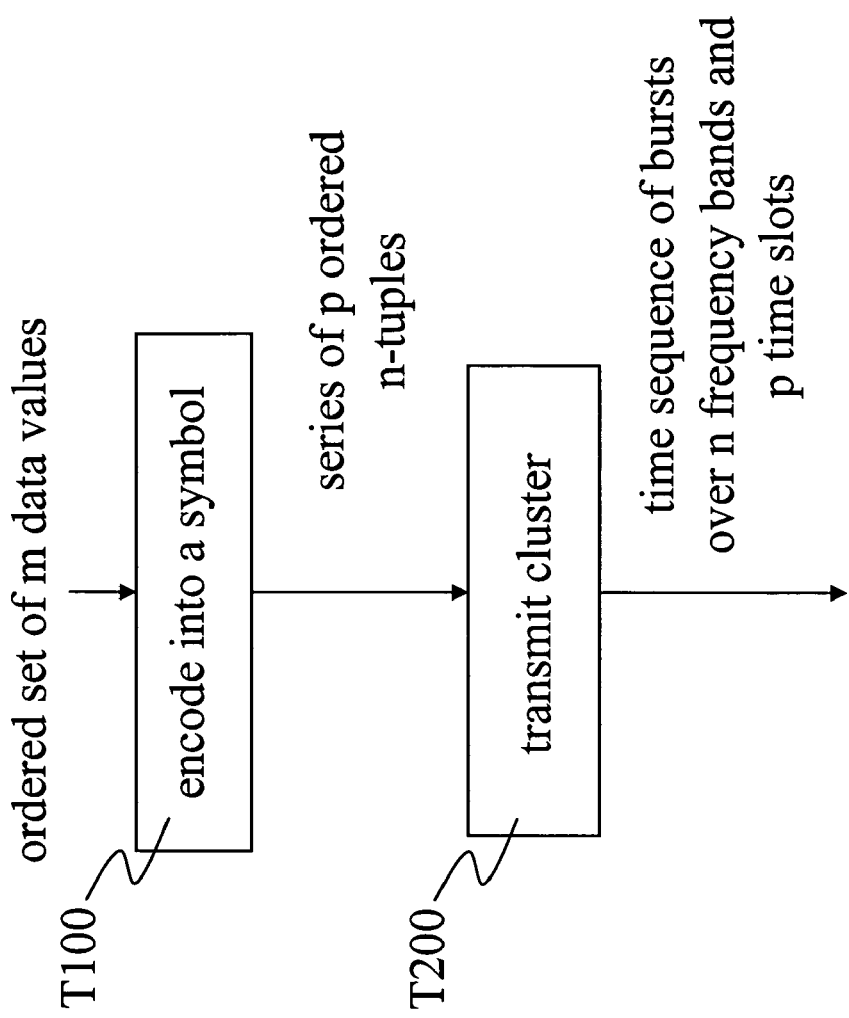
FIG. 8 shows a flowchart of a method according to an embodiment of the invention.

FIG. 8 shows a flowchart of a method according to an embodiment of the invention. Task T100 encodes an ordered set (e.g. ordered in time and/or place) of m data values (e.g. data bits) into a symbol that includes a series of p ordered n-tuples (where m and p are integers greater than zero, and n is an integer greater than one). Task T200 transmits the symbol as a cluster that includes a time sequence of bursts across n frequency bands and over p time slots. For example, task T200 may transmit the symbol such that the i-th element of each n-tuple corresponds to the i-th frequency band, and the j-th n-tuple corresponds to the j-th time slot. According to the particular application, overlap in time of bursts on different frequency bands may or may not be permitted in task T200.

In an operation of data transfer according to an implementation of this method, the (i,j)-th element of the series of n-tuples indicates activity on the i-th frequency band during the j-th time slot. In a base implementation, each element is binary-valued, such that its value indicates either a presence (e.g. '1' or 'high') or an absence (e.g. '0' or 'low') of a burst. In this base implementation, it is also assumed that a length of each burst is arbitrarily less than one time slot, that a polarity of each burst is constant or arbitrary, and that (e.g. for free space and optical applications) a polarization of the transmitted bursts is arbitrary. It is specifically contemplated that in other implementations, additional information may be supplied (e.g. encoded within the series of n-tuples, or provided in addition to such series) to indicate such qualities of a burst or cluster as amplitude, width, polarity, and/or polarization.

Figure 9:
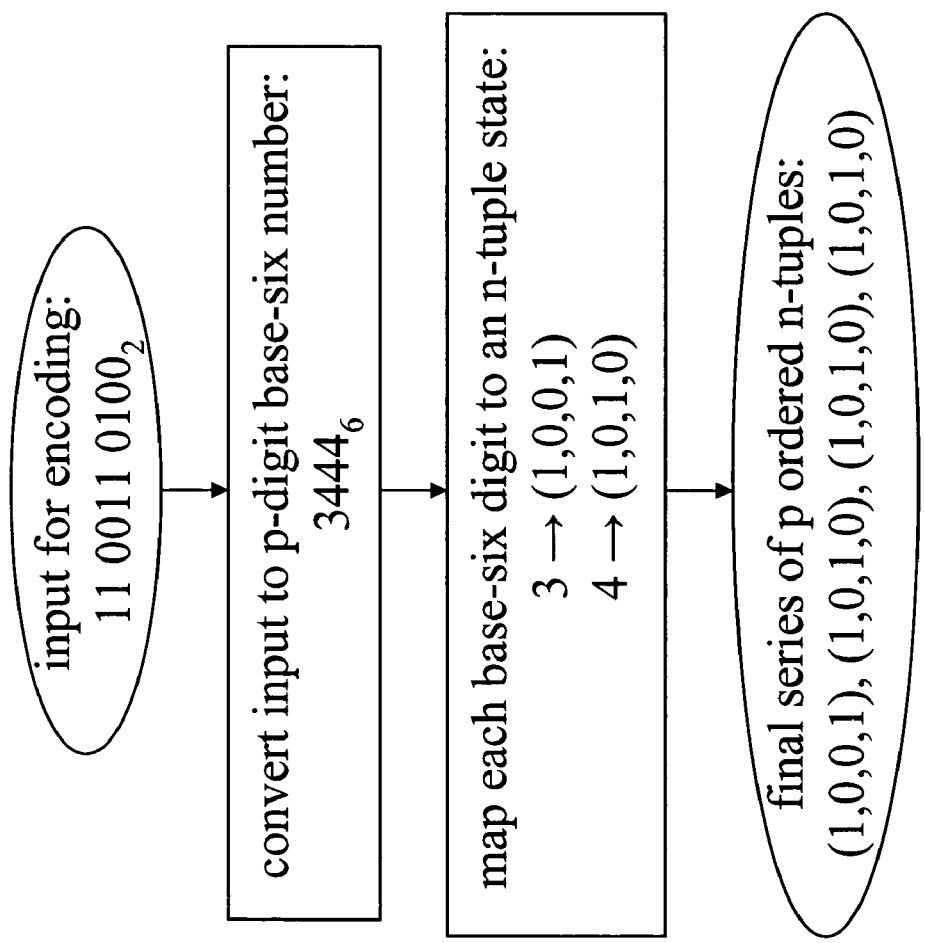
FIG. 9 shows one example of an ordered set of m data values and a corresponding series of ordered n-tuples.

Task T100 may be performed by mapping the ordered set of m data values into one of the possible symbol states for the selected encoding scheme. FIG. 9 illustrates such an encoding for one scheme in which each symbol has four n-tuples. In this particular example, the n-tuples are constrained such that two and only two elements of each n-tuple are high-valued, with the other values of the n-tuple being low-valued. Such a restriction may be observed in practice, for example, to maintain a constant or relatively constant level of energy during transmission of a stream of clusters across the transmission channel.

In such a scheme, each n-tuple has (four choose two) or six possible states, as set forth in the table in FIG. 9. The number of possible states for each symbol in this case is equal to the number of states per n-tuple, raised to the power of the number of time slots (here, $6^4$ or 1296 possible states).

FIG. 9 includes a flowchart that demonstrates an example of encoding a 10-bit binary number into a series of four ordered 4-tuples according to this scheme. By way of explanation, FIG. 9 shows this task as a two-step procedure. First, the input string is converted from a ten-digit number in base two to a four-digit number in base six. Second, each of the four digits of the base-six intermediate result is mapped to a corresponding n-tuple state as shown in the table, yielding the encoded symbol as a series of 4 ordered 4-tuples (the mapping shown in the table is only one of many possible different mappings). While in this example each n-tuple has a one-to-one correspondence with a digit of the base-six intermediate result, at least some of the elements of the n-tuples have a one-to-many correspondence with the values of the binary input string. Therefore, an n-tuple may represent information that relates to more than one of the input data values.

Note that the two-step procedure of FIG. 9 is shown by way of example only. In practice, task T100 may map the input set directly to a corresponding output series using, e.g., a lookup table or equivalent arrangement of combinatorial logic elements.

Figure 11:
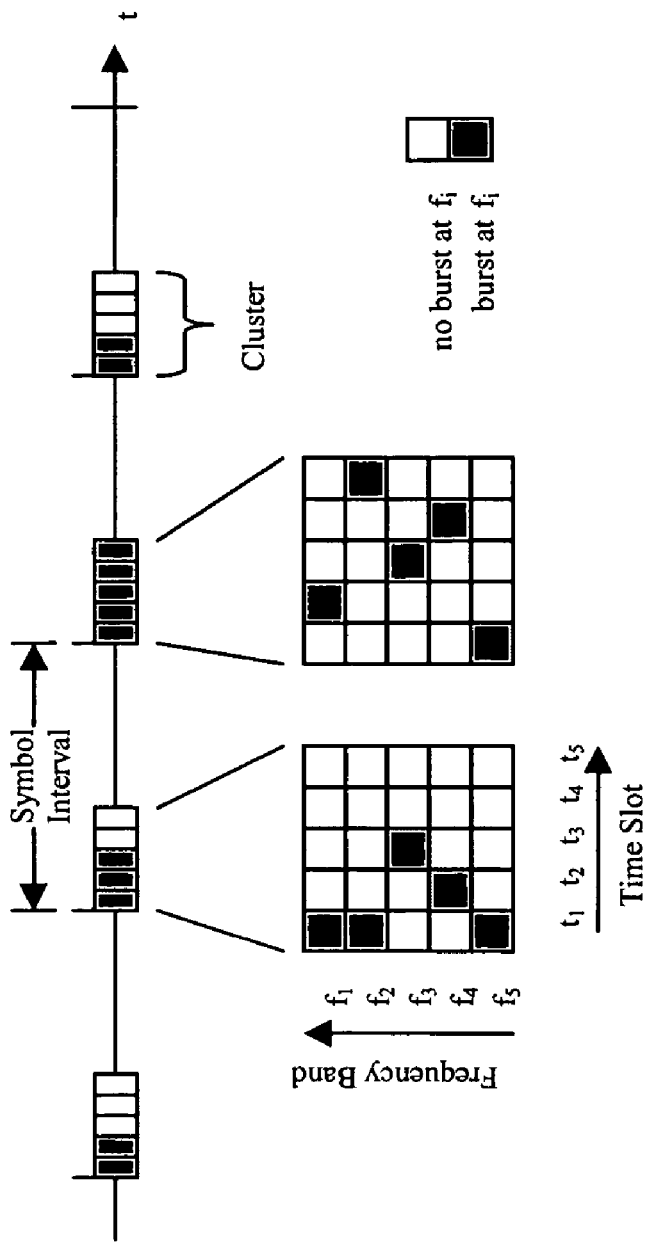
FIG. 11 shows another representation of a correspondence between encoded symbols and burst activity over time slots and across different frequency bands.

FIG. 10 shows a pictorial representation of the distribution of the symbol of FIG. 9 over corresponding frequency bands and time slots according to one possible distribution scheme. Note that this particular symbol indicates activity in frequency band one during all four time slots. Depending upon the application, this indication will correspond unambiguously to one burst that is active in four consecutive time slots, or to two bursts that are each active in two consecutive time slots (or respectively in one and three consecutive time slots), or to four bursts that are each active in one time slot. As noted above, we assume in this example that the indication corresponds to four separate bursts. FIG. 11 shows a similar representation of a sequence of clusters over time.

In some schemes, the input set may have fewer possible states than the output symbol. In the scheme illustrated in FIG. 9, for example, each input set of 10 bits may have $2^{10}$ or 1024 different states, while each corresponding output symbol may have $6^4$ or 1296 different states. While the additional output states (272 states per symbol in this case) may be ignored in some applications, in other applications they may be used to carry information. For example, these states may be used to transfer information such as one or more additional data streams, possibly at a different data transfer rate.

In one example as applied to the scheme of FIG. 9, 256 of the 272 additional states are used to carry a different input stream of 8-bit words (each word having $2^8$ or 256 possible states), while the remaining 16 additional states could even be used to carry a third input stream of 4-bit words (each word having $2^4$ or 16 possible states). Alternatively, symbols not used for data can be used to convey control information from transmitter to receiver. For example, one or more otherwise unused symbol states can be used for synchronization or other timing purposes, to control a decoder initial state, to indicate a change in modulation scheme, etc. In some cases, one or more unmapped symbol states may be used to maintain signal activity or homogeneity (i.e. for transmission during a period when no input data is available for transfer).

In some applications, symbol states that are not mapped to input sets may be used for signal source identification. For example, one or more unused symbol states may be assigned to a transmitter for use as an identifier. A signal that includes this symbol or symbols may then be distinguished from the signals of other transmitters in the vicinity (e.g. minimizing false alarms due to interference from other transmitters or emitters). Transmitter identification may be used to support networking and transmitter location and position determination applications as disclosed herein.

In other applications, a label that distinguishes one transmitter from another may itself serve as the ordered set of m data values that is encoded to produce the symbol. In one such application, a transmitter is configured to transmit (e.g. at some predetermined interval) one or more clusters corresponding to its label. The location of the transmitter is then determined by comparing the arrival times of the cluster(s) at several (preferably three or more) receivers. An example system uses one or more low-cost, low-power versions of such a transmitter as 'smart tags', e.g. for tracking the locations of boxes in a warehouse. Additional location and position determination techniques and applications are discussed below.

In a basic modulation scheme according to an embodiment of the invention, each time slot may have any number of bursts from zero to n. Therefore, each symbol may have $2^{np}$ different states. Such a scheme may be applied to synchronous or asynchronous operations, and the transmission channel may be wired, wireless, or optical (whether through free space or through fiber or another medium).

By varying such system parameters as the number of bursts permitted/required per time slot, the number of time slots per cluster, the number of frequency bands, whether the first time slot of a cluster is required to be occupied by at least one burst, and whether a cluster must include at least one burst in each frequency band, many different schemes may be designed to suit many different situations. For example, a scheme that maximizes data transfer rate may be adopted for a noise-free application, while a scheme that maximizes symbol tracking performance may be adopted for an asynchronous application, while a scheme that balances data transfer rate and error detection capability may be adopted for another application. Various example schemes as applied to the base implementation are described below.

In one such scheme, at least one burst occurs during each time slot, such that no time slot within a symbol is empty. Such a scheme may provide a benefit in asynchronous operations (e.g. easier tracking). In this example, each symbol may have $(2^n-1)^p$ different states.

In another scheme, one and only one burst occurs during each time slot. Such a scheme may support asynchronous operations and/or offer reduced power output, for example, at the cost of reduced rate of data transfer. Each symbol according to this example may have $n^p$ different states.

In another scheme, up to n bursts occur during each time slot, and exactly one burst occurs per frequency band per cluster (in this scheme, the number of time slots p is not less than the number of frequency bands n). The constraint of one burst per frequency band per cluster may provide better performance in environments prone to reflection or multipath interference. Such a scheme may also be expected to provide better error detection capability at the expense of a reduced data transfer rate. Each symbol according to this example may have $p^n$ different states (e.g. 100,000 different states for n=5 and p=10, or 3125 different states for n=p=5).

In another scheme, one and only one burst occurs during each time slot, and no more than one burst occurs per frequency band per cluster (in this scheme, the number of time slots p is not less than the number of frequency bands n). Each symbol in this example may have $n!/(n-p)!$ different states.

In one variation of the scheme above (one and only one burst per time slot, and no more than one burst per frequency band per symbol), the first time slot of a cluster is unavailable for data transfer. For example, such a variation may be used to implement a logical channelization scheme in which the active frequency in the first time slot identifies the particular logical channel over which the cluster is being transmitted. (Division of a physical channel into more than one logical channel, and other techniques for such division, are discussed in more detail below.) Each symbol in this example may have up to $(n-1)!/(n-p)!$ different data states.

In another scheme, no more than one burst occurs during each time slot, and exactly one burst occurs per frequency band per cluster (in this scheme, the number of time slots p is not less than the number of frequency bands n). This example scheme also includes the feature that the first time slot of each cluster is not empty; this feature (which may be especially useful in asynchronous applications) could be applied to provide a relative time reference at the receiver. In this case, each symbol may have up to n(p−1)!/(p−n)! different states (e.g. 15,120 different states for n=5 and p=10, or 120 different states for n=p=5).

In another scheme, no more than one burst occurs during each time slot, no more than one burst occurs per frequency band per cluster, and the first time slot of each cluster is not empty (in this scheme, the number of time slots p is not less than the number of frequency bands n). In this case, the number of different states available for each symbol may be expressed as the sum over k ($1 \leq k \leq n$) of the number of clusters having bursts on exactly k frequency bands, or $$\sum_{k=1}^{n} \binom{n}{k} k \frac{(p-1)!}{(p-k)!}$$

(e.g. 27,545 different states for n=5 and p=10, or 1045 different states for n=p=5).

In another scheme, up to n bursts may occur during each time slot, exactly one burst occurs per frequency band per cluster, and the first time slot of each cluster is not empty (in this scheme, the number of time slots p is not less than the number of frequency bands n). In this case, the number of different states available for each symbol may be expressed as $$\sum_{k=1}^{n} \binom{n}{k}(p-1)^{n-k}$$

(e.g. 40,951 different states for n=5 and p=10, or 2101 different states for n=p=5).

In another scheme, up to n bursts may occur during each time slot, no more than one burst occurs per frequency band per cluster, and the first time slot of each cluster is not empty (in this scheme, the number of time slots p is not less than the number of frequency bands n). In this case, the number of different states available for each symbol may be expressed as $$\sum_{k=1}^{n} \binom{n}{k} \sum_{m=1}^{k} \binom{k}{m}(p-1)^{k-m}$$

(e.g. 61,051 different states for n=5 and p=10, or 4651 different states for n=p=5).

In another scheme, up to n bursts may occur during each time slot, no more than one burst occurs per frequency band per cluster, and each cluster includes at least one burst (i.e. no cluster is empty) (in this scheme, the number of time slots p is not less than the number of frequency bands n). In this case, the number of different states available for each symbol may be expressed as $$\sum_{k=1}^{n} \binom{n}{k} p^k$$

(e.g. 161,050 different states for n=5 and p=10, or 7775 different states for n=p=5).

In another scheme, up to r ($r \leq n$) bursts occur during each time slot, exactly one burst occurs per frequency band per cluster, and the first time slot of each cluster is not empty (in this scheme, the number of time slots p is not less than the number of frequency bands n). In this case, the number of different states available for each symbol may be expressed as nc(r,n,p) using the following recursive formula:

$$nc(r, nf, 1) = 1$$

$$nc(r, nf, ns) = \sum_{\substack{s=s1 \\ M(ns-1) \geq nf-s}}^{\min(r,nf)} \binom{nf}{s} nc(M, nf-s, ns-1),$$

where the parameter nf denotes the number of frequency bands still unassigned in the cluster; the parameter ns denotes the number of time slots remaining in the cluster; the constraint $M(ns-1) \geq (nf-s)$ requires that the product of the number of time slots that will remain and the maximum number of bursts per time slot is sufficiently large to permit assignment of the frequency bands that will remain; nc(A,B,C) denotes the number of combinations for up to A bursts per time slot, B frequency bands still unassigned in the cluster, and C time slots remaining in the cluster; and the parameter s1 has the value $$s1 = \begin{cases} 0, & ns < p \\ 1, & ns = p \end{cases}.$$

For such a scheme in which each symbol has five n-tuples, the number of different states available for each symbol is indicated in the following table as a function of n and r:

|       | r = 1 | r = 2 | r = 3 | r = 4 | r = 5 |
|-------|-------|-------|-------|-------|-------|
| n = 1 | 1     | —     | —     | —     | —     |
| n = 2 | 8     | 9     | —     | —     | —     |
| n = 3 | 36    | 60    | 61    | —     | —     |
| n = 4 | 96    | 336   | 368   | 369   | —     |
| n = 5 | 120   | 1620  | 2060  | 2100  | 2101  |

In another scheme, exactly one burst occurs per frequency band per cluster, the first time slot of each cluster is not empty, and from one to r bursts occur during each time slot until no unassigned frequency bands remain (in this scheme, the number of time slots p is not less than the number of frequency bands n). In this case, the number of different states available for each symbol may be expressed as nc(r,n,p) using the recursive formula above, except that s1=1 for any value of ns.

Again, it is noted that the number of states per symbol indicated for the above examples assumes without limitation that each element of each n-tuple is binary-valued. Variations of such schemes in which one or more elements of an n-tuple may have additional values are specifically contemplated and enabled herein.

Many other schemes may be implemented according to such principles. For example, in addition to variations to the base implementation as mentioned above, characteristics of such schemes may include a minimum number of time slots between bursts on the same frequency band (which minimum number may be different for different frequency bands), a maximum and/or minimum number of bursts during one time slot, a minimum number of time slots per burst, a maximum and/or minimum number of consecutive empty time slots, etc. Depending on its nature, a particular variation or characteristic may be applied during encoding of the data set and/or during transmission of the symbol.

As noted above, the duration of an individual burst may be longer or shorter than the corresponding time slot. For timing purposes, it may be desirable to synchronize the start of a burst with the start of the corresponding time slot. However, other timing schemes are possible.

Figure 12:
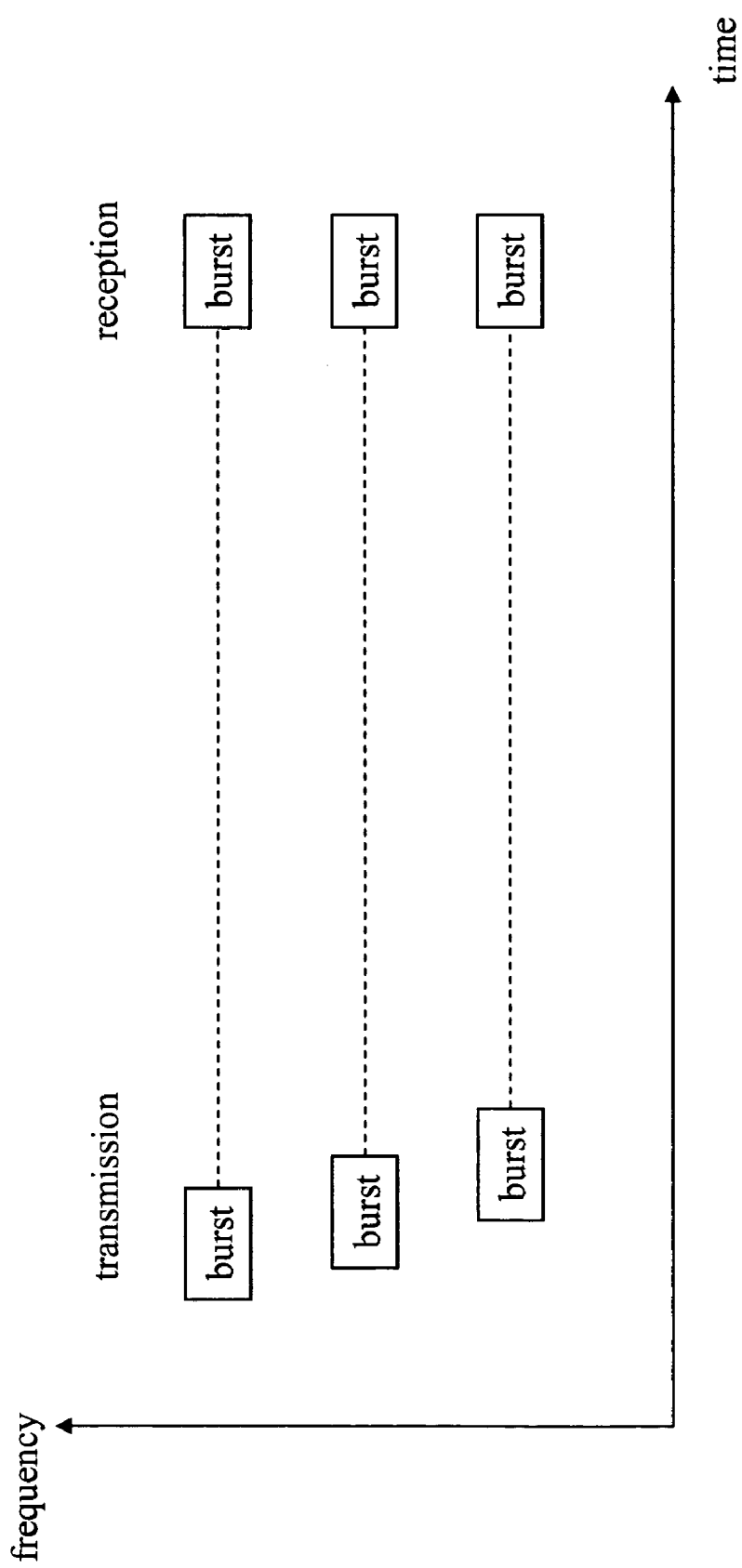
FIG. 12 shows a diagram of an application in which bursts in different frequency bands are transmitted at different times.

Bursts having one time relation that are transmitted over different frequency bands may propagate through a dispersive communications channel such that the bursts have a different time relation upon reception. For example, bursts at different frequency bands may be reflected differently in the environment, within the transmitter, within the receiver, etc. In some applications, the timing of burst transmissions among the various n frequency bands may be modified to adjust for expected propagation delays. For example, burst transmissions may be timed such that bursts within the same time slot may be expected to arrive at the receiver at substantially the same time. Such modification may be based on a prior determination (e.g. calculation and/or measurement) and/or may be performed adaptively during operation through a mechanism such as dynamic calibration. FIG. 12 shows a diagram of one such application in which bursts in higher frequency bands are transmitted earlier than bursts in lower frequency bands, according to an expected (e.g. calculated, calibrated, and/or observed) difference in propagation delay.

Figure 13:
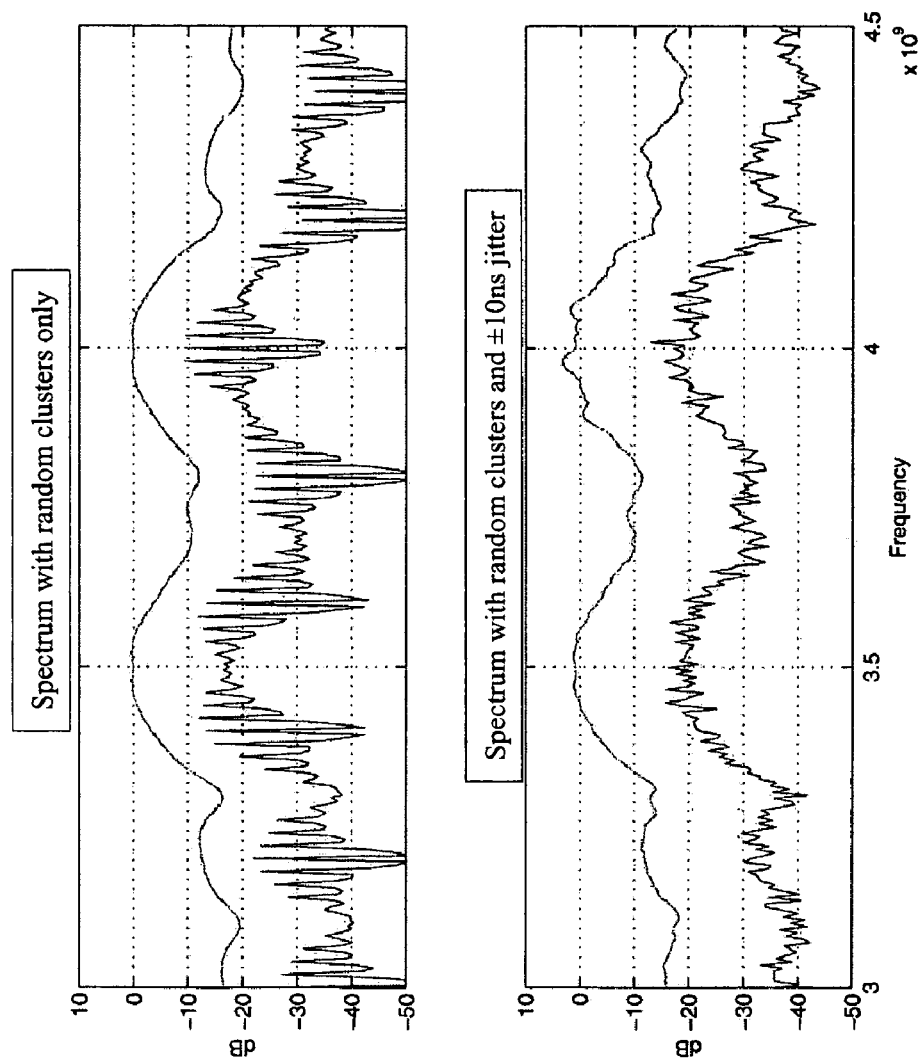
FIG. 13 shows an effect of random time perturbation in cluster transmission start time.

In another example, the addition of a random (or pseudo-random) time perturbation may reduce peak power levels on a nominally periodic train of symbols. FIG. 13 shows an effect of application of random delay perturbations (or 'jitter') to a simulated transmission of 100 clusters using frequency bands centered at 3.5 and 4 GHz, repeated 20 times, with two bursts per cluster, burst duration 5 ns, quiet time period 40 ns, and symbol interval 50 ns. The bottom plot shows the spectrum that occurs when the same train of clusters is sent using a random delay of±10 ns.

In other implementations of a method according to an embodiment of the invention, each element of the series of n-tuples has one of q distinct values, such that its value indicates an amplitude of the corresponding burst. Such amplitude modulation may be added to a scheme as described or suggested above to increase the number of data values that may be transferred during a designated time period. Adding amplitude modulation to the basic scheme in which each time slot may have any number of bursts from zero to n, for example, may result in a system in which each symbol has $q^{np}$ different possible states.

Figure 14:
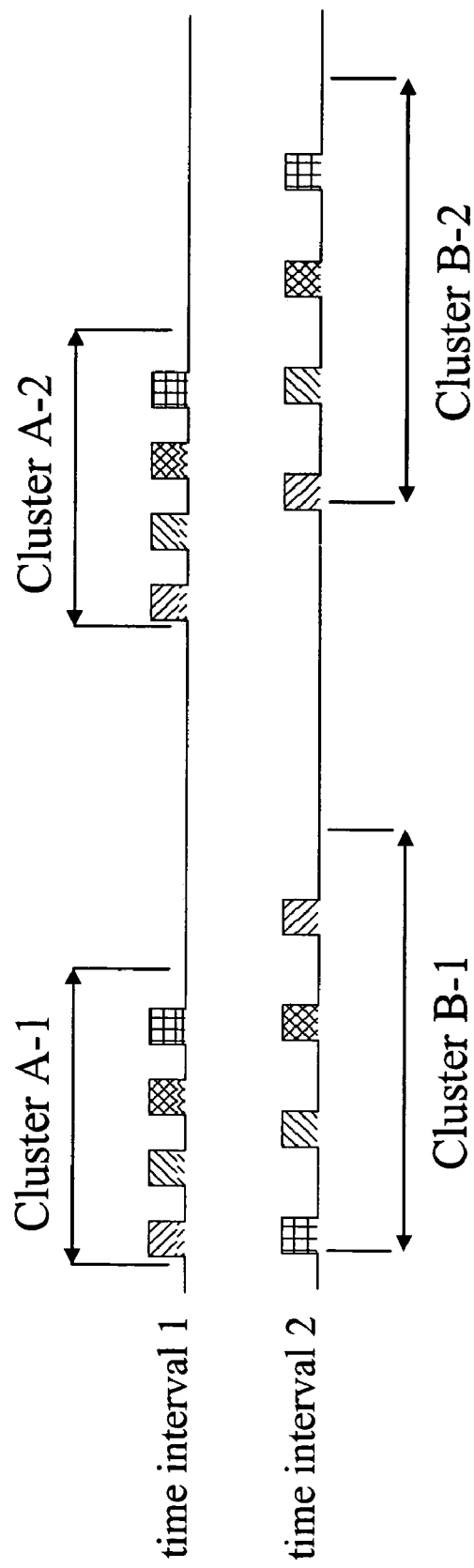
FIG. 14 shows an example of a scheme in which symbols for two different logical channels are transmitted over the same physical channel at different times.

In further implementations of a method according to an embodiment of the invention, channel information may be encoded into intervals between bursts and/or between clusters of bursts. FIG. 14 shows one example of such a scheme in which symbols for two different logical channels are transferred over the same physical channel at different times. The upper diagram illustrates a sequence of clusters [A-1 and A-2] transmitted over a first time interval on the first logical channel, which is characterized by an interval of one time slot between consecutive bursts. The lower diagram illustrates a sequence of clusters [B-1 and B-2] transmitted over a second time interval on the second logical channel, which is characterized by an interval of two time slots between consecutive bursts. A receiver may be configured to identify the particular logical channel associated with a received sequence of clusters. Alternatively, a receiver may be configured to ignore all but a limited set (e.g. of one or more) of logical channels.

Figure 15:
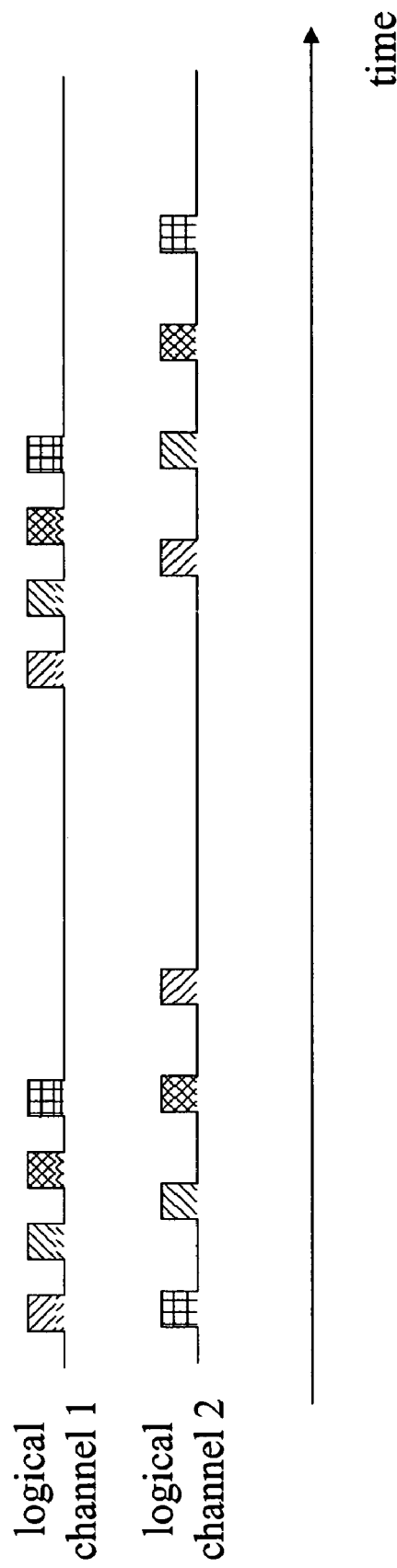
FIG. 15 shows an example of a scheme in which symbols for two different logical channels are transmitted over the same physical channel at the same time.

In some systems, the same physical channel may carry more than one logical channel at the same time. For example, different logical channels that carry bursts during the same time interval may be distinguished by the use of different frequencies and/or different combinations of frequencies. In a system in which transmission of bursts over different logical channels may be synchronized, each logical channel may also be distinguished by the number of time slots between consecutive bursts of a cluster. FIG. 15 shows one such example in which two logical channels are configured differently in terms of frequency and timing. In another scheme, the number of time slots between consecutive bursts of a cluster is a different prime number for each logical channel.

In the particular examples of FIGS. 14 and 15, the quiet time between clusters is the same on each logical channel, although in other schemes this period may vary from one logical channel to another. In a further example of a scheme including channelization, fewer than all of the pairs of consecutive bursts of a cluster (e.g. only the first and second bursts) are separated in time. In a yet further example of such a scheme, a width of one or more of the bursts of a cluster may identify the corresponding logical channel.

Figure 16:
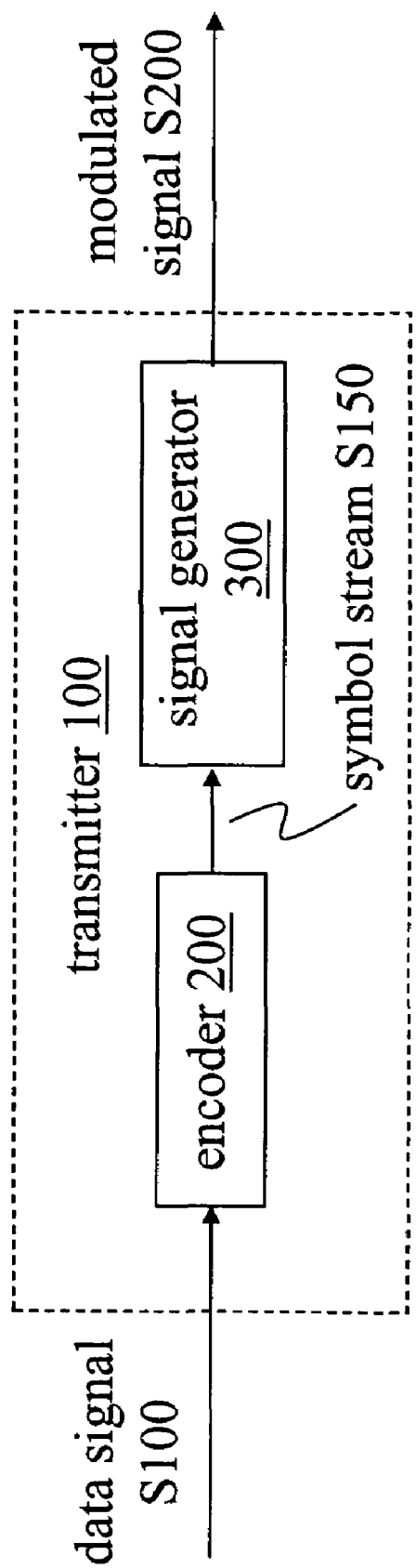
FIG. 16 shows a block diagram of a transmitter 100 according to an embodiment of the invention.

FIG. 16 shows a block diagram of a transmitter 100 according to an embodiment of the invention. Encoder 200 receives a data signal S100 that includes ordered data values (i.e. ordered in time and/or space) and outputs a symbol stream S150 based on signal S100 to signal generator 300. Specifically, encoder 200 maps ordered sets of m data values to corresponding symbols, each symbol including a series of p ordered n-tuples. Based on symbol stream S150, signal generator 300 outputs a modulated signal S200 that includes clusters of bursts (e.g. ultra-wideband bursts).

Figure 17:
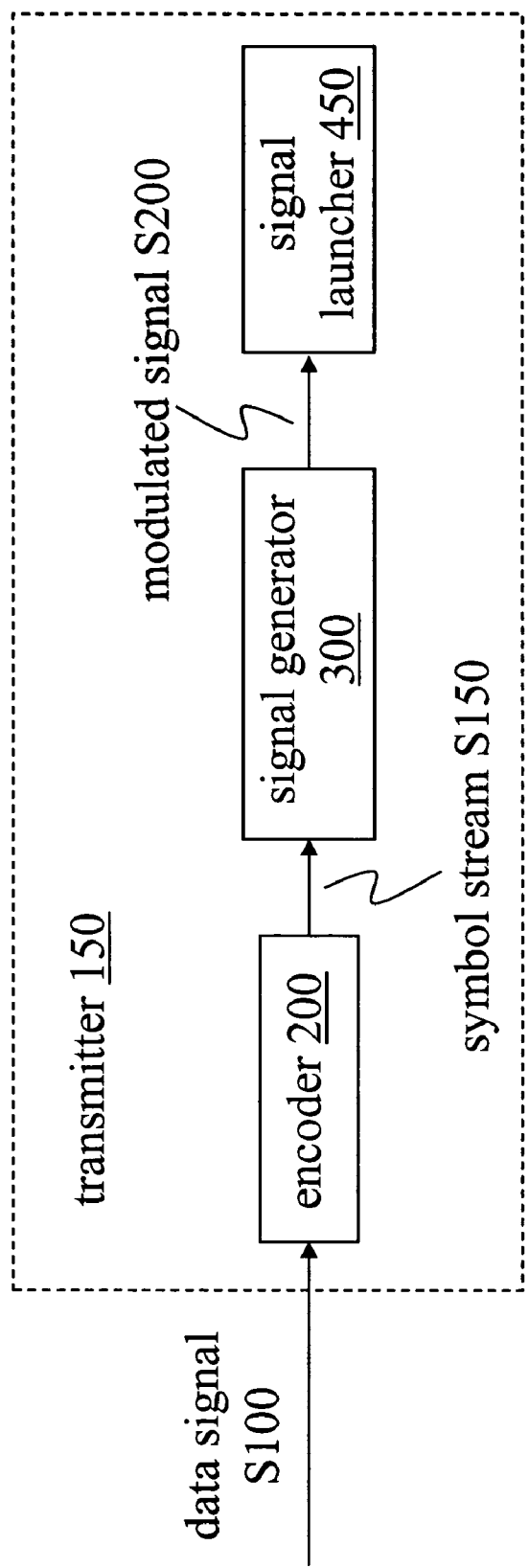
FIG. 17 shows a block diagram of an implementation 150 of transmitter 100.

FIG. 17 shows a block diagram of an implementation 150 of transmitter 100 that includes a signal launcher 450. Signal launcher 450, which transfers modulated signal S200 to the transmission medium, may include one or more elements such as filters, power amplifiers, and impedance-matching components (e.g. coils or transformers) or structures.

For wireless transmission of clusters, signal launcher 450 may also include an antenna. In certain cases, the antenna may be embedded into a device that includes transmitter 100 or even integrated into a package (e.g. a low-temperature co-fired ceramic package) that includes components of transmitter 100 and/or signal launcher 450.

For transmission of clusters through a conductive medium (e.g. a wire, cable, or bus having one or more conductors, a conductive structure, another conductive medium such as sea or ground water, or a series of such conductors), signal launcher 450 may include one or more elements such as components for electrostatic protection (e.g. diodes), current limiting (e.g. resistors), and/or direct-current blocking (e.g. capacitors).

For transmission of clusters through an optical medium (e.g. one or more optical fibers or other transmissive structures, an atmosphere, a vacuum, or a series of such media), signal launcher 450 may include one or more radiation sources controllable in accordance with the clusters to be transmitted such as a laser or laser diode or other light-emitting diode or semiconductor device.

Figure 18:
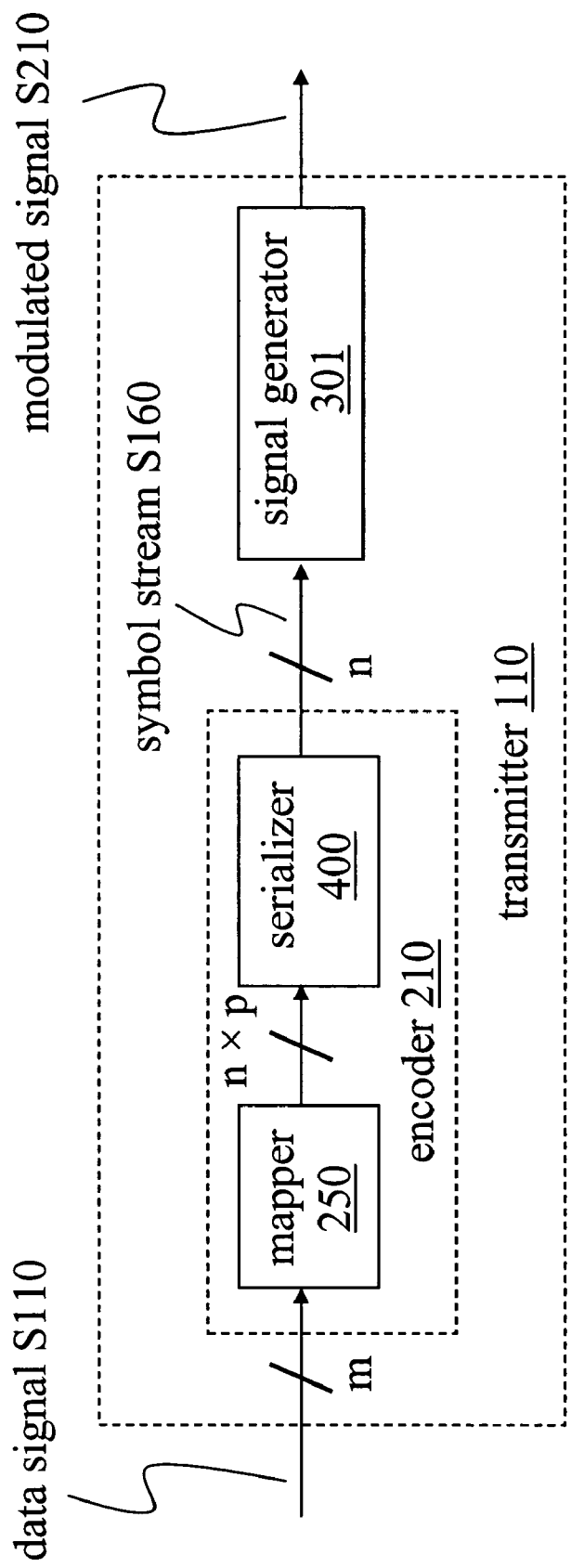
FIG. 18 shows a block diagram of an implementation 110 of transmitter 100.

FIG. 18 shows a block diagram of an implementation 110 of transmitter 100 that includes an implementation 210 of encoder 200 (having a mapper 250 and a serializer 400) and an implementation 301 of signal generator 300. Mapper 250 receives an m-unit parallel data signal S110 and produces a corresponding (n×p)-unit parallel encoded signal according to a predetermined mapping. For example, mapper 250 may be constructed to receive an m-bit parallel data signal and produce a corresponding (n×p)-bit parallel encoded signal.

In one implementation, mapper 250 may include a lookup table that maps an m-unit input value to an n×p-unit output value. Alternatively, mapper 250 may include an array of combinational logic that executes a similar predetermined mapping function. In another application, the predetermined mapping function applied by mapper 250 may be changed from time to time (e.g. by downloading a new table or selecting between more than one stored tables or arrays). For example, different channel configurations (e.g. different sets of frequency bands) may be allocated in a dynamic fashion among implementations of transmitter 100 that share the same transmission medium.

Serializer 400 receives the (n×p)-unit parallel encoded signal and serializes the signal to output a corresponding n-unit (e.g. n-bit) implementation S160 of symbol stream S150 to signal generator 301 (e.g. at a data rate that is p or more times higher than the data rate of the parallel encoded signal). Signal generator 300 outputs a modulated signal S210 based on symbol stream S160.

Figure 19:
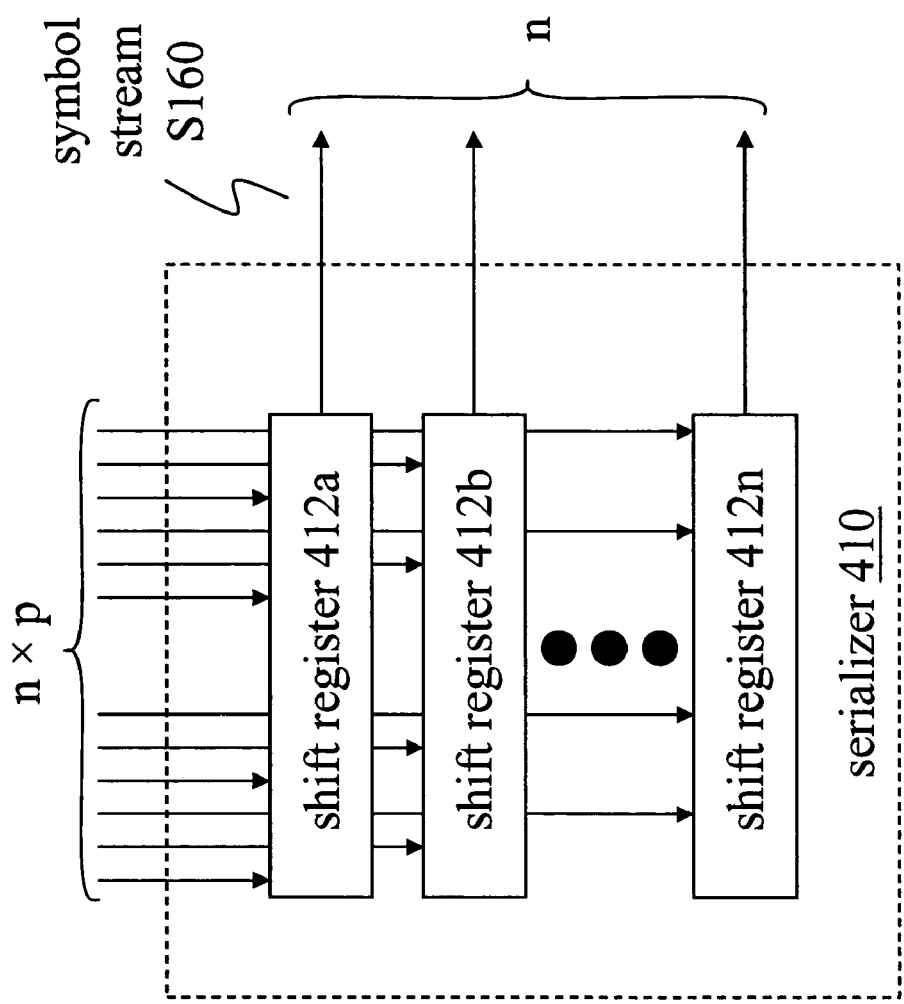
FIG. 19 shows a block diagram of an implementation 410 of serializer 400.

FIG. 19 shows an implementation 410 of serializer 400 that includes n shift registers 412. Upon assertion of a common load signal (not shown), each shift register 412 stores a different p-unit coset of the n×p-unit encoded signal. In one example, the p units stored in each shift register 412 are then shifted out (e.g. according to a common clock signal) as a series of p n-tuples to signal generator 301.

Figure 20:
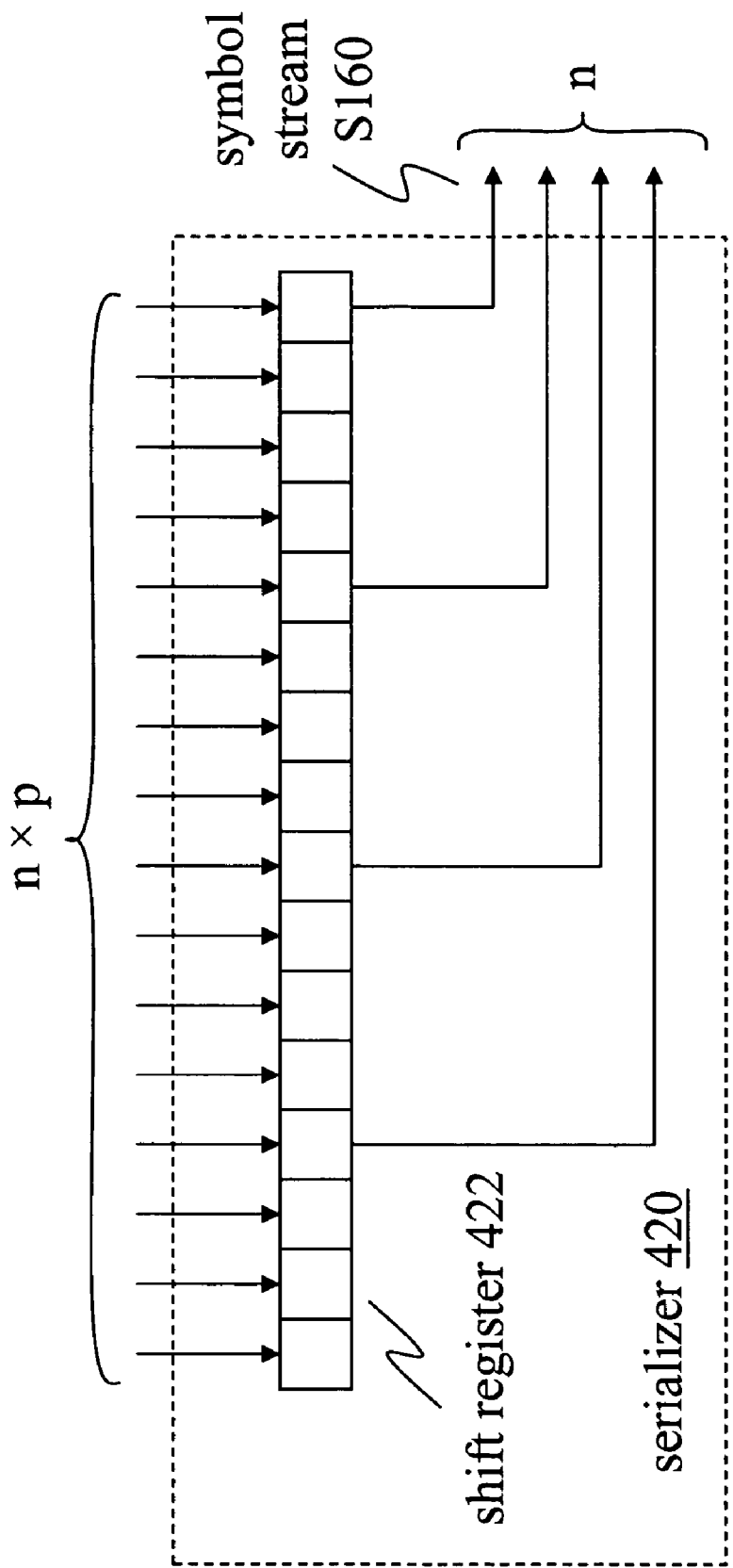
FIG. 20 shows a block diagram of an implementation 420 of serializer 400.

FIG. 20 shows another implementation 420 of serializer 400 that includes an n×p-unit shift register 422. Upon assertion of a load signal (not shown), shift register 422 stores an n×p-unit string of values (e.g. as outputted by encoder 210). Each of the n-unit cosets of this string is then outputted as an n-unit value to signal generator 301 according to a clock signal (not shown).

Figure 21:
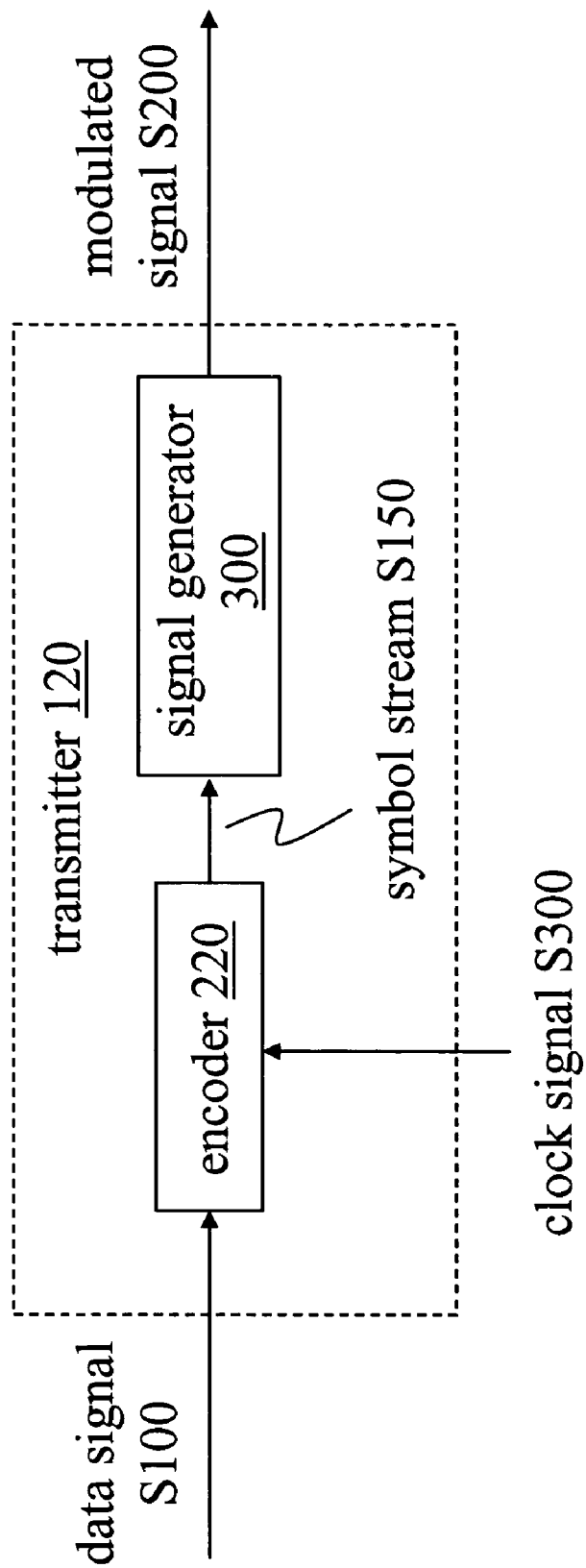
FIG. 21 shows a block diagram of an implementation 120 of transmitter 100.

FIG. 21 shows a block diagram of an alternative implementation 120 of transmitter 100. Encoder 220 outputs symbol stream S150 according to data signal S100 and a clock signal S300. Signal generator 300 receives symbol stream S150 and outputs a corresponding modulated signal S200 (e.g. as a series of clusters of ultra-wideband bursts).

Figure 22:
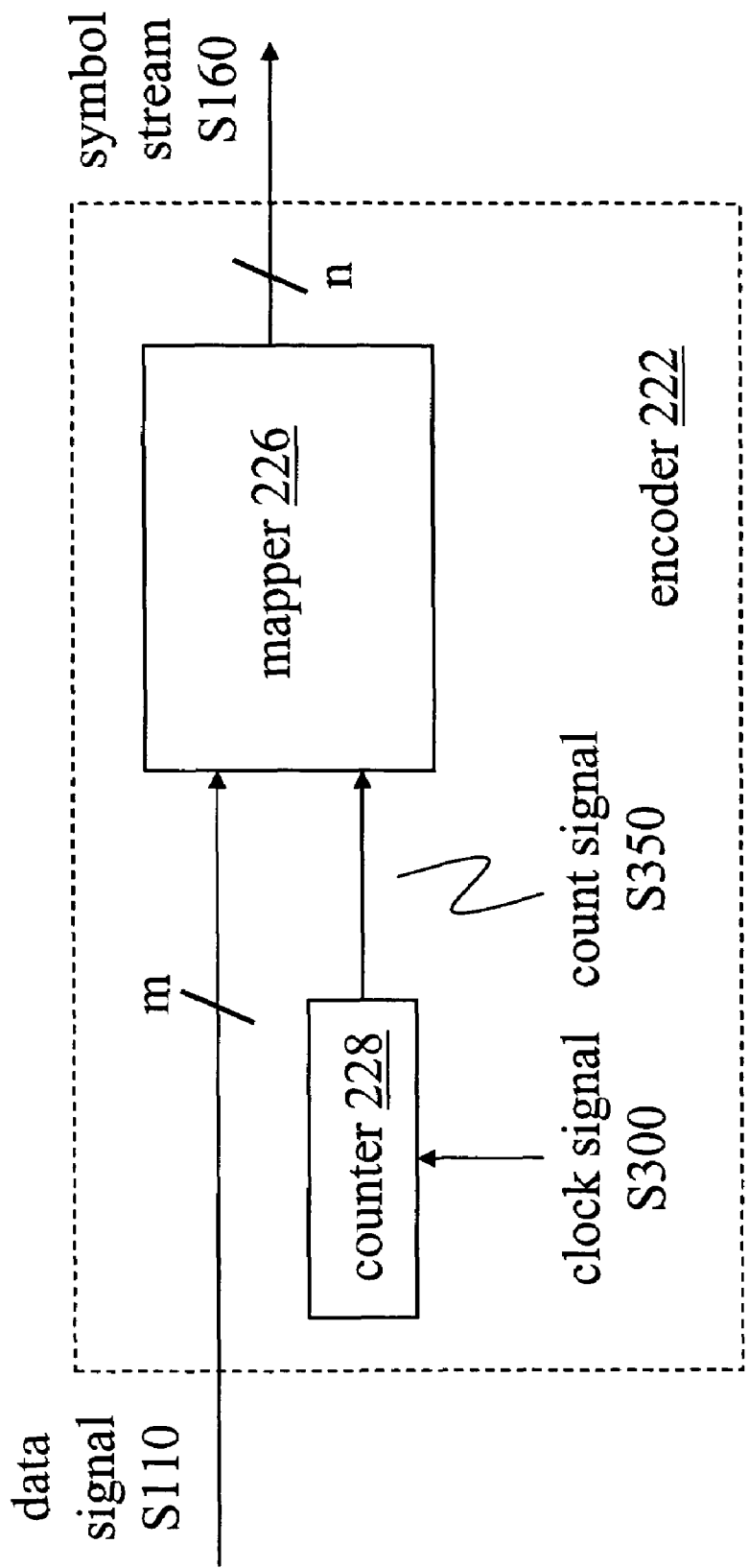
FIG. 22 shows a block diagram of an implementation 222 of encoder 220.

FIG. 22 shows one implementation 222 of encoder 220. A counter 228 receives clock signal S300 and outputs a count signal S350 having one of p values. For example, count signal S350 may count up from 0 to (p−1), or down from (p−1) to 0, or may pass through p different states in some other fashion. Mapper 226 (e.g. a lookup table or combinatorial logic array) receives m-unit data signal S110 and count signal S350 and outputs a corresponding n-unit symbol stream S160 (e.g. to signal generator 301).

Signal generator 301 receives n-unit (e.g. n-bit) symbol stream S160 and outputs a series of clusters of bursts (e.g. ultra-wideband bursts) over n corresponding frequency bands. Each of the n frequency bands has a different center frequency. In one application, the n frequency bands are separated from each other (e.g. by guard bands), although in other applications two or more of the bands may overlap each other.

In one implementation, each unit of symbol stream S160 is a bit that indicates whether or not a burst should be emitted (e.g. at a predetermined amplitude) over a corresponding frequency band during a corresponding time slot. In another implementation, a unit may have more than two values, indicating one among a range of amplitudes at which the corresponding burst should be emitted.

Signal generator 300 includes one or more burst generators, each configured to generate a burst that may vary in duration from a portion (e.g. ½) of a cycle to several cycles. The time-domain profile of each cycle of the burst may be a sine wave or some other waveform. In one example, a burst generator generates a burst as an impulse that is filtered and/or amplified. Alternatively, a burst may be generated by gating a continuous-wave signal. For example, a burst generator may include a broadband oscillator with controllable bandwidth. Signal generator 300 may include burst generators of the same configuration or burst generators according to two or more different configurations. Example configurations for a burst generator include the following:

1) A circuit or device that produces a fast edge or pulse and is followed by a bandpass filter. The circuit or device that produces the fast edge or pulse generates a waveform with broadband spectral content, and the filter selects the frequency band over which transmission of the burst is desired. Examples of circuits or devices that produce a fast edge or pulse include high-speed logic gates such as ECL (emitter-coupled logic) and PECL (positive ECL). One suitable configuration may include a ring oscillator (e.g. as a free-running oscillator with a gate on its output). Such circuits or devices may also include avalanche transistors, avalanche diodes, and/or step recovery diodes. Examples of suitable filters may include cavity filters, surface acoustic wave (SAW) filters, discrete filters, transmission line filters, and/or any other RF filter technique. In this case, the filter controls the relationship between energy and frequency within the band, and also establishes the roll-off profile of energy outside the band.

2) A tunable oscillator followed by a switching device. The tunable oscillator establishes the center frequency of the burst. The tunable oscillator can be any tunable source of continuous-wave RF energy, such as a voltage-controlled oscillator, a YIG (yttrium-indium garnet)-tuned oscillator, a dielectric resonator oscillator, a backward wave oscillator, and/or a oscillator circuit including a reflex klystron, magnetron, or Carcinotron. The switching device sets the width of the burst, which defines the bandwidth of the spectral content. Suitable switching devices may include mixers, solid-state RF switches, laser-controlled RF switches, plasma-based RF switches, and/or switches that utilize an electron beam.

3) A semiconductor solid-state oscillator that produces a frequency burst in response to a pulsed control voltage. The pulsed control voltage may be provided by any circuit or device capable of delivering a pulse with the desired burst width and amplitude. In order to provide a faster on/off transition, the control voltage may be biased with a DC level that is under the oscillation threshold, such that application of the pulse raises the voltage over the oscillation threshold and causes the device to oscillate for the duration of the applied pulse. Examples of suitable solid-state oscillators may include Gunn devices, IMPATT (impact ionization avalanche transit time) diodes, TRAPATT (trapped plasma avalanche-triggered transit) diodes, and/or BARITT (barrier injection transit-time) diodes.

4) A thermionic oscillator that produces a frequency burst in response to a pulsed control voltage. The pulsed control voltage may be provided by any circuit or device capable of delivering a pulse with the desired burst width and amplitude. Examples of control voltages include a grid voltage, a body voltage, or a reflector voltage. In order to provide a faster on/off transition, the control voltage may be biased with a DC level that is under the oscillation threshold, such that application of the pulse raises the voltage over the oscillation threshold and causes the device to oscillate for the duration of the applied pulse. Examples of suitable thermionic oscillators may include backward wave oscillators, Carcinotrons, magnetrons, and/or reflex klystrons.

Figure 23:
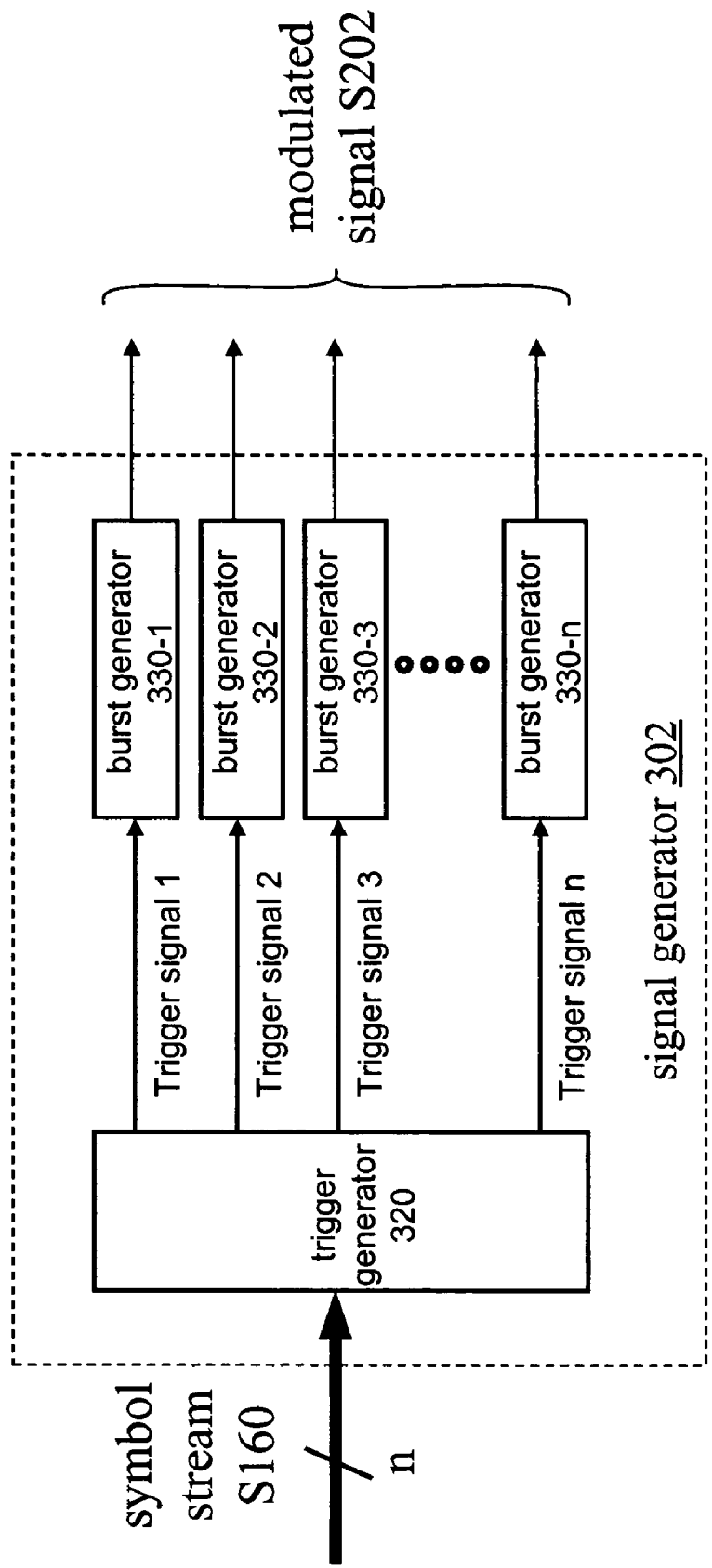
FIG. 23 shows an implementation 302 of signal generator 300.
Figure 24:
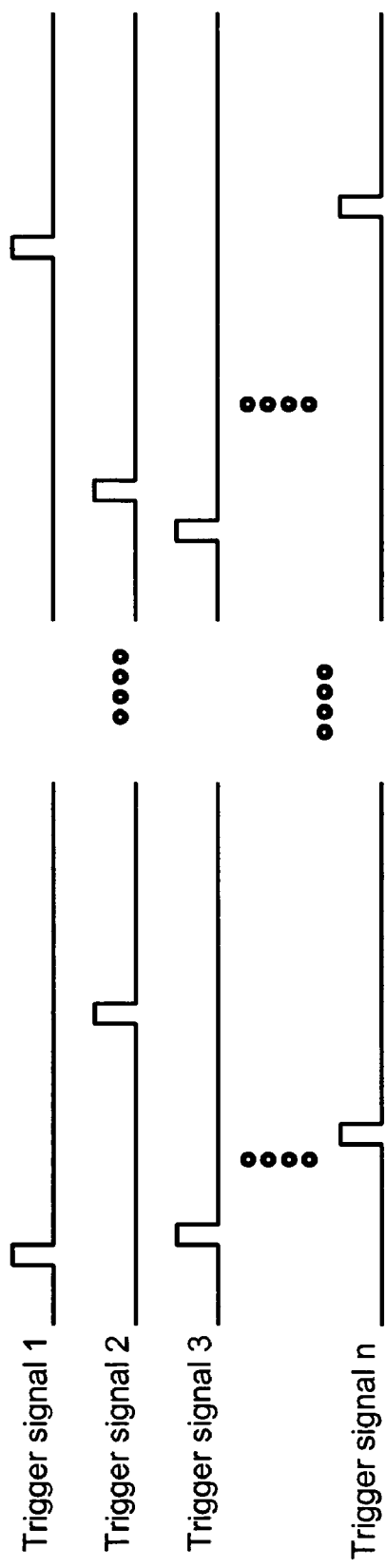
FIG. 24 shows trigger pulses on N independent trigger signals as generated by trigger generator 320.

FIG. 23 shows an implementation 302 of signal generator 301 that includes a trigger generator 320 and a set of n burst generators 330. As shown in FIG. 24, trigger generator 320 generates trigger pulses on n independent trigger signals according to the elements of the n-tuples of the symbol to be transmitted. In this example, each of the n burst generators 330 is configured to emit a burst upon receiving a trigger pulse. In other implementations, a burst generator may be configured to emit a burst upon receiving a rising edge or a falling edge or upon some other event (which trigger pulse, edge, or other event may be electrical and/or optical). Also in this particular example, each burst generator 330 is configured to emit bursts that occupy a different frequency band than bursts emitted by other burst generators 330. Each burst generator 330 may be configured to emit bursts of constant time duration, or one or more of generators 330 may be configured to emit bursts of varying time durations.

Figure 25:
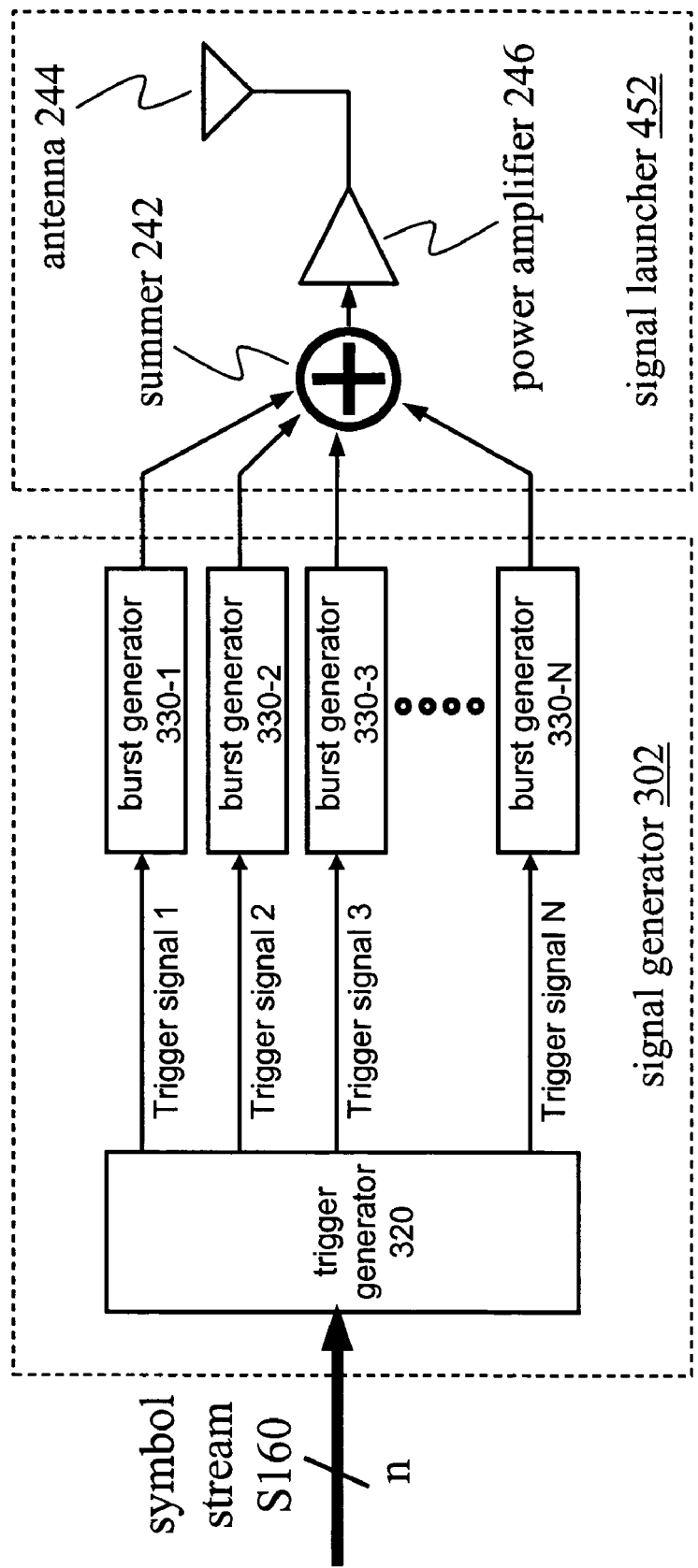
FIG. 25 shows a block diagram of signal generator 302 and an implementation 452 of signal launcher 450.
Figure 26:
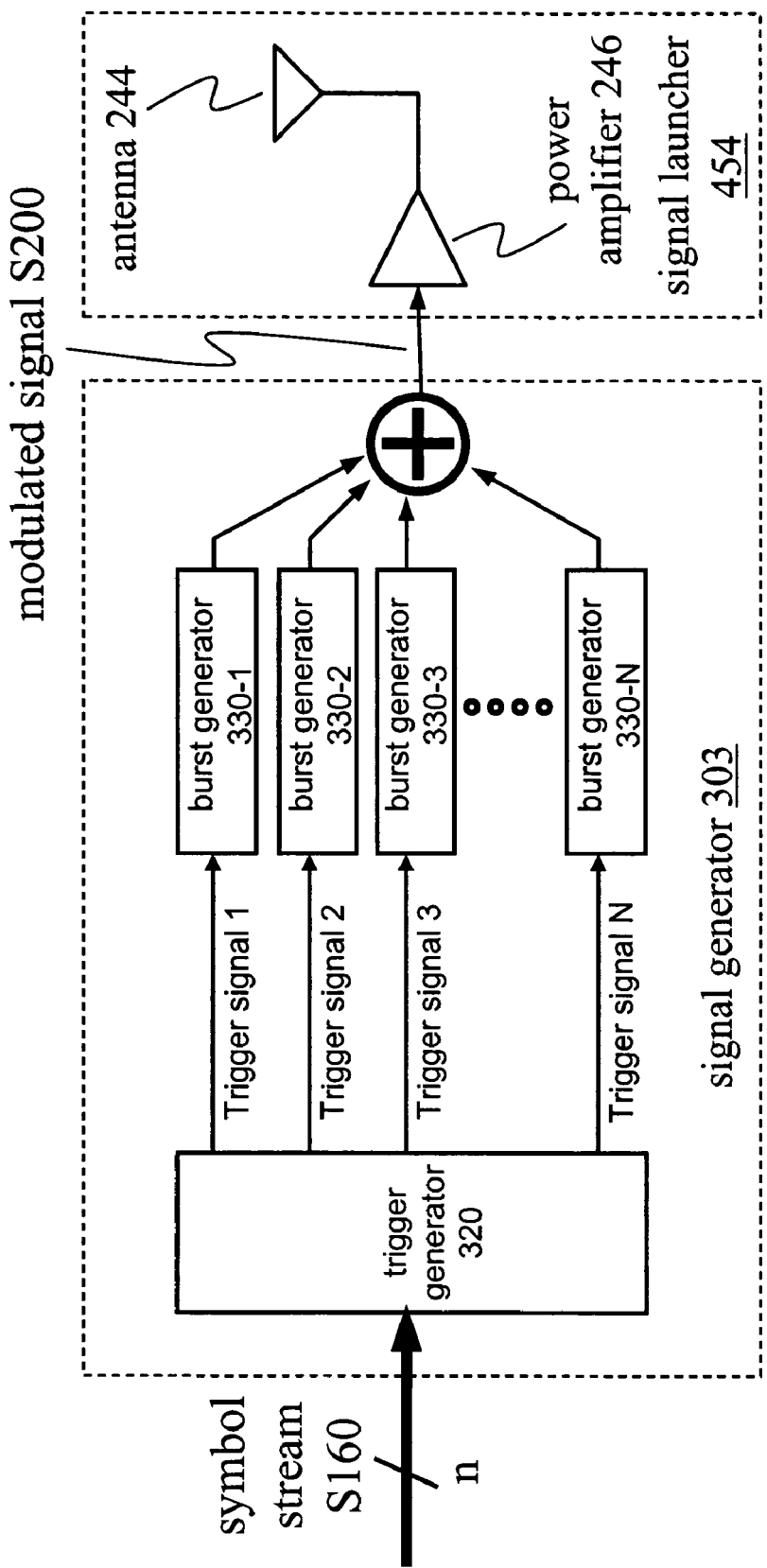
FIG. 26 shows a block diagram of an implementation 303 of signal generator 302.

FIG. 25 illustrates that the outputs of burst generators 330 may be summed (e.g. by summer 242 of implementation 452 of signal launcher 450) before radiation (e.g. by an antenna) and may also be amplified if desired. As shown in FIG. 26, in another implementation 303 of signal generator 302, the outputs of burst generators 330 are summed (e.g. by a summer) within the signal generator. Also in another implementation, the outputs of burst generators 330 are at baseband and may be upconverted (e.g. using a mixer and local oscillator) individually and/or collectively (e.g. after summing).

Figure 27:
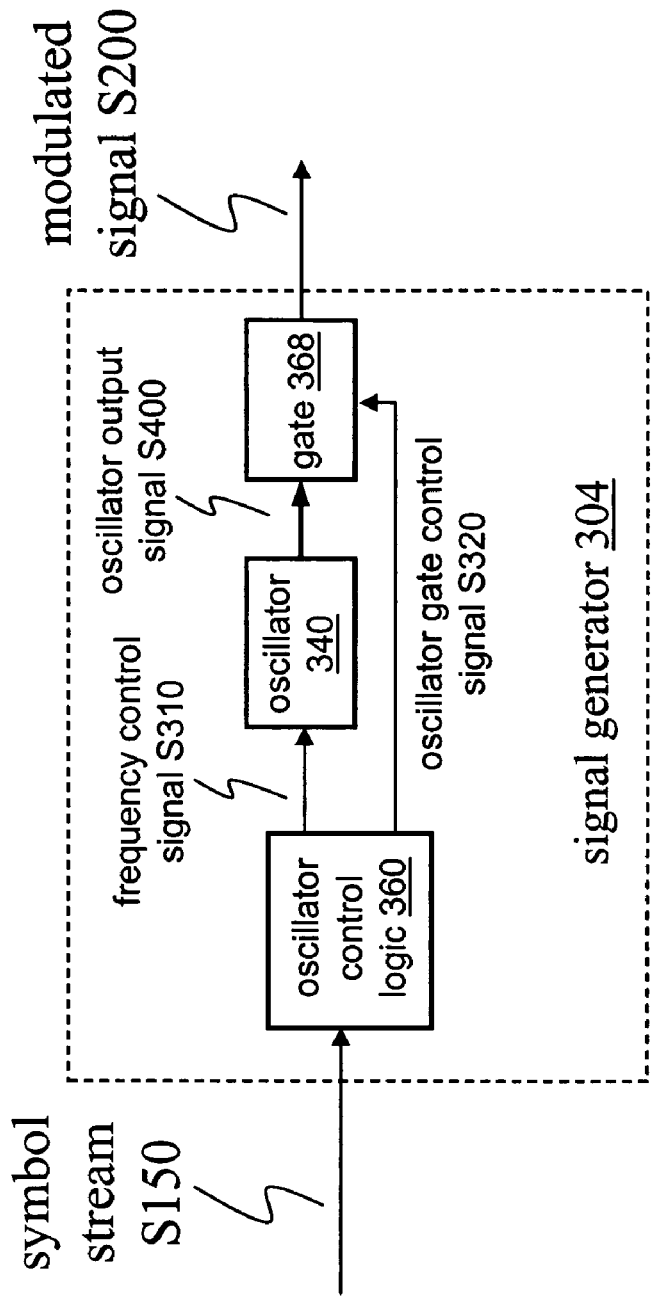
FIG. 27 shows an implementation 304 of signal generator 300.
Figure 28:
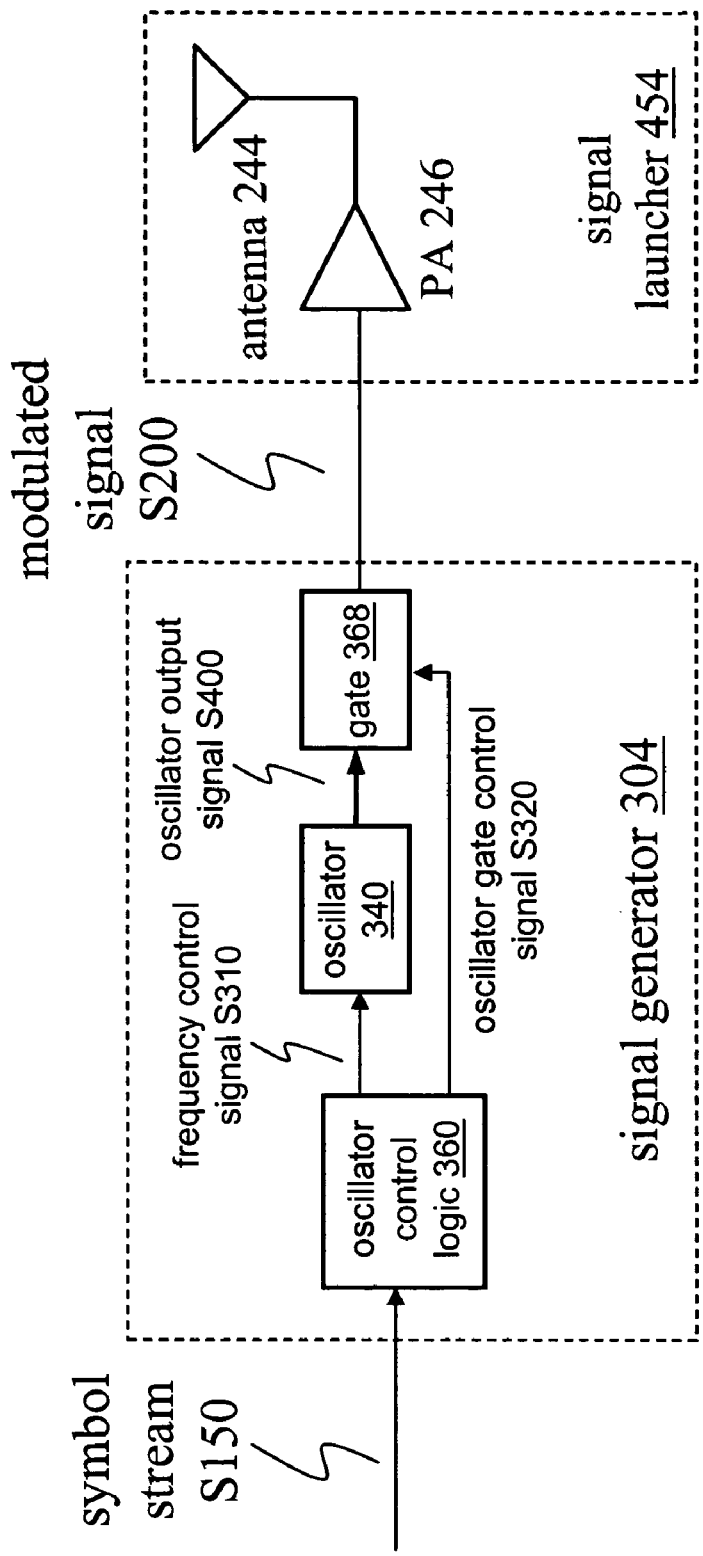
FIG. 28 shows a block diagram of signal generator 304 and an implementation 454 of signal launcher 450.
Figure 29:
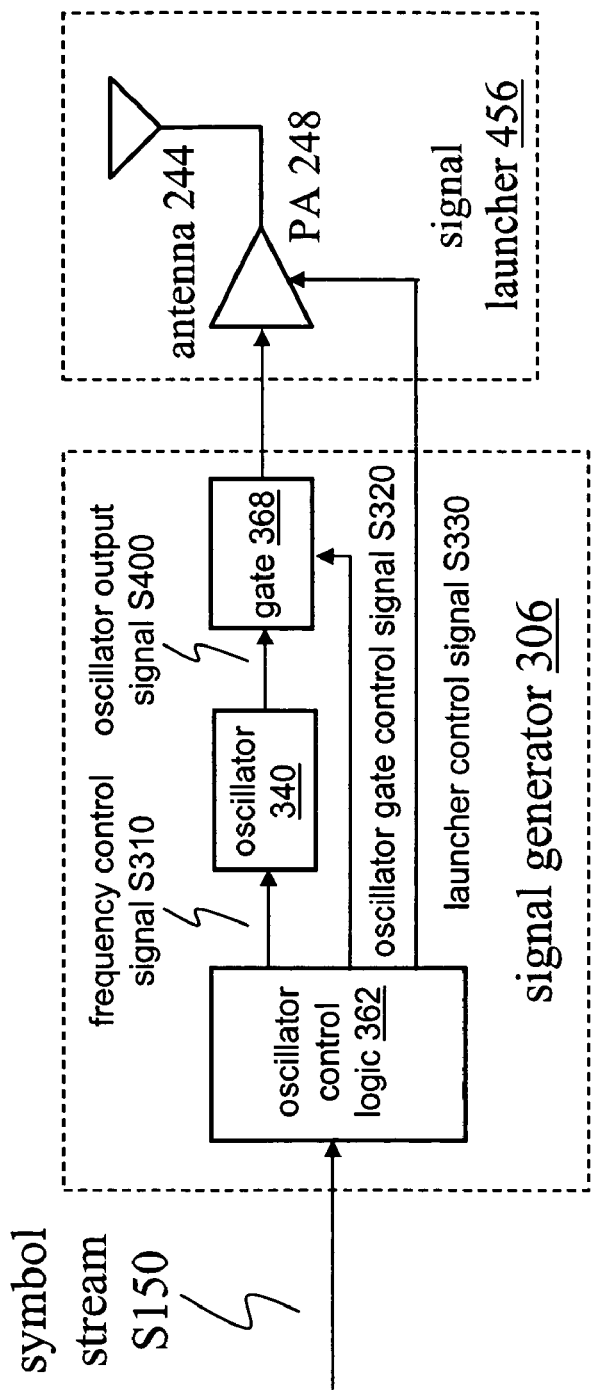
FIG. 29 shows a block diagram of signal generator 306 and an implementation 456 of signal launcher 450.

FIG. 27 shows an implementation 304 of signal generator 300 that includes an oscillator 340 and a gate 368. Oscillator control logic 360, which may include a trigger generator such as trigger generator 320, outputs a frequency control signal S310 and an oscillator gate control signal S320 that are based on symbol stream S150. Frequency control signal S310 may include a set of trigger signals, e.g. as shown in FIG. 25. Oscillator 340, which may be a tunable oscillator as described herein, is tunable to emit waveforms over different frequency bands at different times according to frequency control signal S310. Gate 368 may include a switching device as described above, a mixer, a diode, or another suitable gate. As shown in FIG. 28, the output of gate 368 may be amplified (e.g. by a power amplifier 246 or by a controllable power amplifier 248 as shown in FIG. 29) before radiation. Oscillator gate control signal S320 may control such features as burst start time, burst duration, and burst polarity.

In some applications, an element of a symbol may indicate a rising or falling frequency. In one such case, oscillator 340 is controlled (e.g. via frequency control signal S310) to emit a waveform whose frequency changes accordingly. Such an implementation may also include a gate (e.g. gate 368) that is controlled (e.g. via oscillator gate control signal S320) to output a burst having a corresponding rising or falling frequency. Such 'chirping' techniques may be used in combination with one or more modulation schemes as described above.

In some applications, a polarization of the transmitted signal may be controlled according to symbol stream S150, e.g. within signal launcher 450. As shown in FIG. 29, an implementation 362 of oscillator control logic 360 may output a launcher control signal S330 to control such parameters as burst amplitude, duration, and polarization.

It may be desirable to limit the spectral content of a burst. For example, reducing out-of-band emissions may support a more efficient use of bandwidth. Reducing out-of-band emissions may also be desired to avoid interference with other devices and/or may be required for regulatory compliance. While a filter may be used to modify the spectral content of a burst (as described above), in some applications it may be desirable to modify the spectral content of a burst by controlling the shape of the burst in the time domain instead.

In one ideal system, the frequency spectrum of each burst is rectangular, and the bandwidth of the burst lies within the occupied frequency band. Within the frequency band, the power level is the maximum allowed by regulatory agencies; outside of the frequency band, the power level due to the burst is zero.

The frequency profile of a transmitted waveform may be controlled by controlling the time-dependent amplitude profile of the transmitted burst. If the time-dependent amplitude profile of the burst is rectangular, for example, the frequency content of the burst will have a sine(f)/(f) profile (where f denotes frequency). In such cases, the bandwidth of the burst may extend into one or more adjacent frequency bands and may degrade performance. It may be desirable for the time-dependent amplitude profile to have a sine(t)/(t) shape (where t denotes time), so that a rectangular frequency profile may be created.

In a practical system, the time-dependent amplitude profile of the transmitted burst may have a shape that is an approximation to a sine(t)/(t) function. The resulting frequency spectrum may have a reduction in unintentional leakage of signal energy into an adjacent frequency band (or out of the region of spectrum allocated by a regulatory agency) as compared to a case where a rectangular amplitude profile is utilized. Examples of time-dependent amplitude profiles that may be suitable for particular applications include raised cosine, Gaussian, and low-pass-filtered rectangular pulses.

The actual technique used to generate the desired time-dependant amplitude profile of the burst may depend on the technique used to generate the burst. In many cases, for example, a control voltage within the waveform generator may be tailored to provide the desired tailored burst. One such example is the use of a mixer to switch a CW waveform to generate the desired burst. By low-pass filtering the control signal applied to the mixer, one can obtain a tailored time-dependent amplitude profile and reduced leakage of energy into adjacent frequency bands.

Figure 30:
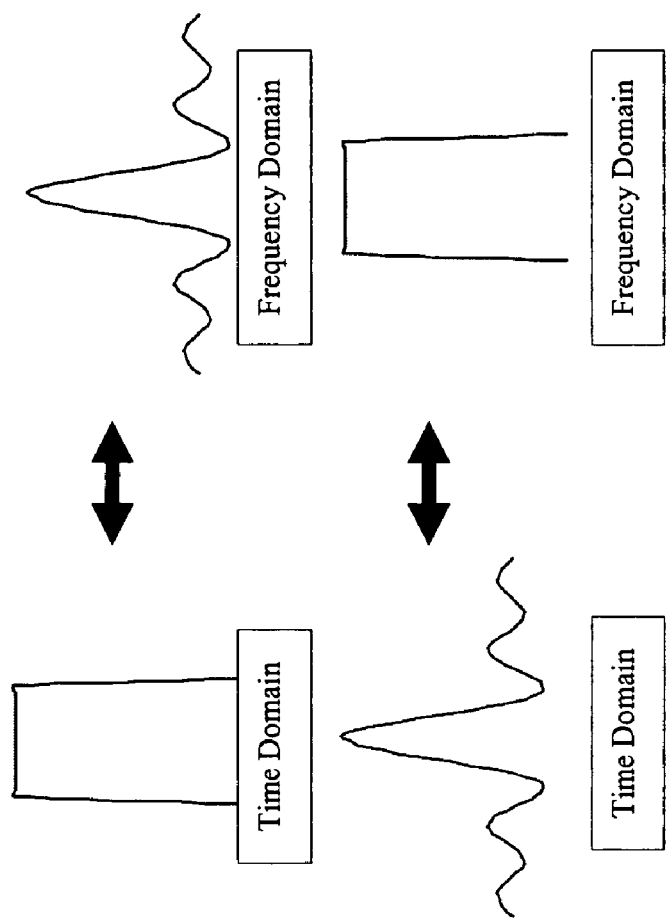
FIG. 30 shows a correspondence between waveform profiles in the time and frequency domains.
Figure 31:
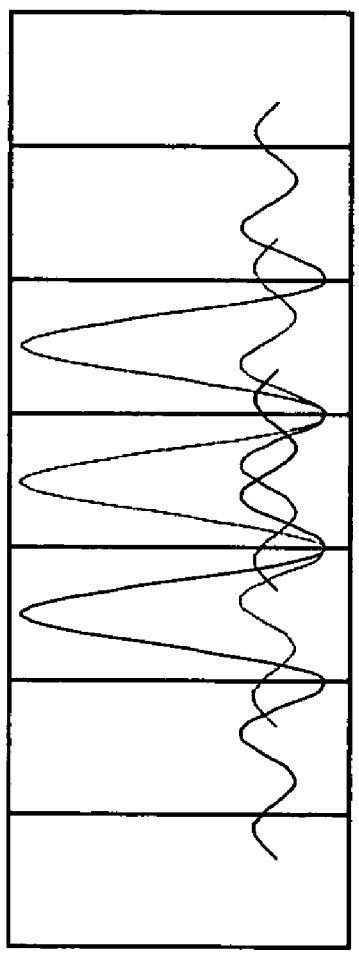
FIG. 31 shows a spectral plot of a sequence of bursts.
Figure 32:
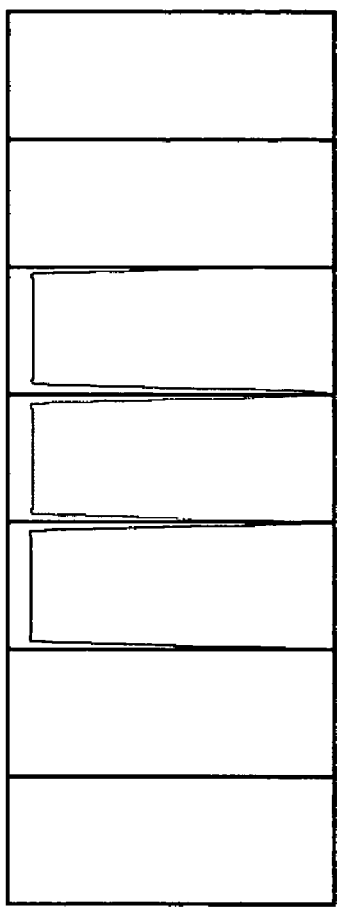
FIG. 32 shows a spectral plot of a sequence of bursts.

FIG. 30 demonstrates that a square impulse in one of the time and frequency domains corresponds to a waveform in the other domain that has the shape of a sinc function. (For example, the Fourier transform may be applied to transform a waveform in one domain to the other domain.) FIG. 31 illustrates an example of a spectrum resulting from the transmission (at three different frequencies) of bursts having square profiles in the time domain. This figure demonstrates that transmitting a burst over one frequency band may cause emissions in neighboring frequency bands. FIG. 32 illustrates an example of a spectrum resulting from the transmission (at the same three frequencies) of bursts having sinc-shaped profiles in the time domain. This figure demonstrates that shaping the time-domain profile of a burst may reduce emissions in neighboring frequency bands.

These figures demonstrate that spectral shaping may be based on time-domain control of a burst profile rather than (or in addition to) the use of burst-shaping filters. In certain burst generator examples described herein, the switch or applied voltage pulse may be used to control the burst shape in the time domain, thereby controlling the relationship between energy and frequency within the band and also establishing the roll-off profile of energy outside the band.

Figure 33:
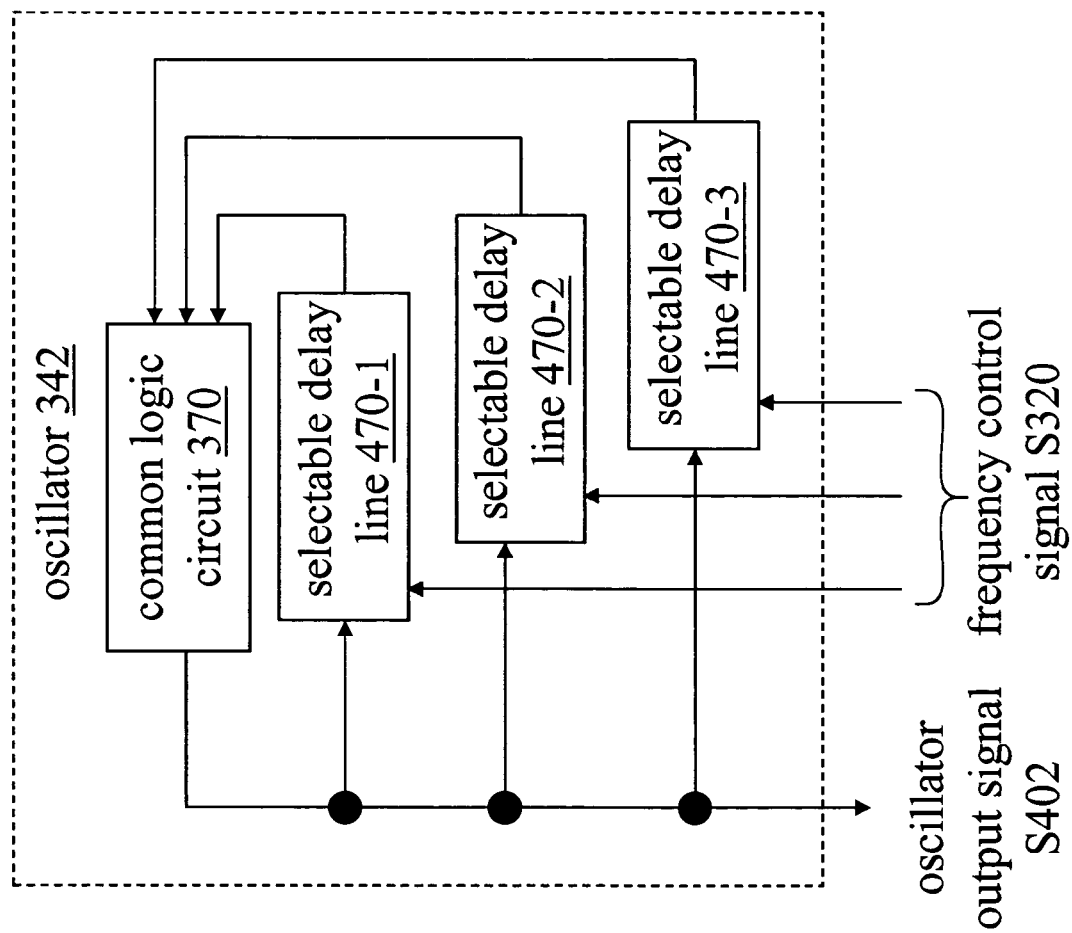
FIG. 33 shows a block diagram of an oscillator 342 according to an embodiment of the invention.

FIG. 33 shows a block diagram of a tunable oscillator 342 according to an embodiment of the invention. Oscillator 342 may be used as oscillator 340 in an implementation of signal generator 300 as shown, e.g., in FIGS. 27-29. In combination with a suitable switching device (e.g. a gate), oscillator 342 may also be used as burst generator 330 in other implementations of signal generator 300.

Oscillator 342 includes selectable delay lines 470, which introduce delays of different periods. Such delay lines may include analog delay elements (e.g. inductors, RC networks, long transmission lines) and/or digital delay elements (e.g. inverters and/or other logic elements or gates). A common logic circuit 370 is coupled to the output terminal of each selectable delay line 470. Common logic circuit 370, which includes one or more logic gates, changes the state of its output signal according to a state transition at one of its inputs and may or may not invert the received state transition depending on the particular circuit configuration. Each of selectable delay lines 470 is selectable via frequency control signal S320 such that only one receives an output signal from common logic circuit 370 during any time period. It may be desirable in some implementations to buffer the output of oscillator 342 before connection of oscillator output signal S402 to a load.

In some implementations, a selectable delay line 470 may include a portion of the path that couples the selectable delay line to common logic circuit 370, with the length and/or character of such portion being designed to introduce a desired propagation delay or other effect. In other implementations, the delay (and/or the delay difference between delay lines) introduced by such paths may be considered negligible.

A control circuit or device (such as oscillator control logic 360) provides frequency control signal S320 to control the frequency of the oscillator's output. For example, frequency control signal S320 may be a function of an n-tuple that indicates a burst occupying a particular frequency band. For at least some implementations of oscillator 342, the frequency of oscillator output signal S402 may be changed at every cycle of the oscillation.

Figure 34:
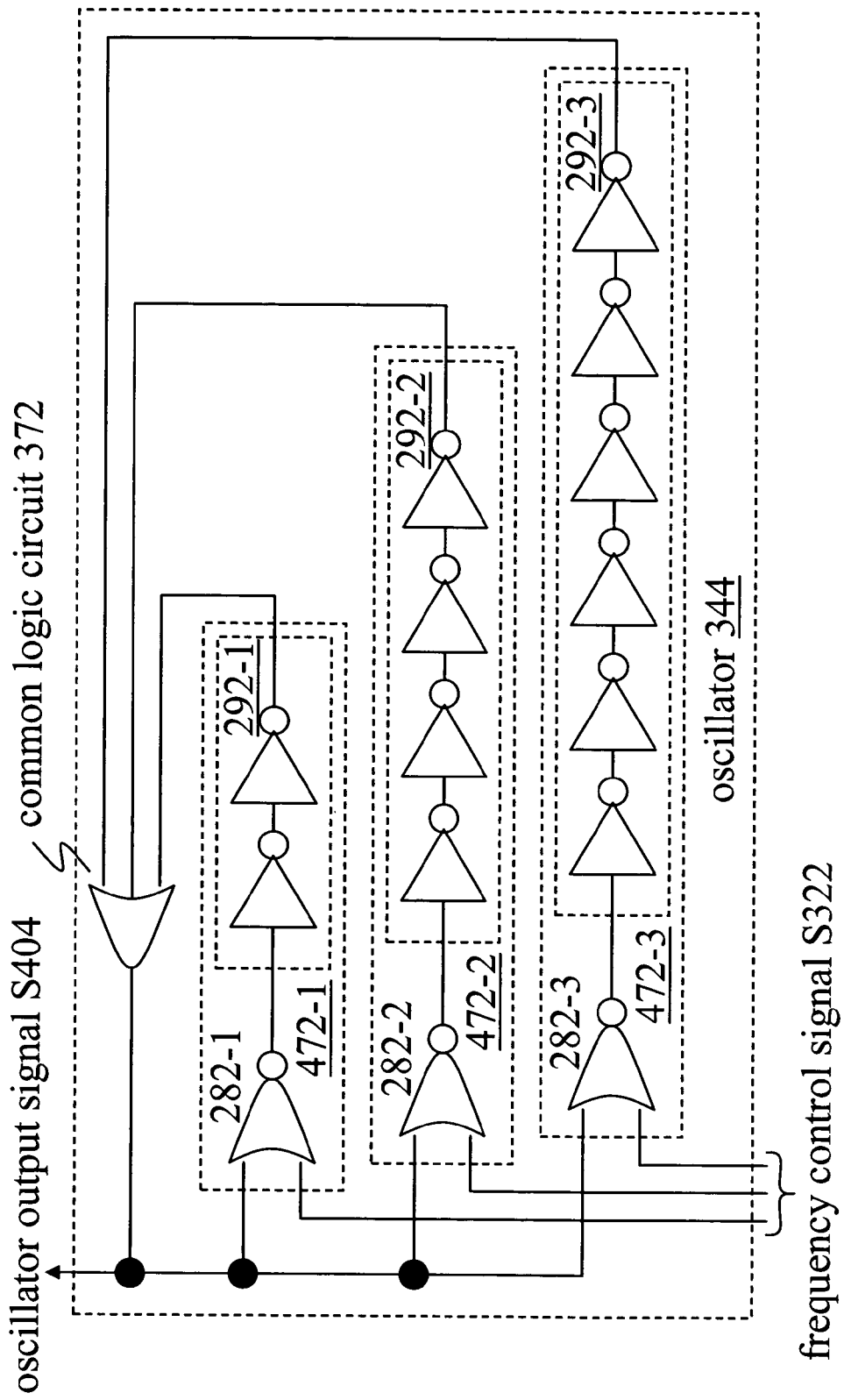
FIG. 34 shows a block diagram of an implementation 344 of oscillator 342.

FIG. 34 shows a block diagram of an implementation 344 of oscillator 342. Each selectable delay line 472 includes an inverting selector portion 282 (e.g. a NOR gate) and a delay portion 292 having an even number of inverters in series. Common logic circuit 372 is a noninverting selector (e.g. an OR gate). In this case, the lines of frequency control signal S322 are active low.

Figure 35:
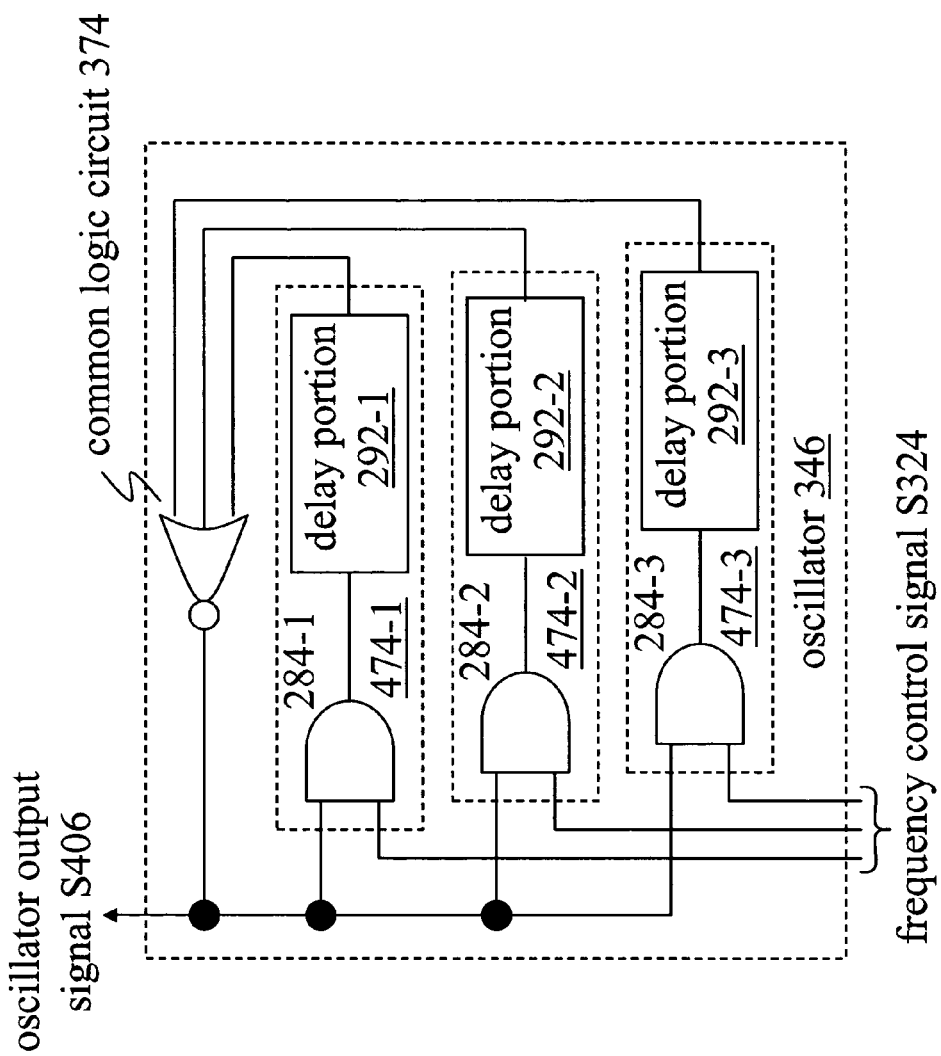
FIG. 35 shows a block diagram of an implementation 346 of oscillator 342.

FIG. 35 shows a block diagram of an implementation 346 of oscillator 342. Each selectable delay line 474 includes a noninverting selector portion 284 (e.g. an AND gate) and a delay portion 292 having an even number of inverters in series. Common logic circuit 374 is an inverting selector (e.g. a NOR gate). In this case, the lines of frequency control signal S324 are active high.

Figure 36:
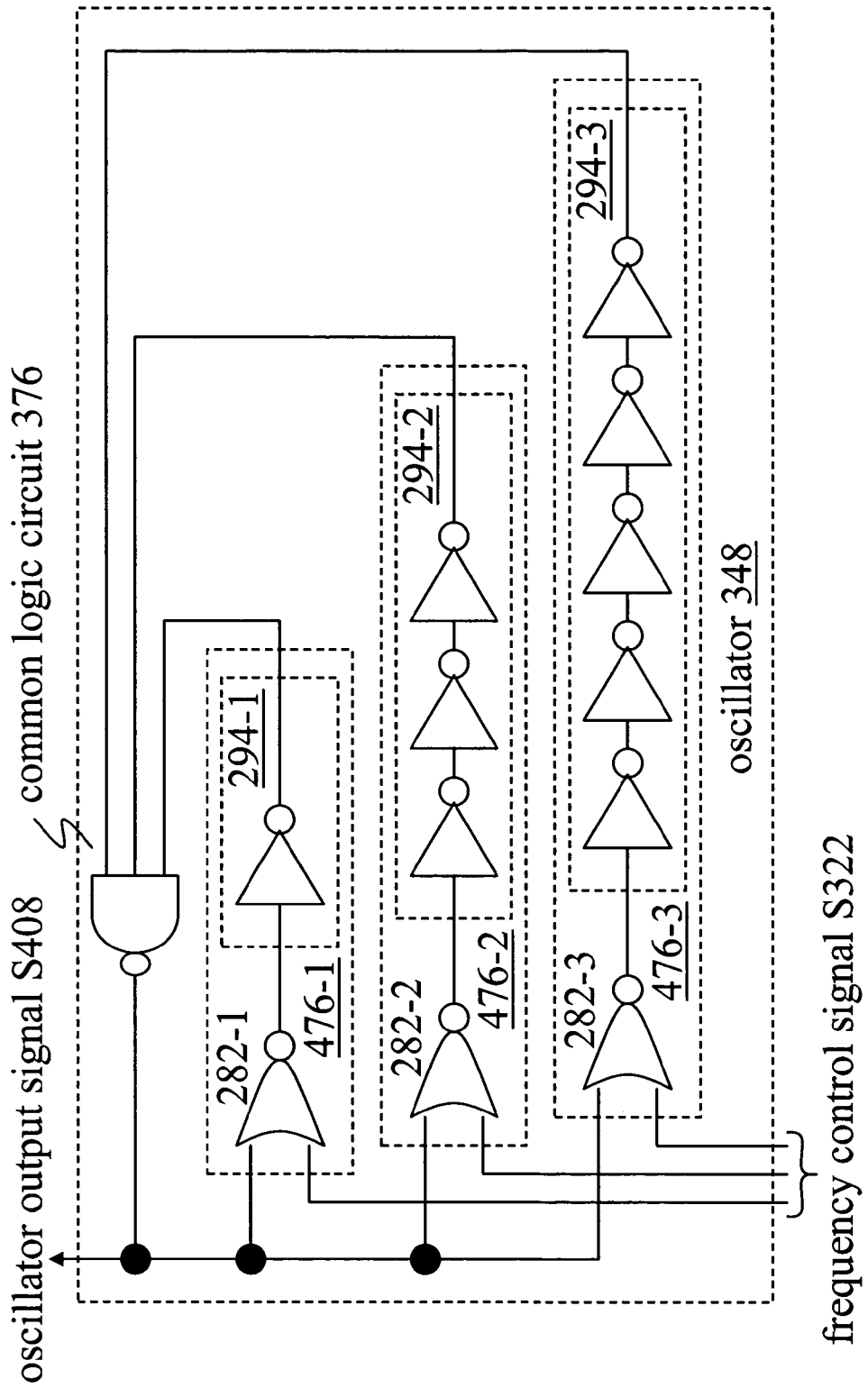
FIG. 36 shows a block diagram of an implementation 348 of oscillator 342.

Many other configurations are possible for oscillator 342, including configurations in which each selectable delay line includes a chain having an odd number of inverters in series. For example, FIG. 36 shows such a configuration 348 that includes selectable delay lines 476 having delay portions 294 (in this case, the lines of frequency control signal S322 are active low). The shortest path in an implementation of oscillator 342 may include only three inversions, while the longest path may include an arbitrarily large odd number of inversions. Additionally, the number of different selectable delays in an implementation of oscillator 342 may be arbitrarily large.

Figure 37:
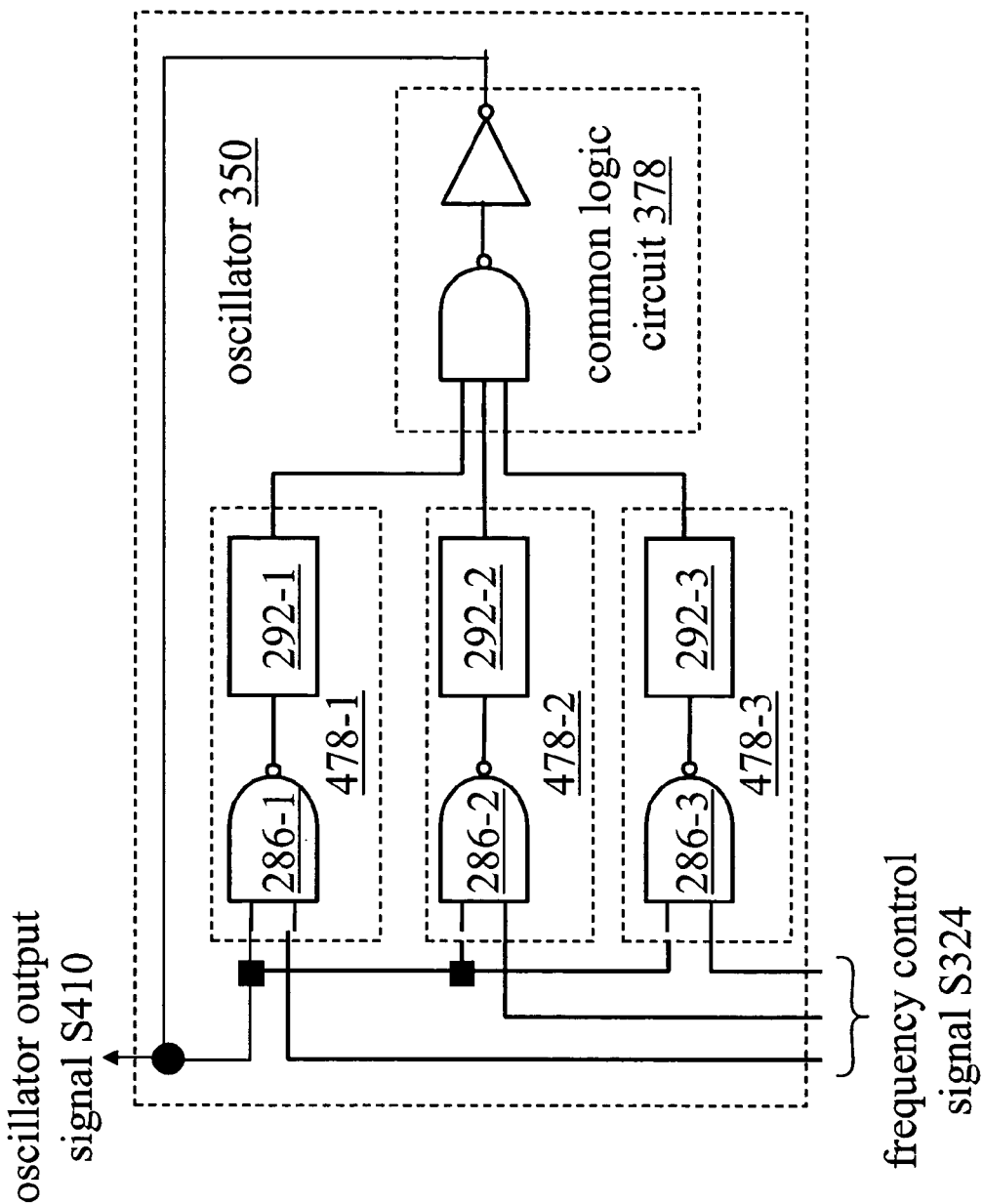
FIG. 37 shows a block diagram of an implementation 350 of oscillator 342.

FIG. 37 shows a block diagram of an implementation 350 of oscillator 342 in which an implementation 378 of common logic circuit 370 includes a NAND gate and an inverter. In this example, each selectable delay line 478 includes a selector portion 286 (e.g. a NAND gate) and a delay portion 292 that includes a generic (e.g. analog and/or digital) delay line.

Figure 38:
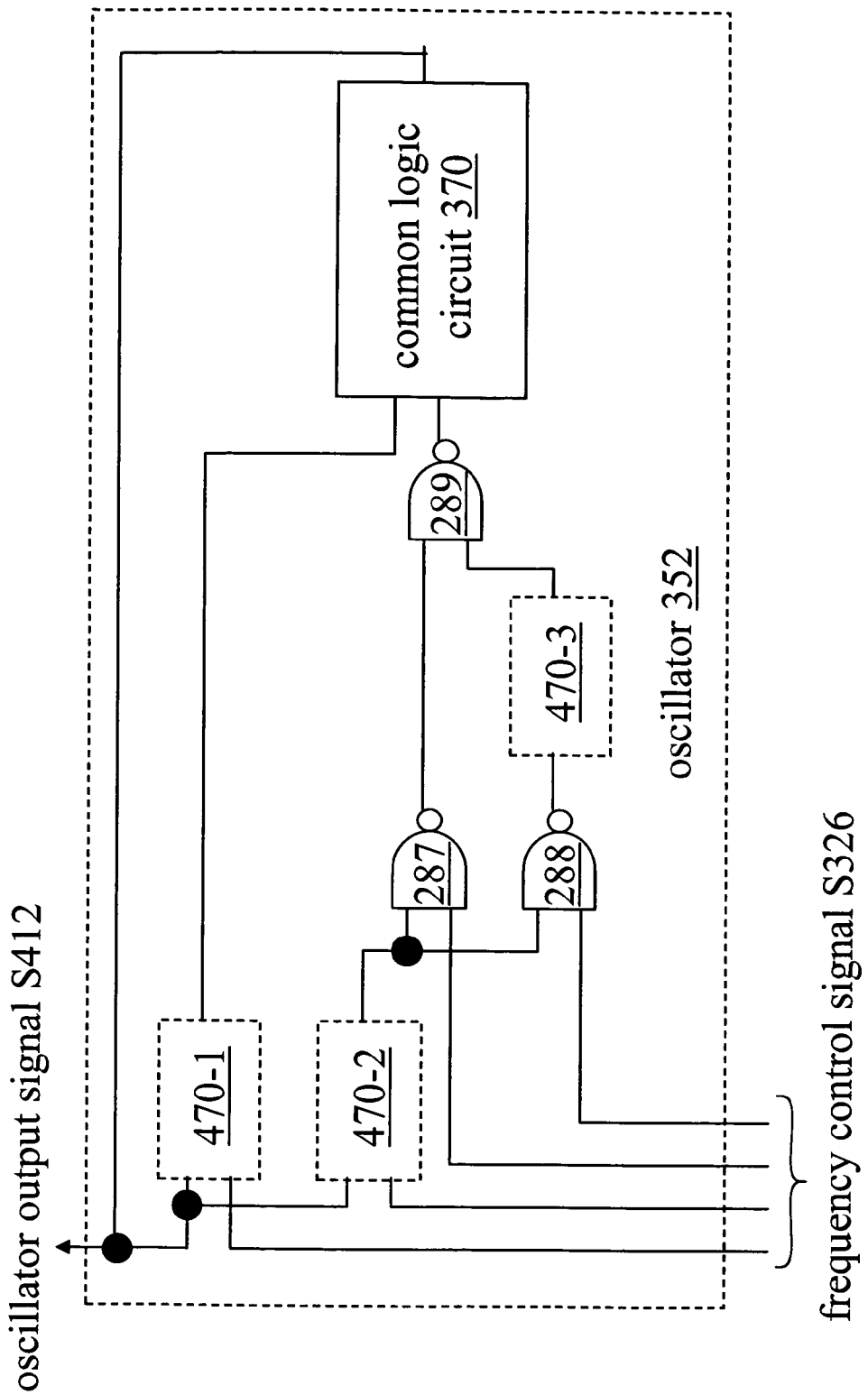
FIG. 38 shows a block diagram of an implementation 352 of oscillator 342.

In some implementations of oscillator 342, one or more delay paths may be further selectable. For example, FIG. 38 shows an implementation 352 of oscillator 342 in which one of the delay paths includes two individual selectable delay lines 470.

Oscillators based on implementations of oscillator 342 as described herein may also include oscillators that produce more than one burst simultaneously, each such burst occupying a different frequency band.

A frequency of an oscillator may change over time. For example, the delays introduced by the delay lines of oscillator 342 may change in some cases due to environmental factors, such as temperature or voltage, or to other factors such as aging or device-to-device variances. It may be desirable to compensate for these variations, e.g. in order to maintain a desired oscillation frequency.

Figure 39:
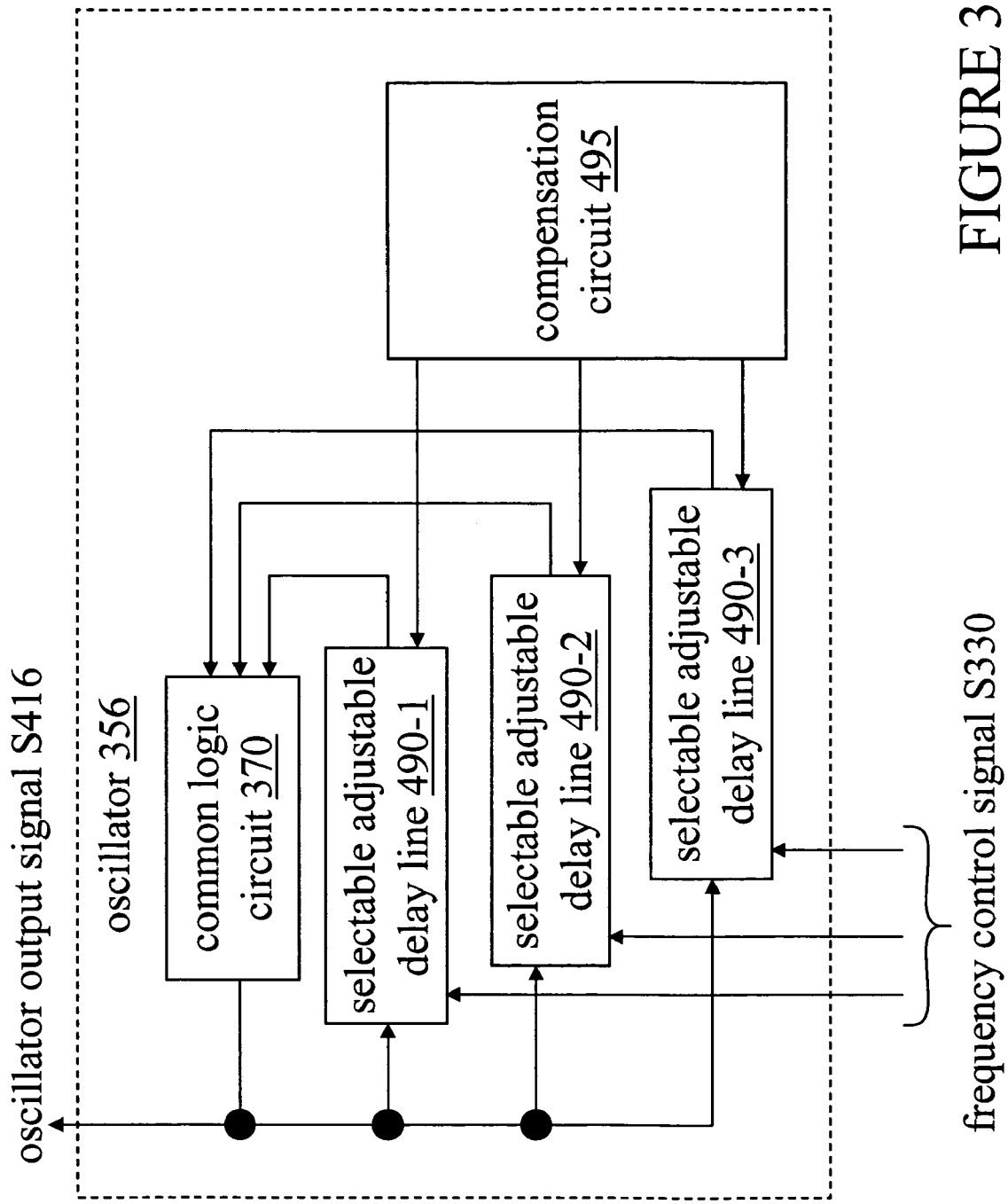
FIG. 39 shows a block diagram of an implementation 356 of oscillator 342 and a compensation mechanism 495.

FIG. 39 shows an implementation 356 of oscillator 342 that includes selectable adjustable delay lines 490. Each of selectable adjustable delay lines 490 may include a controllable delay element as described in, e.g., any one of U.S. Pat. Nos. 5,646,519; 5,731,726; or 6,054,884. Compensation circuit 495 controls a delay period of at least one of selectable adjustable delay lines 490.

Figure 40:
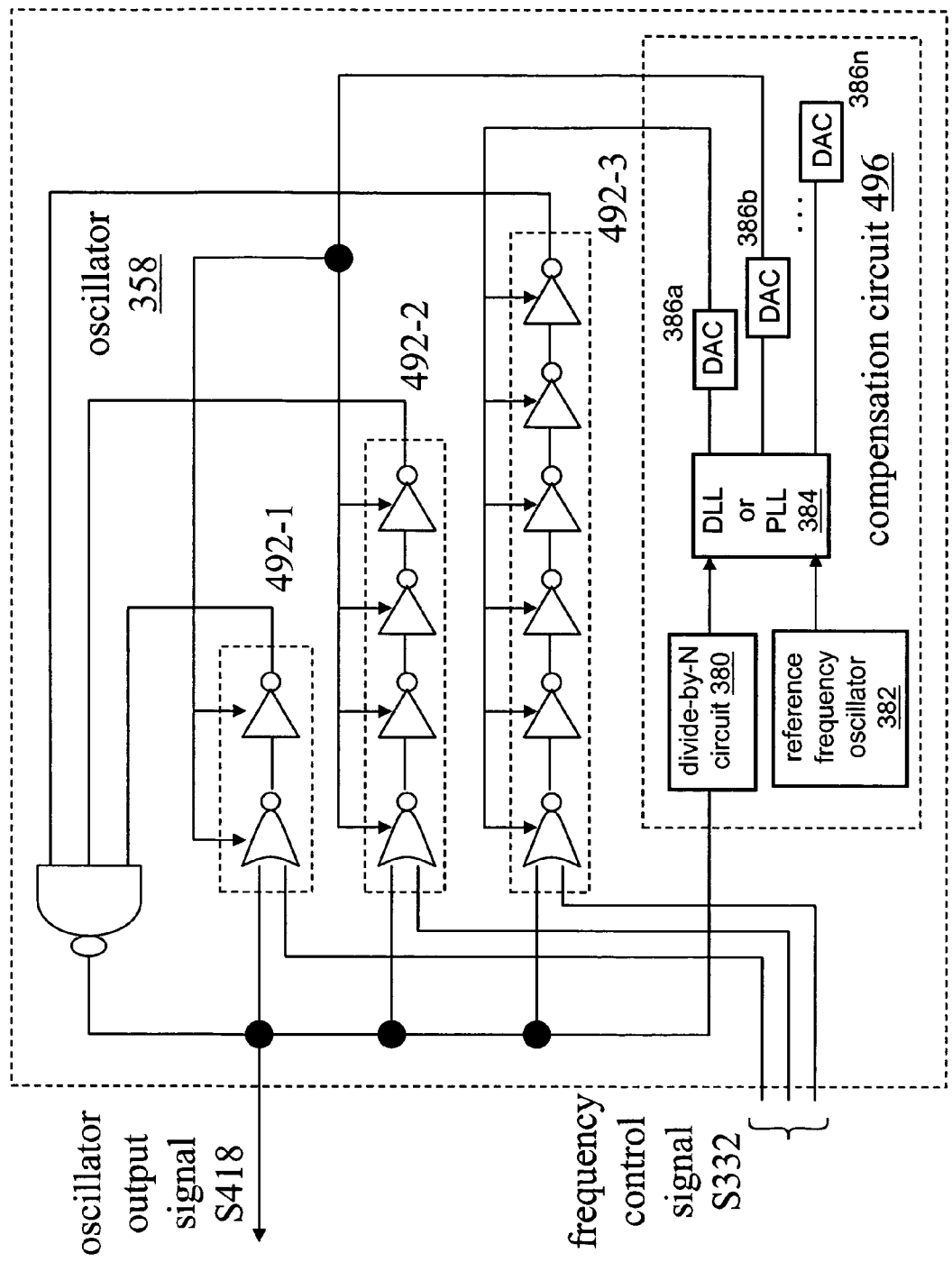
FIG. 40 shows a block diagram of an implementation 358 of oscillator 342 and an implementation 496 of compensation mechanism 495.

FIG. 40 shows a block diagram of an implementation 358 of oscillator 342 that includes an implementation 496 of compensation circuit 495. Divide-by-N circuit 380 scales the frequency of the oscillator output to match that of a reference frequency oscillator 382. A phase-locked loop (or digital locked loop) 384 compares the two frequencies and outputs a signal (e.g. a voltage) according to a difference in frequency or phase between them. One or more digital-to-analog converters (DACs) and/or controllable voltage references 386 may be included to convert a digital difference signal into an analog signal to control a characteristic of one or more of the adjustable delay lines 492. A DAC or controllable reference may be dedicated to one delay line or may control more than one delay line. The DACs or controllable references may also serve to sample and hold the difference signal until a subsequent compensation operation. In another implementation, one or more of the adjustable delay lines are controlled digitally.

Figure 41:
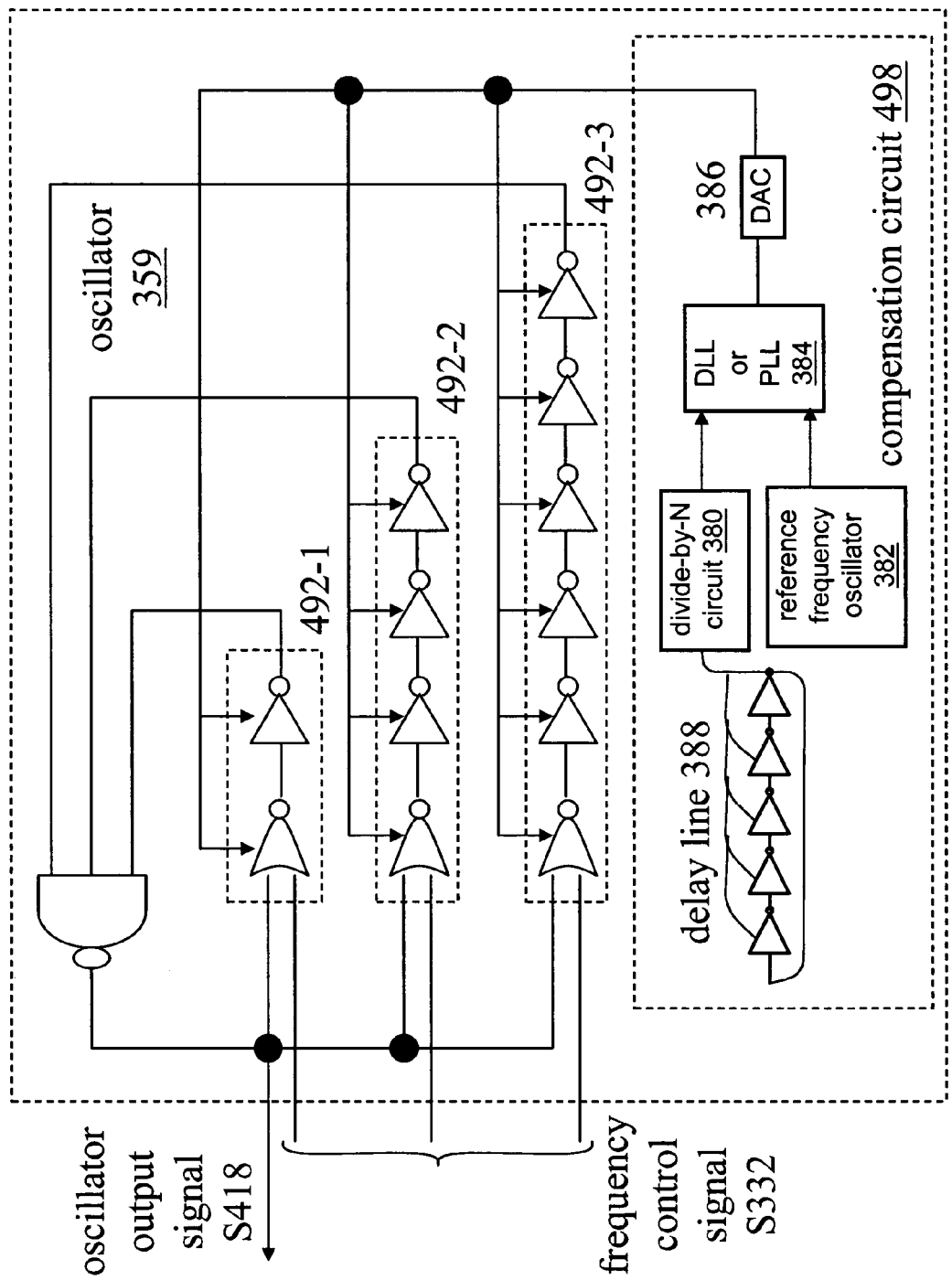
FIG. 41 shows a block diagram of oscillator 358 and an implementation 498 of compensation mechanism 495.

FIG. 41 shows a block diagram of an implementation 359 of oscillator 342 that includes an alternate implementation 498 of compensation circuit 495. This circuit includes an additional delay line 388 that is fabricated to react to environmental changes in the same way as the adjustable delay lines 492. The adjustable delay lines are then controlled according to a frequency or phase error in the additional delay line 388.

Figure 42:
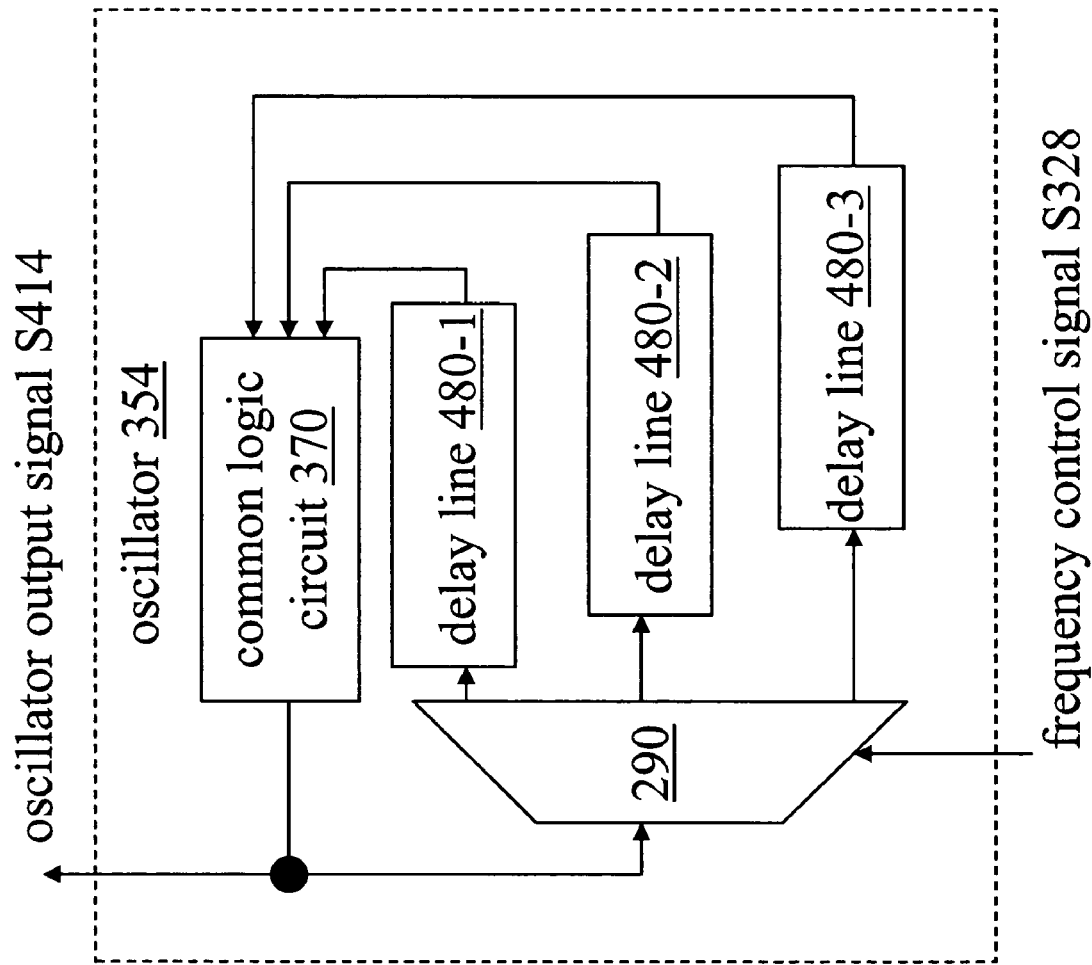
FIG. 42 shows a block diagram of an implementation 354 of oscillator 342.

FIG. 42 shows a block diagram of an implementation 354 of oscillator 340 that may be used in place of oscillator 342, e.g. in many of the applications described herein. In this implementation, multiplexer 290 applied an implementation S328 of frequency control signal S320 to provide selection between the various delay lines 480, which may be adjustable (e.g. by a compensation circuit as described herein) but need not include selector portions.

In some applications, it may be acceptable to run oscillator 340 continuously. In other applications, it may be desirable to reduce power consumption by, e.g., turning on oscillator 340

(or a portion thereof, such as a compensation circuit) only a short period before transmitting.

In some implementations of oscillator 342, an oscillator output signal may be tapped off for signal launch at more than one location. For example, tap off can occur at a junction where all signals are combined, or could occur outside of junctions for each signal in which the signals may or may not be later combined.

Figure 43:
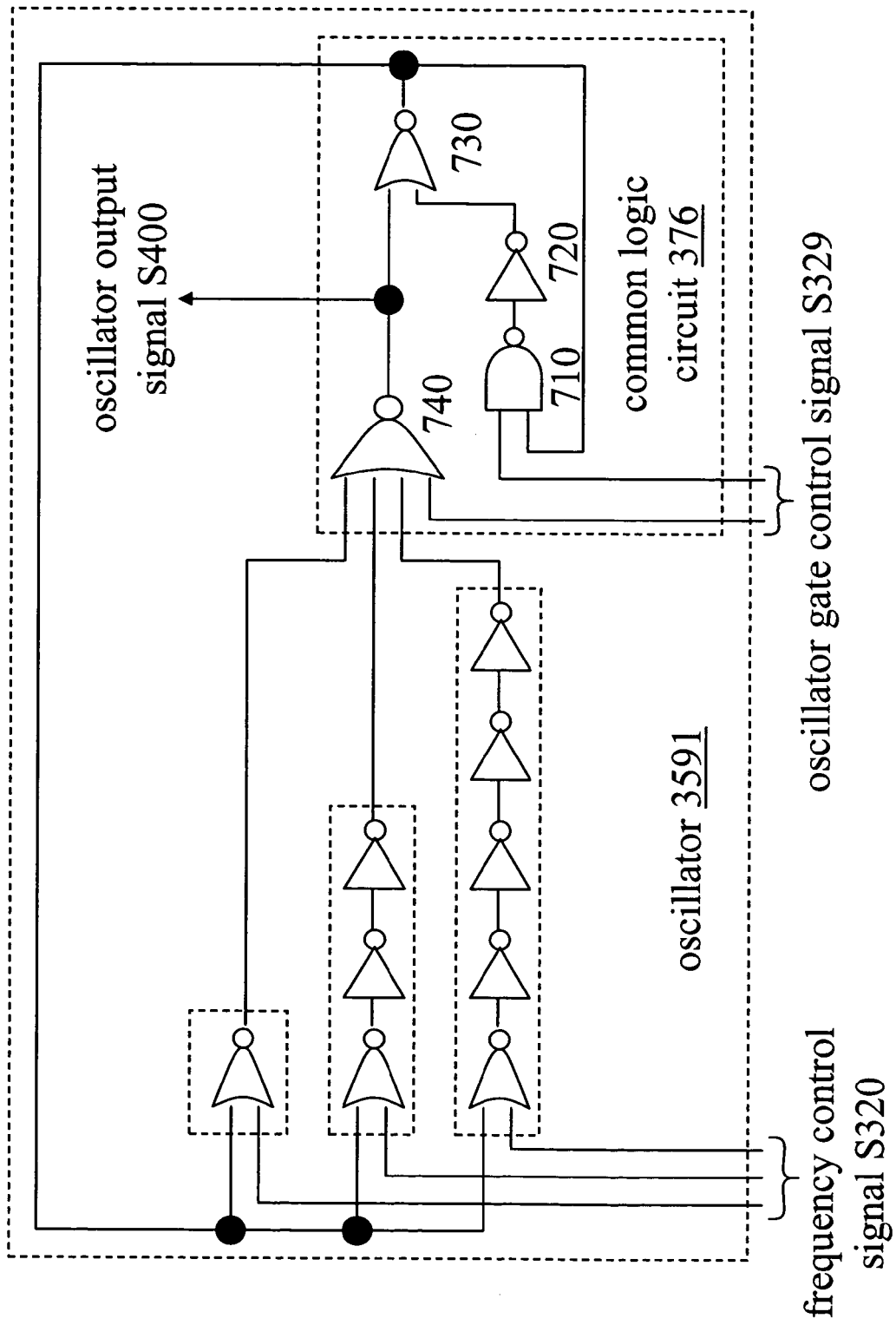
FIG. 43 shows a block diagram of an implementation 360 of oscillator 342 according to an embodiment of the invention.

FIG. 43 shows a block diagram of an implementation 3591 of oscillator 342. When all of the delay lines are disabled (in this example, by holding all lines of frequency control signal S320 high), the oscillator section (here, gates 710, 720, and 730) within common logic circuit 376 may be set to run freely (in this example, with both lines of oscillator gate control signal S329 being high). When a signal launch is desired, frequency control signal S320 selects the desired delay line and both lines of oscillator gate control signal S329 are set low, forming a circuit including the selected delay line and output gate 740 to oscillate at the desired frequency. The lines of oscillator gate control signal S329 may be individually timed, or one line may be used. Similarly, the line or lines of oscillator gate control signal S329 may be linked to (e.g. may provide timing for or may be derived from) frequency control signal S320 or may be individually timed (e.g. depending upon factors such as gate setup and hold times and concerns such as avoiding spurious outputs). A configuration as in oscillator 3591 may reduce transients due to oscillator start-up time by separating a free-running oscillator section from the output (e.g. from the signal launcher), so that this oscillator section may be continuously running between bursts or may be started-up at some time prior to the signal being launched.

In some applications, it may be desirable to filter the output of oscillator 360 (e.g. to remove unwanted harmonics). Examples of suitable filters may include cavity filters, surface acoustic wave (SAW) filters, discrete filters, transmission line filters, and/or any other RF filter technique.

Implementations of oscillator 360 as described above may be fabricated (e.g. in whole or in part) in application-specific integrated circuits (ASICs) using one or more known techniques such as ECL, PECL, CMOS, or BiCMOS and materials such as SiGe, GaAs, SiC, GaN, 'strained silicon', etc.

Figure 44:
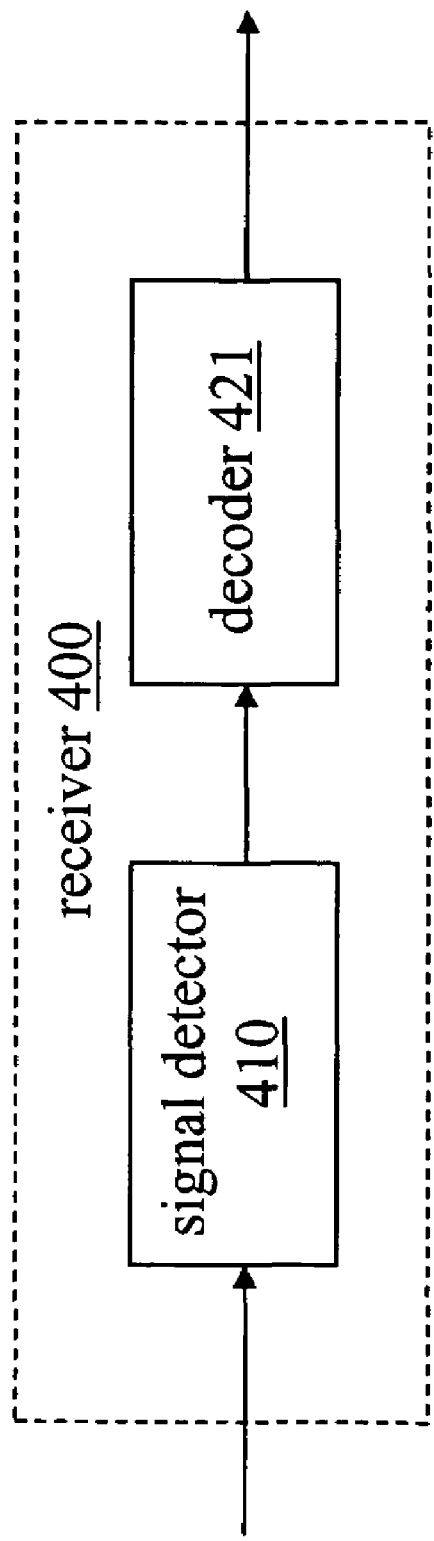
FIG. 44 shows a block diagram of a receiver 400 according to an embodiment of the invention.

FIG. 44 shows a receiver 400 according to an embodiment of the invention. Signal detector 410 receives a received signal (e.g. after amplification and/or filtering) and outputs an ordered series of n-tuples. Decoder 421 receives the ordered series of n-tuples and outputs a corresponding ordered set of data values. Decoder 421 may also perform digital signal processing operations on the series of n-tuples (e.g. filtering operations).

Figure 45:
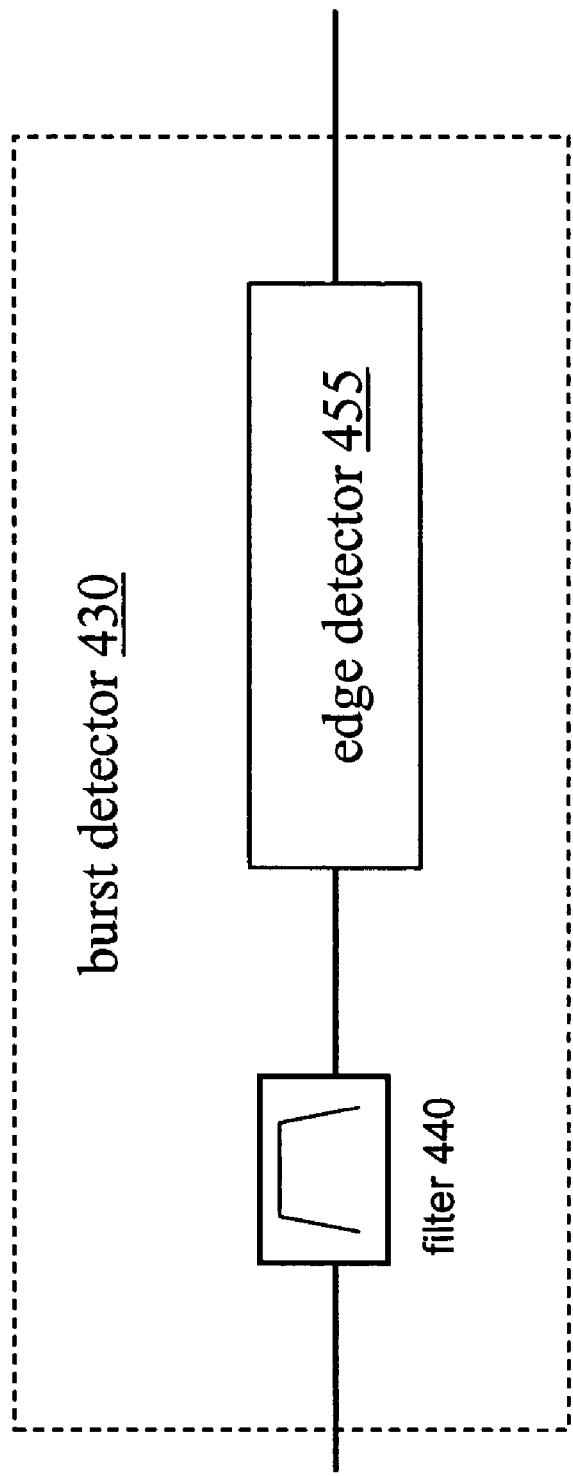
FIG. 45 shows a block diagram of a burst detector.

FIG. 45 shows a block diagram of a burst detector 430 suitable for use in signal detector 410. Filter 440 (e.g. a bandpass filter) passes energy within a particular frequency band. Edge detector 455 detects a rising edge of a signal received within the corresponding frequency band. Signal detector 410 may include a parallel arrangement of several burst detectors, each configured to detect bursts on a different frequency band.

Figure 46:
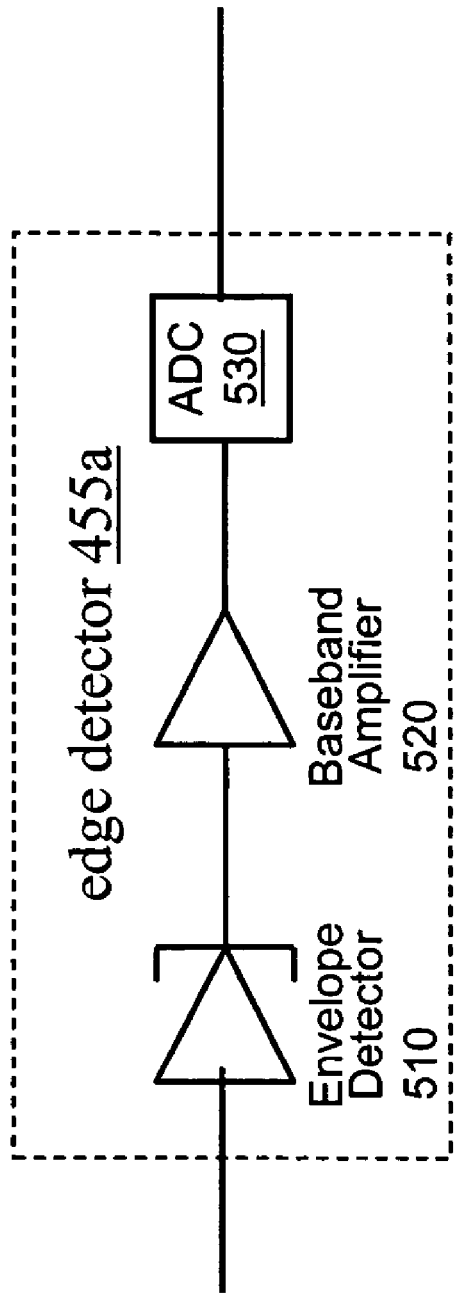
FIG. 46 shows a block diagram of an implementation 455a of edge detector 455.

FIG. 46 shows a block diagram of an implementation 455a of edge detector 455. In this example, the envelope detector is a square-law device. For high-frequency applications, for example, the envelope detector may be a tunneling diode or similar device. The baseband output of the envelope detector is amplified (e.g. by baseband amplifier 520) and digitized (e.g. by analog-to-digital converter (ADC) 530).

Figure 47:
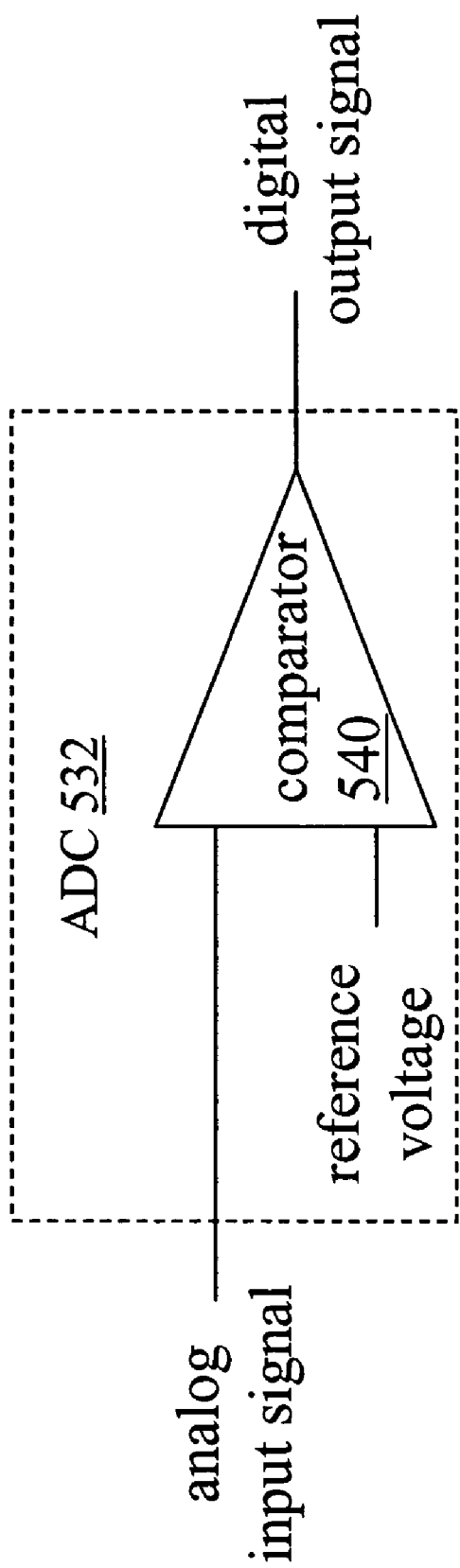
FIG. 47 shows a block diagram of an implementation 532 of ADC 530 that includes a comparator.

In its simplest form, digitization of the baseband signal may be performed by comparison of the signal with a reference voltage (e.g. thresholding). For example, FIG. 47 shows a block diagram of such an ADC 532 including a comparator 540. Depending on the particular application, other suitable ADCs may include multi-bit parallel-encoding (flash), successive-approximation, dual-slope, digital-ramp, delta-sigma-modulation, or other configurations.

Figure 48:
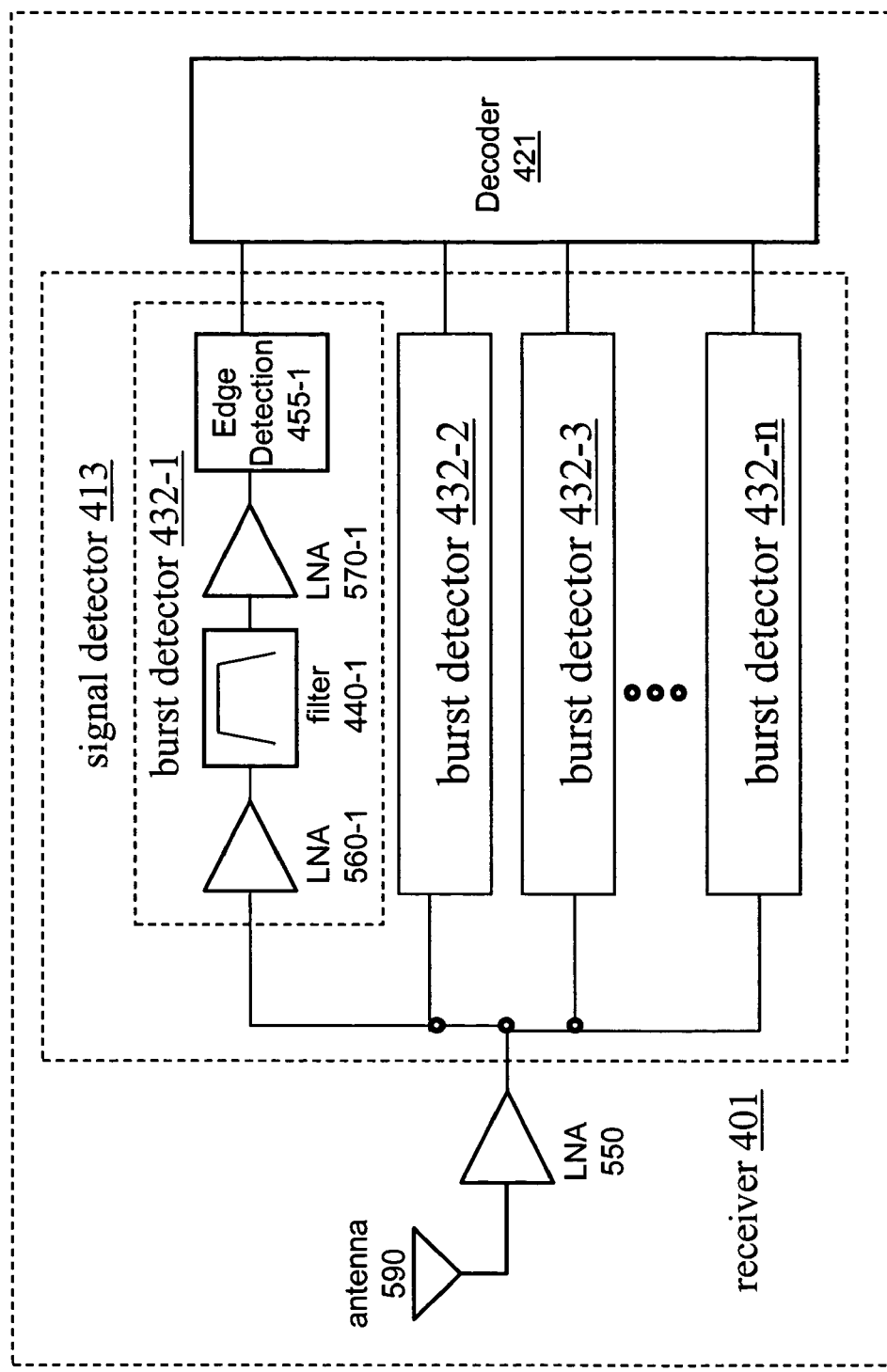
FIG. 48 shows a block diagram of a receiver 401 according to an embodiment of the invention including an implementation 413 of signal detector 410.

FIG. 48 shows an implementation 401 of receiver 400 that includes an implementation 413 of signal detector 410. This signal detector includes a parallel arrangement of implementations 432 of burst detector 430. As shown in this example, a burst detector 430 may include other processing blocks such as low-noise amplifiers (LNAs). A receiver may also include an LNA between the antenna and processing circuitry.

Figure 49:
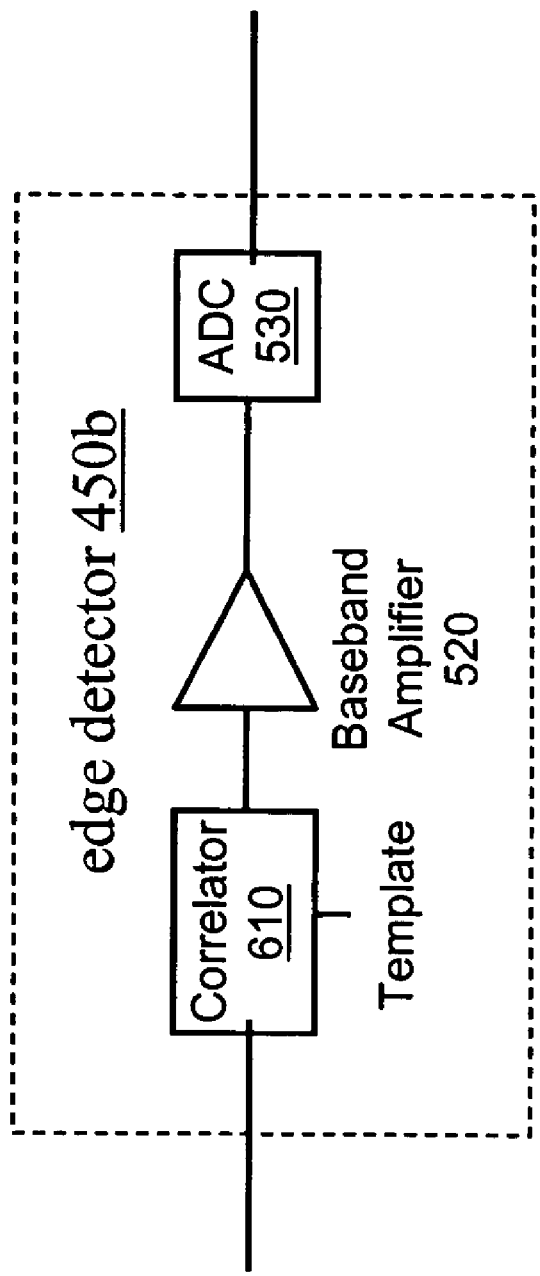
FIG. 49 shows a block diagram of an implementation 455b of edge detector 455.

FIG. 49 shows a block diagram of another implementation 455b of edge detector 455. In this example, a correlator 610 receives the filtered signal and correlates it with a template to produce a corresponding baseband signal.

Figure 50:
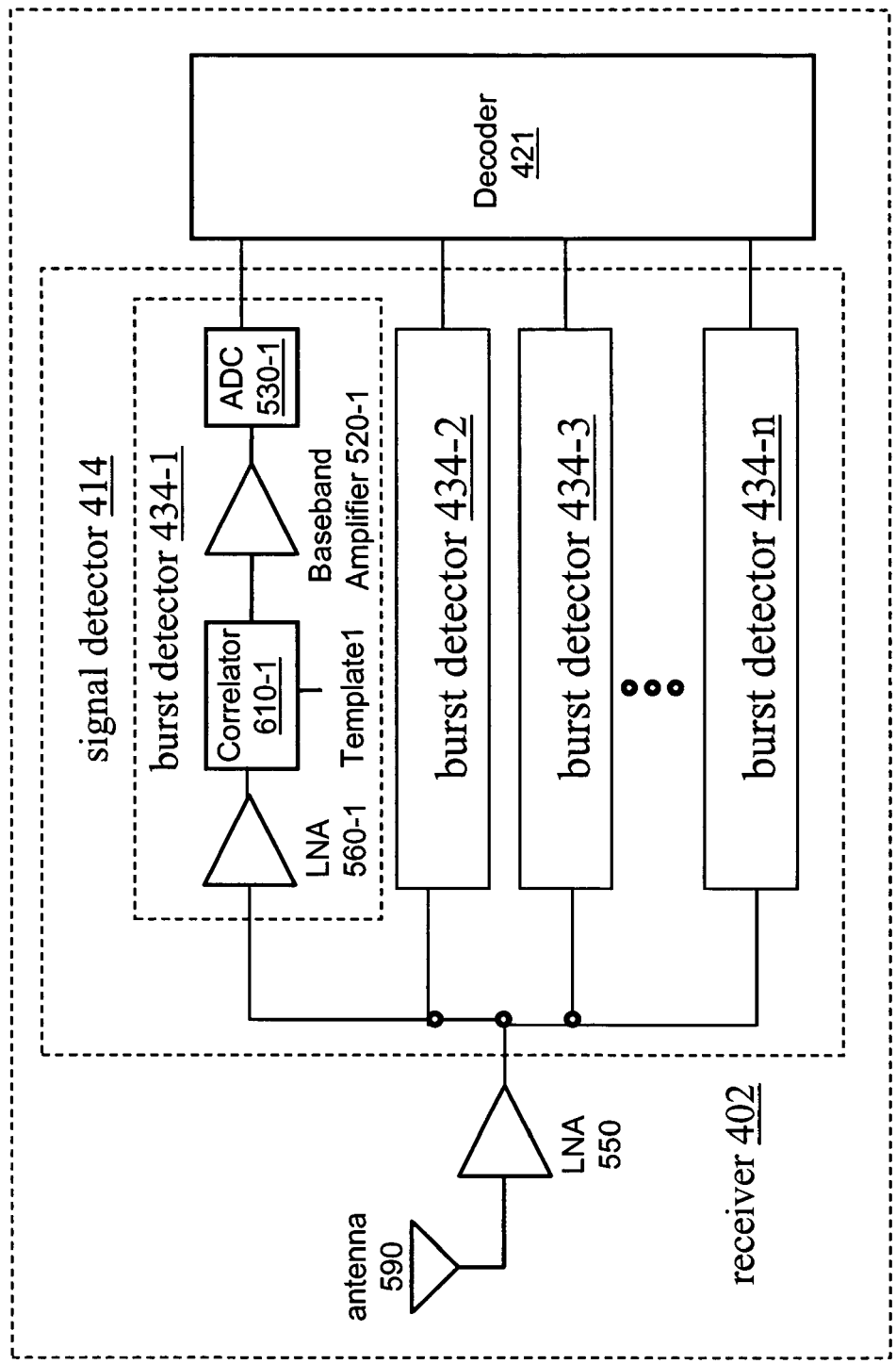
FIG. 50 shows a block diagram of a receiver 402 according to an embodiment of the invention including an implementation 414 of signal detector 410.

FIG. 50 shows an implementation 402 of receiver 400 that includes an implementation 414 of signal detector 410. This signal detector includes a parallel arrangement of implementations 434 of burst detector 430 that include correlators 610, each of which may apply a different template to their input signals. In this case, each burst detector 434 also includes a LNA 560 upstream of the correlator that serves as a filter.

Figure 51:
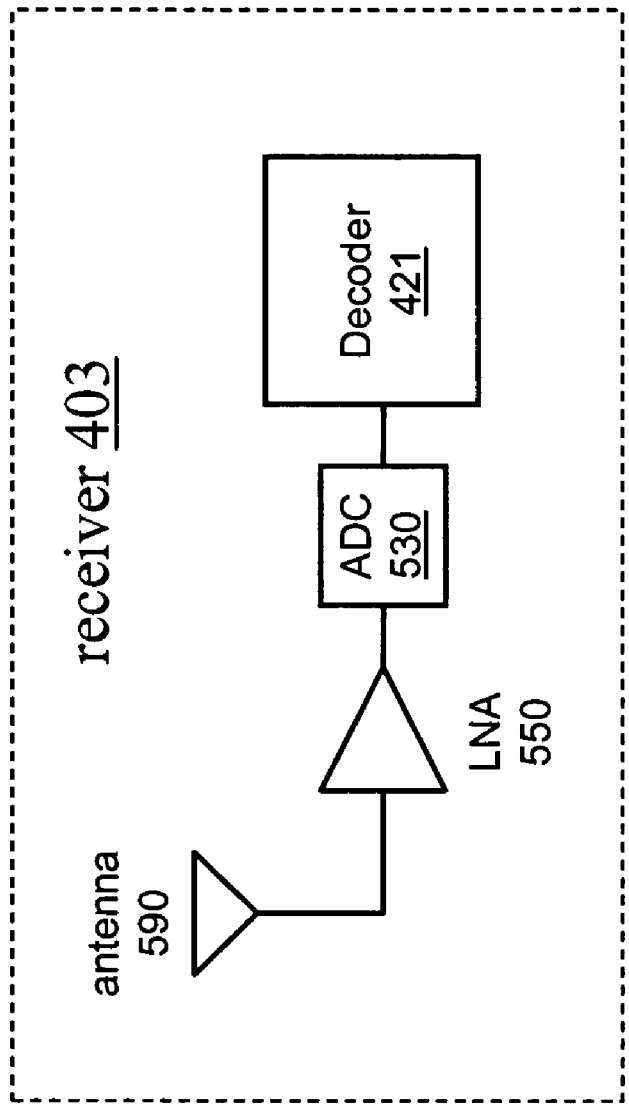
FIG. 51 shows a block diagram of a receiver 403 according to an embodiment of the invention.

As the operating speed of ADCs increases, it is also contemplated to sample the incoming signal directly and filter it after digitization. One such receiver is shown in FIG. 51. In one such implementation, the digitized output is filtered (e.g. by decoder 421) to determine the activity over time on each frequency band. In another implementation, successive fast Fourier transforms are performed in time on the digitized output, and the activity on each individual frequency band is determined from the resulting spectral information.

Figure 52:
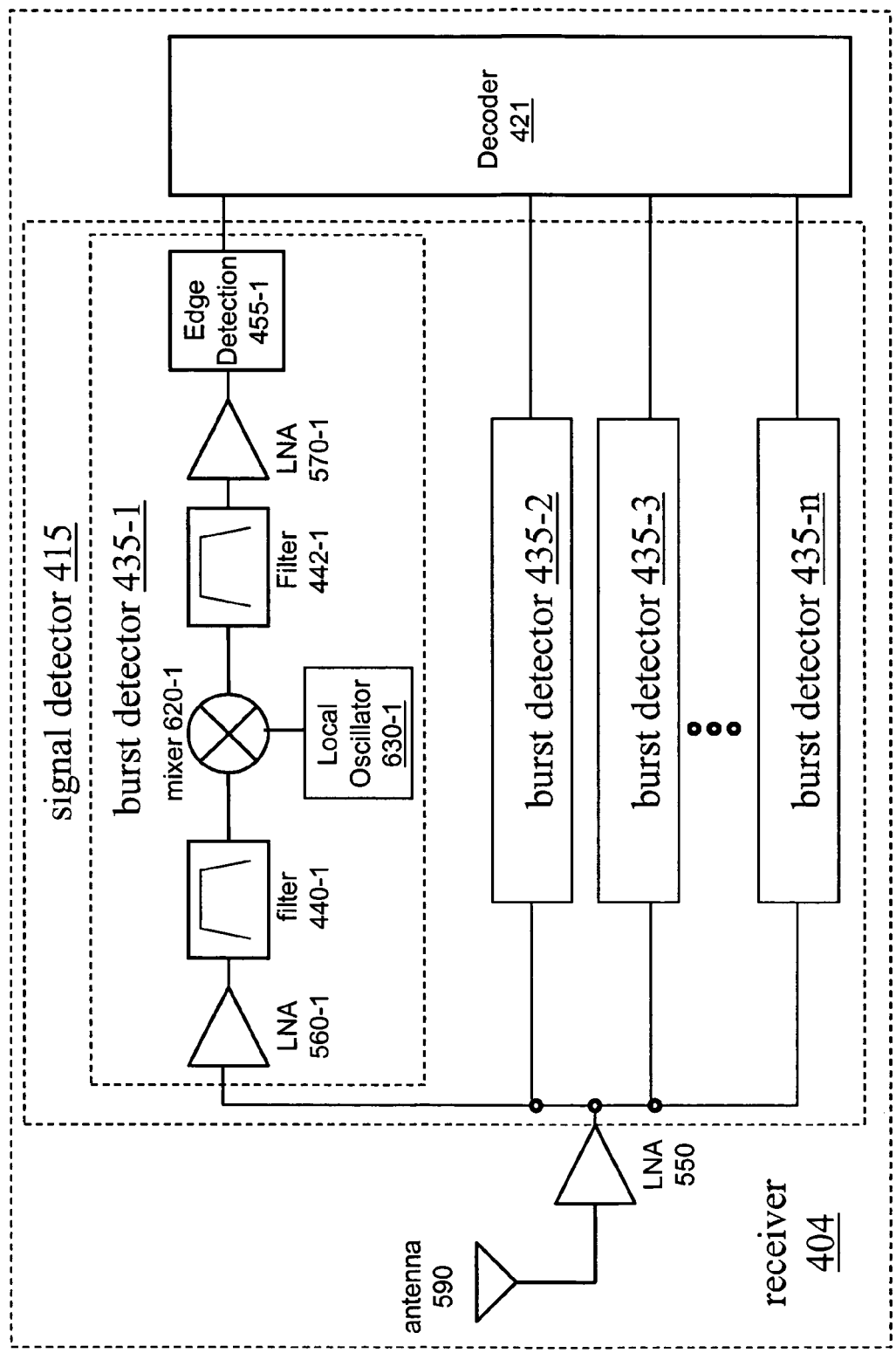
FIG. 52 shows a block diagram of a receiver 404 according to an embodiment of the invention.
Figure 53:
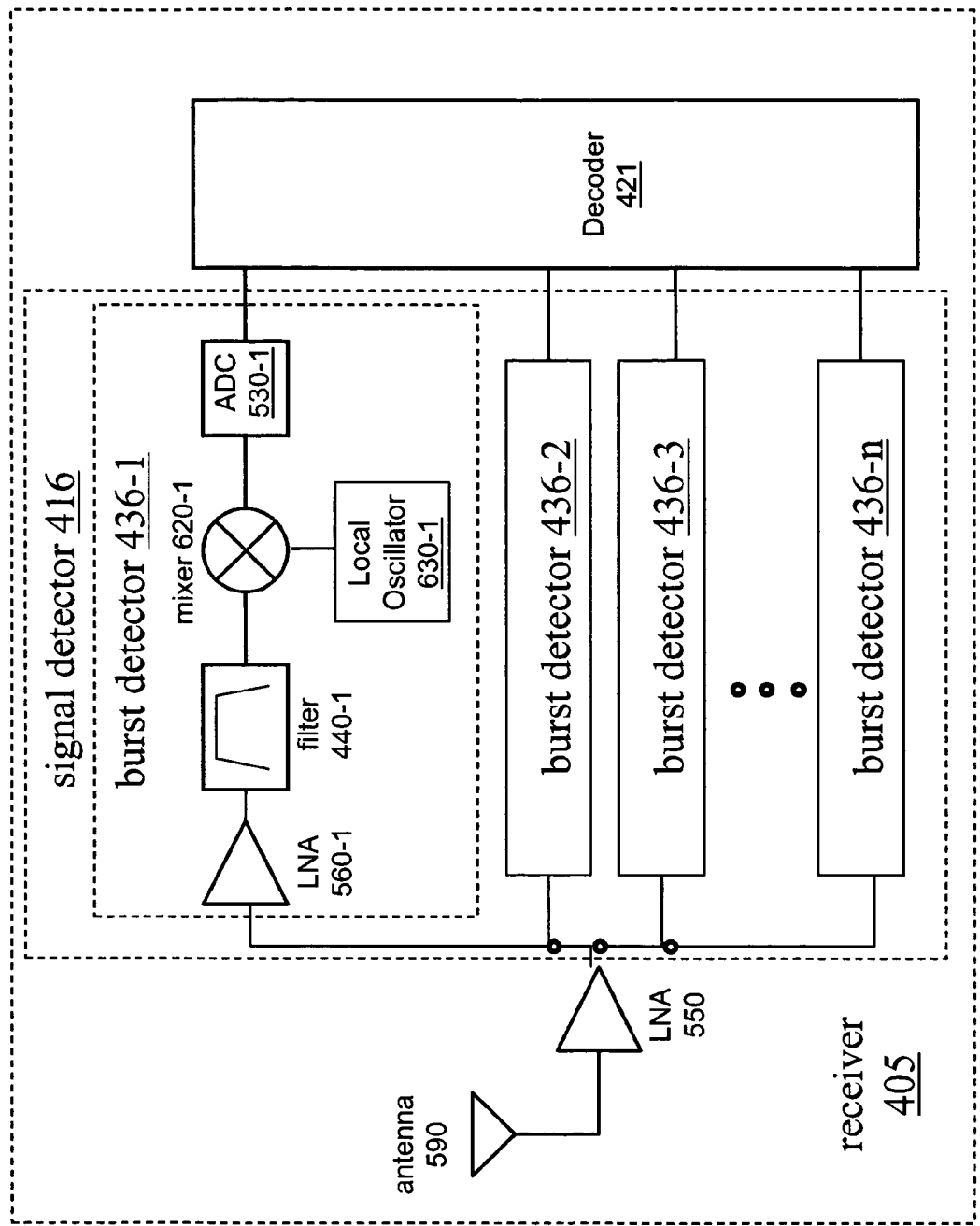
FIG. 53 shows a block diagram of a receiver 405 according to an embodiment of the invention.

It is also possible to divide the signal into different sections of the spectrum and then to downconvert each section separately. After downconversion (e.g. using a mixer 620 and local oscillator 630 at the desired intermediate frequency, which may differ from one frequency band to another), the bursts may be detected using edge detection or the signal may be sampled directly with an ADC. FIG. 52 shows a block diagram of an implementation 404 of receiver 400 that includes edge detectors, and FIG. 53 shows a block diagram of an implementation 405 of receiver 400 that samples each signal directly using an ADC.

Figure 54:
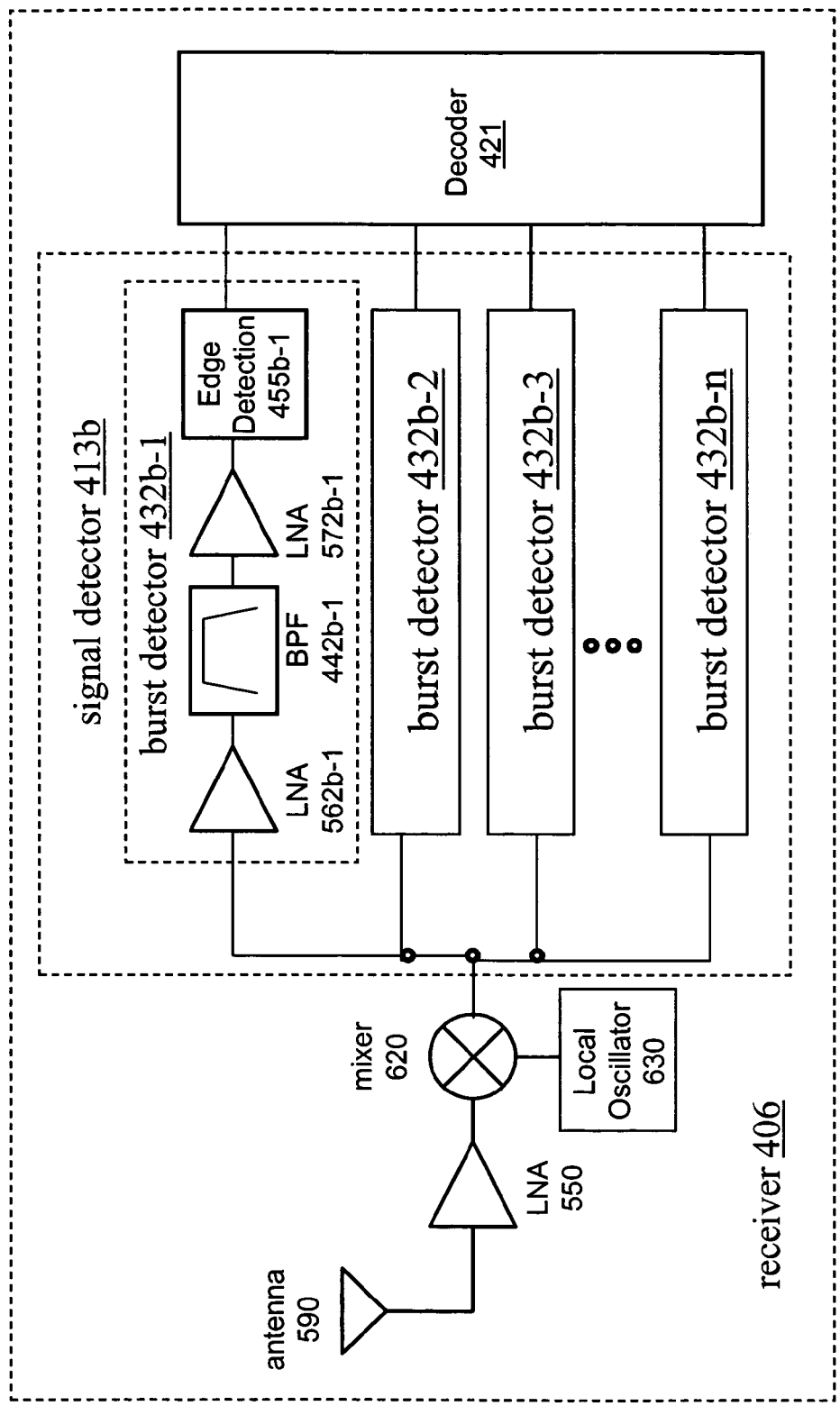
FIG. 54 shows a block diagram of a receiver 406 according to an embodiment of the invention.
Figure 55:
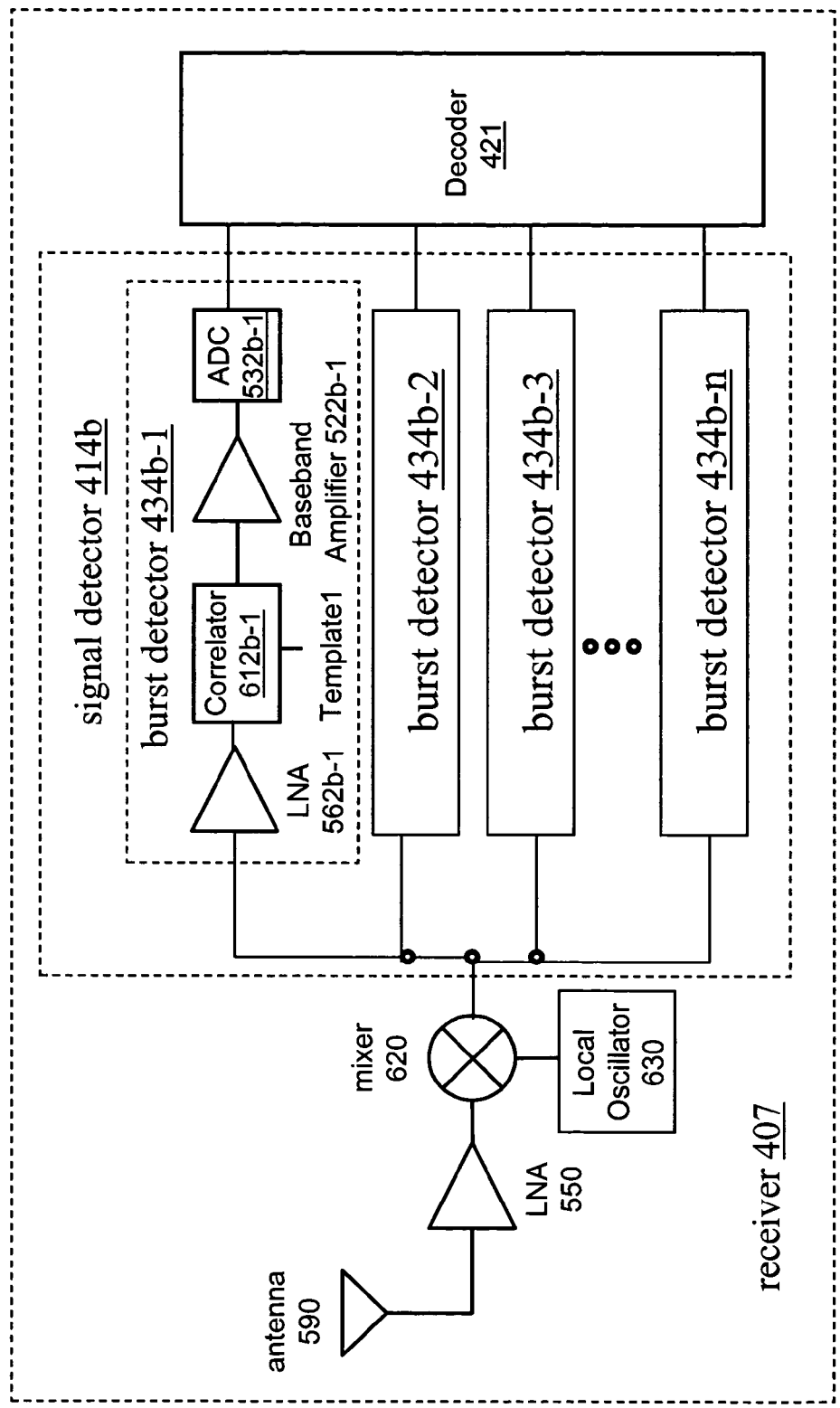
FIG. 55 shows a block diagram of a receiver 407 according to an embodiment of the invention.
Figure 56:
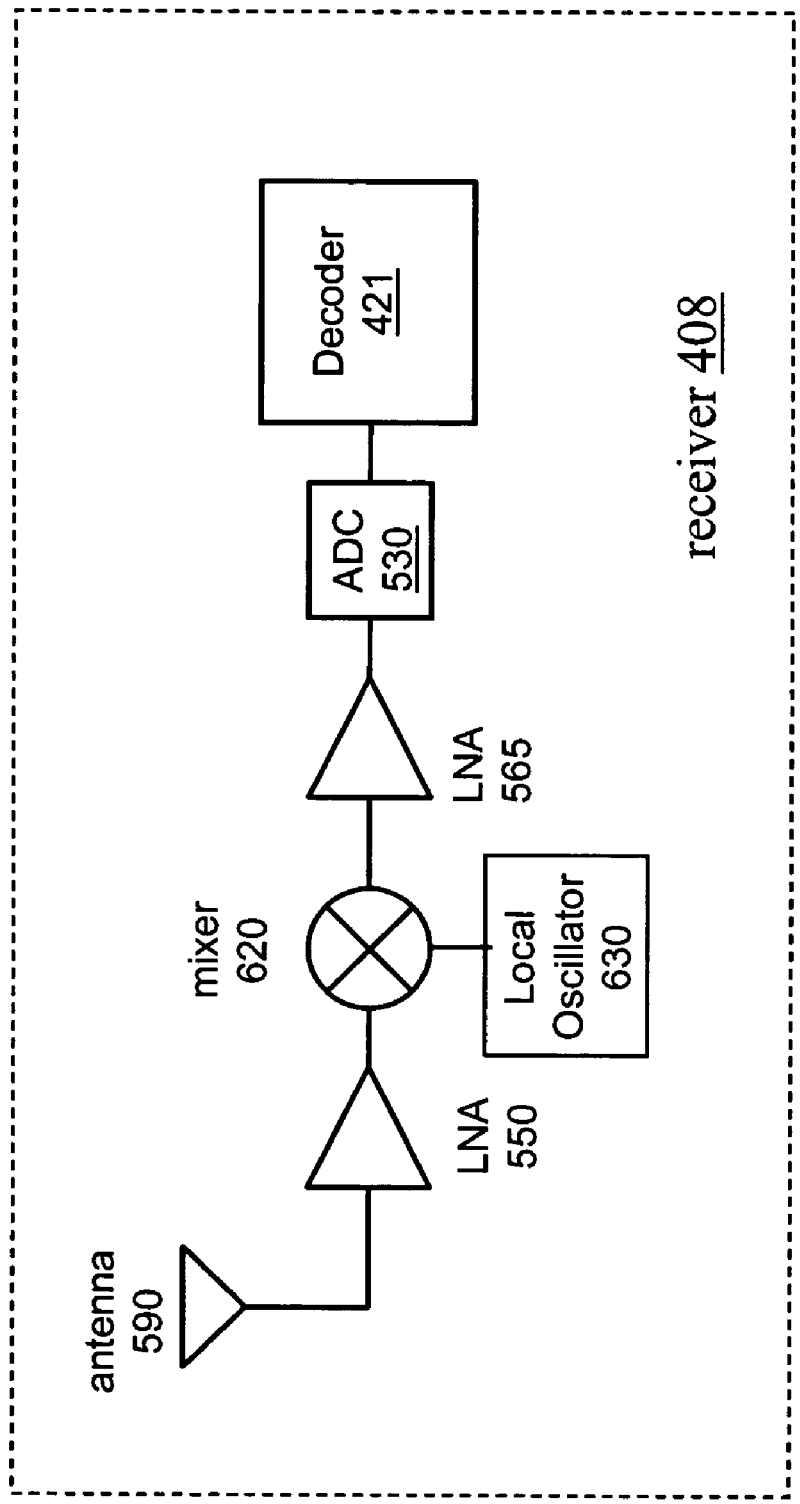
FIG. 56 shows a block diagram of a receiver 408 according to an embodiment of the invention.

In some applications, it may be desirable to downconvert the received signal to an intermediate frequency (e.g. by mixing with a local oscillator signal) before performing further processing as described above. FIG. 54 shows one such implementation 406 of receiver 400 in which the downconverted signal is divided into separate frequencies before edge detection. FIG. 55 shows another implementation in which the downconverted signal is divided into separate frequencies before correlation. FIG. 56 shows a further implementation in which the downconverted and filtered signal is digitized directly.

Figure 57:
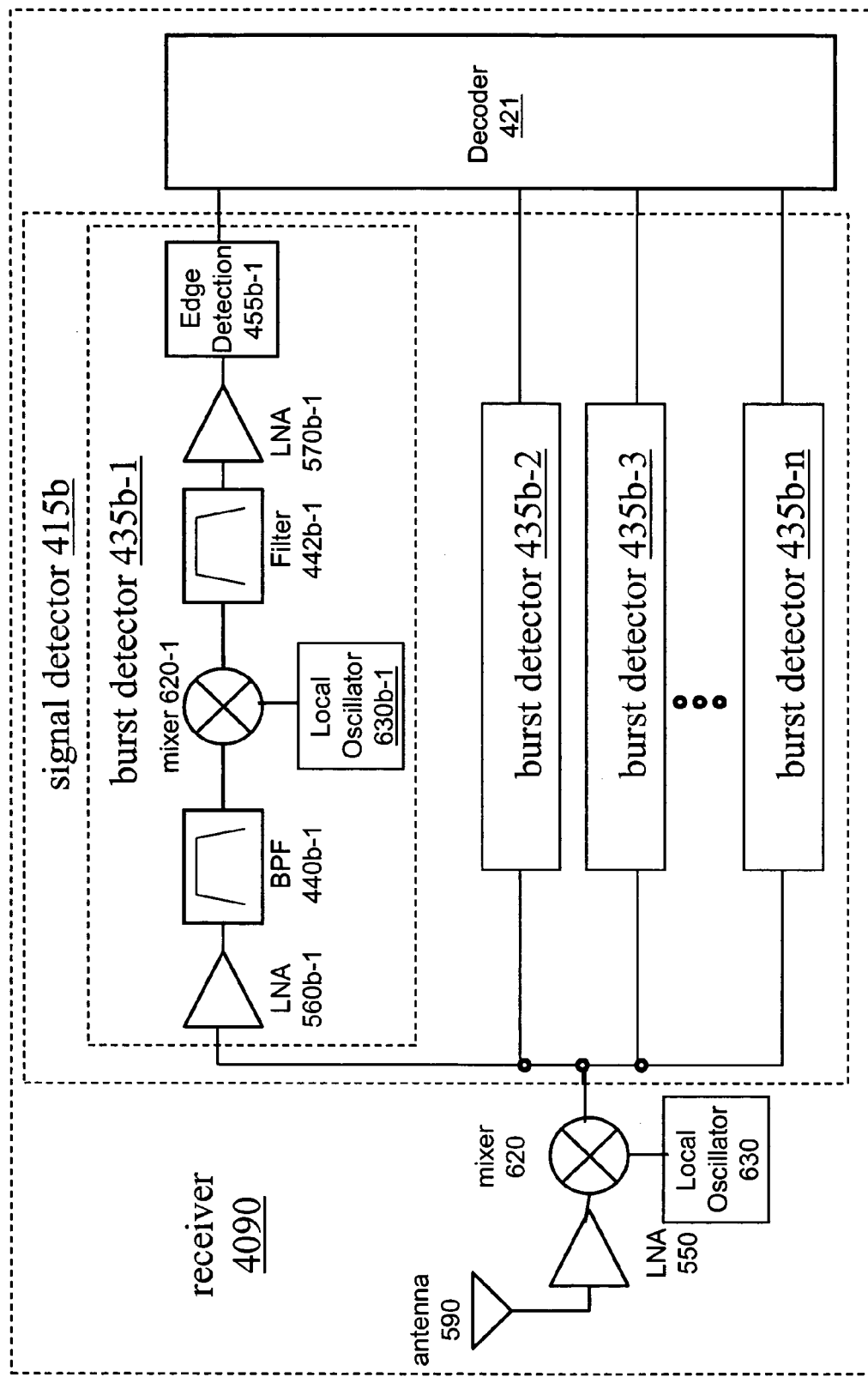
FIG. 57 shows a block diagram of a receiver 409 according to an embodiment of the invention.
Figure 58:
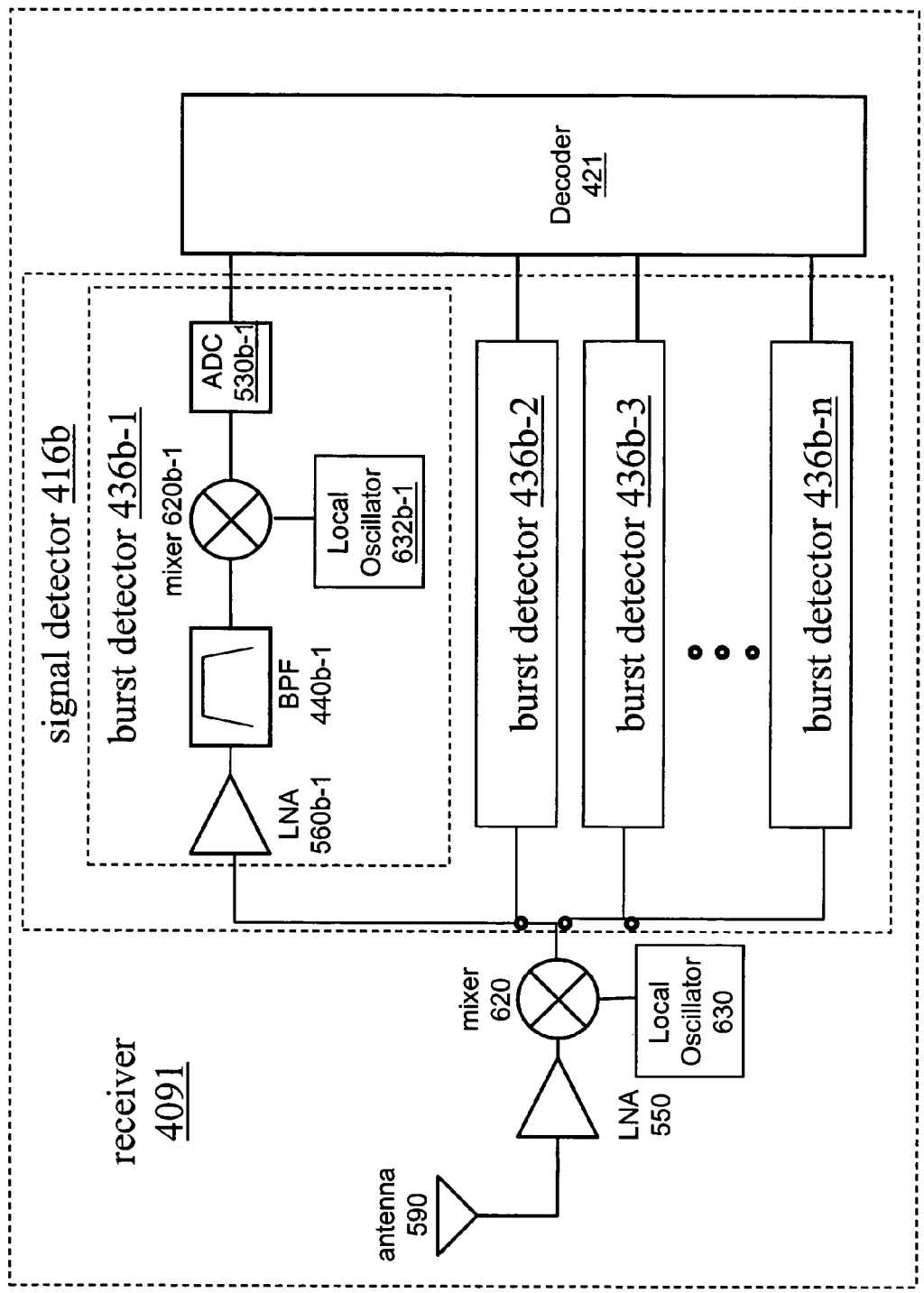
FIG. 58 shows a block diagram of a receiver 4091 according to an embodiment of the invention.

FIG. 57 shows a block diagram of an implementation 4090 of receiver 400 in which an intermediate frequency signal is separated into different frequency bands before a second downconversion and edge detection. FIG. 58 shows a block diagram of another implementation 4091 in which the twice-downconverted signals are digitized and filtered. In some applications, an increase in signal-to-noise ratio may be achieved by performing gating of the received signal (e.g. in combination with a receiver configuration as described herein).

In some applications, it may be desirable for a receiver as described herein to apply a timestamp to one or more received clusters or to otherwise note the order and/or time of arrival of clusters. For example, such information may be applied during decoding of the received symbols and/or may be applied to overcome multipath interference. Information regarding the relative time between clusters may also be used to detect empty clusters (such a technique may also be applied at the time-slot scale to detect empty time slots). For noting order of arrival only, the timestamp may be generated using a counter whose state is updated (e.g. incremented) at each noted event (e.g. cluster arrival). For noting time of arrival, the timestamp may be generated using a clock (e.g. a counter whose state is updated according to an oscillator). For relative measurements between events, it may not be necessary to synchronize such a clock to a reference or to otherwise take account of the clock's initial state.

At least some of the techniques for data transfer as disclosed herein may be embedded into highly scaleable implementations. For example, such a technique may be applied to wireless replacement of cables for transmission of content and/or control data. In a low-end application, this technique may be implemented to replace a cable (e.g. a Universal Serial Bus or USB cable) linking a computer to a low-cost, low-data-rate peripheral such as a computer mouse, keyboard, or handheld gaming controller. In a mid-range application, the technique may be used to replace a cable carrying video information from a computer to a monitor. In a high-end application, the technique may be scaled to replace one or more of the cables that carry high-fidelity video and audio information (e.g. from a receiver, a set-top box, or DVD (Digital Versatile Disc) player) to a high-definition television display and audio system.

Other applications that may vary in cost and performance requirements to those noted above include wireless computer networking, wireless transfer of audio data (e.g. as one or more datastreams and/or files, and in formats such as sampled (e.g. WAV) and/or compressed (e.g. MP3)), wireless transfer of image data (e.g. from a digital still camera or other device including one or more CCD or CMOS sensors, and in uncompressed or compressed (e.g. JPEG, JPEG2000, PNG) format), and wireless replacement of cables transmitting such formats or protocols as Ethernet, USB, IEEE 1394, S-video, NTSC, PAL, SECAM, and VoIP (Voice over IP).

In addition to many office and consumer entertainment applications, such cable replacement may be applied to control systems in industry and at home (e.g. thermostatic control); in automobiles and other vehicles; and in aircraft applications (e.g. for control systems and also to support networking applications such as passenger e-mail). Therefore, systems, methods, and apparatus for data transfer as disclosed herein may be implemented to suit a wide range of different latency, performance, and cost requirements.

One problem that may be encountered when using existing methods of wireless data transfer is an inability (e.g. insufficient data throughput rate) to support the data rate or latency requirements for a demanding application such as real-time video display. As noted above, systems, methods, and apparatus for data transfer as disclosed herein may be implemented to transfer data at very high rates. In one such application, a set-top box includes an apparatus for data transfer as disclosed herein which may be used to transmit a video signal wirelessly to a television display (e.g. a flat-panel display). One benefit that may be realized from a very high data rate in such an application is an ability to update the displayed picture (e.g. in response to the user changing the channel) in real time, rather than after a lag as might be suffered in a low-data-rate system that requires buffering to maintain the displayed picture.

Signal source identification mechanisms may be applied within systems, methods, and apparatus for data transfer as disclosed herein to support networking applications. An identifier such as a serial number may be hard-coded into a transmitter or transceiver (e.g. during manufacture or installation), or the identifier may be assigned or updated by the application during use. The identifier may be transmitted in the same manner as other data to be transferred (e.g. within a protocol or other higher-layer abstraction), or the identifier may be distinguished from other data within the physical layer by using features discussed herein such as logical channelization and/or unused symbol states. Communications applications in which source identification may be useful include directing communications within piconets, mesh networks, and multi-hop networks (e.g. including repeaters); distributed sensor networks for industry and military; encrypted and other secure communications; and selective or exclusive communication between data sources (e.g. a computer or PDA) and peripherals (e.g. a printer).

Applications for systems, methods, and apparatus for data transfer as disclosed herein may include location and position determination tasks. These tasks may include ranging and triangulation operations. A ranging signal may include a burst, a stream of bursts at different frequencies and/or different times, or a cluster or group of clusters. Ultra-wideband signals having extremely short bursts (e.g. durations of one nanosecond or less) are especially well-suited to such applications because the shortness of the bursts corresponds (under ideal conditions) to high spatial resolutions (e.g. down to the order of one centimeter). Better spatial resolution may also be achieved by transmitting the ranging signal over a wide frequency range (e.g. including bursts over more rather than fewer frequency bands). It may be desirable for a ranging signal to include signal source identification information (e.g., as described above), especially in an environment that includes potential interferers such as other transmitters.

In one example of a ranging operation, a first transceiver transmits a ranging signal. A second transceiver detects the signal and transmits a response (e.g. a ranging signal that may include information such as the second transceiver's location). The first transceiver detects the response, notes the round-trip time of flight, removes a known latency value (e.g. the propagation time within the circuits), divides by two to remove the bidirectional component, and divides by the speed of light to determine the distance between the two transceivers. A triangulation (or trilateration) operation may then be performed by combining the distances obtained from at least three such ranging operations (i.e. between the first transceiver and at least three other transceivers having known locations) to determine the first transceiver's location.

In another example of a ranging operation, a first transmitter transmits a ranging signal that is received by three or more receivers. The times of arrival of the signal at each receiver are transmitted to a processing unit (e.g. via a network), which combines the various times of arrival and corresponding receiver locations in a triangulation (or trilateration) operation to determine the transmitter's location. It may be desirable in this case for the receivers to be synchronized to a common clock.

In a variation of the ranging operation above, the ranging signal includes a signal source identifier. Each receiver timestamps the received ranging signal according to the time of arrival and transmits the timestamped signal (including the source identifier) to the processing unit. Such a technique may be used to support location and position determination for multiple transmitters. Transmitter location and position determination may also be performed within a multihop network such that the processing unit is several hops removed from the transmitter.

At least some of the systems, apparatus, and methods of data transfer as disclosed herein may be applied to sensor networks. In such a network, a possibly large number of sensors is deployed across an area, with sensed data being returned (possibly relayed via multihop) to a processing unit. Each sensor is configured to sense an environmental condition such as gas concentration, radiation level at one or more frequencies or ranges (e.g. charged particle, X-ray, visible light, infrared), temperature, pressure, sound, vibration, etc. A sensor may include an analog-to-digital converter for converting data relating to the sensed condition from analog to digital form.

A sensor network as described herein may be used for temperature monitoring within a facility, for an intruder alert system, or for remote monitoring of activity in an area (e.g. for military purposes). The processing unit, which calculates the state of the network from the collective sensed data, may act accordingly or may convey the state information to another unit.

Additionally, use of methods and apparatus for data transfer as described herein may include applications requiring very low cost, robustness to interference and/or multipath, low probability for intercept and/or detection, and/or sensor applications (e.g. networked or peer-to-peer). For example, low-cost sensors may permit vast deployments for either tagging or distributed feedback systems for commercial, industrial, and military applications. Interference and multipath robustness may be especially useful for deployments in industrial settings and military scenarios where jamming (intentional or unintentional) and/or reflections are likely. Low probability for intercept (both in terms of implementing special symbol codes and in terms of possible operations at low emission levels) and low probability for detection are critical components of covert military or sensitive usages.

The foregoing presentation of the described embodiments is provided to enable any person skilled in the art to make or use the invention as claimed. Various modifications to these embodiments are possible, and the generic principles presented herein may be applied to other embodiments as well. For example, implementations of a receiver as described herein may also be applied to receive signals transmitted using chirping techniques as described herein. Additionally, the principles described herein may be applied to communications over wired, wireless, and/or optical transmission channels.

The invention may be implemented in part or in whole as a hard-wired circuit and/or as a circuit configuration fabricated into an application-specific integrated circuit. The invention may also be implemented in part or in whole as a firmware program loaded into non-volatile storage (e.g. ROM or flash or battery-backup RAM) or a software program loaded from or into a data storage medium (for example, a read-only or rewritable medium such as a semiconductor or ferromagnetic memory (e.g. ROM, programmable ROM, dynamic RAM, static RAM, or flash RAM); or a magnetic, optical, or phase-change medium (e.g. a floppy, hard, or CD or DVD disk)) as machine-readable code, such code being instructions executable by an array of logic elements such as a microprocessor or other digital signal processing unit or an FPGA.

In some cases, for example, the design architecture for a time division multiple frequency (TDMF) modulation technique according to an embodiment of the invention may be realized in an application-specific integrated circuit (ASIC). Such a design may be implemented as a stand-alone packaged device, or embedded as a core in a larger system ASIC. Features of an architecture according to certain such embodiments of the invention lend themselves well to an ASIC implementation that enables low cost, low power, and/or high volume production. Embodiments of the invention may include designs that are scalable with evolving semiconductor technologies, enabling increased performance objectives and expanded applications. In some cases an entire such architecture may be implemented in a single semiconductor process, although even in these cases it may be possible to transfer the design to multiple semiconductor technologies rather than to depend on a single semiconductor process.

Thus, the present invention is not intended to be limited to the embodiments shown above but rather is to be accorded the widest scope consistent with the principles and novel features disclosed in any fashion herein.

What is claimed is:

1. A method of data transmission, said method comprising:
   transmitting a plurality of bursts to transmit data, each burst occupying at least one of a plurality of frequency bands;
   wherein a bandwidth of at least one of the plurality of bursts is at least two percent of the center frequency of the burst.

2. The method of data transmission according to claim 1 further comprising:
   receiving, prior to the transmitting step, a data signal including the data.

3. The method of data transmission according to claim 1, further comprising:
   encoding the data to the plurality of bursts.

4. The method of data transmission according to claim 1, wherein an order of the plurality of bursts in time corresponds to the data.

5. The method of data transmission according to claim 1, wherein a time relationship of the plurality of bursts relative to each other corresponds to the data.

6. The method of data transmission according to claim 1, wherein a bandwidth of at least one of the plurality of bursts is at least ten percent of the center frequency of the burst.

7. The method of data transmission according to claim 1, wherein a bandwidth of at least one of the plurality of bursts is at least twenty percent of the center frequency of the burst.

8. The method of data transmission according to claim 1, wherein a bandwidth of at least one of the plurality of bursts is at least 10 MHz.

9. The method of data transmission according to claim 1, wherein a bandwidth of at least one of the plurality of bursts is at least 100 MHz.

10. The method of data transmission according to claim 1, wherein a bandwidth of at least one of the plurality of bursts is at least 1 GHz.

11. The method of data transmission according to claim 1, wherein a bandwidth of at least one of the plurality of bursts is at least 10 GHz.

12. The method of data transmission according to claim 1, wherein a duration of at least one of the plurality of bursts is less than one cycle.

13. The method of data transmission according to claim 1, wherein a duration of at least one of the plurality of bursts is less than five cycles.

14. The method of data transmission according to claim 1, wherein a duration of at least one of the plurality of bursts is less than ten cycles.

15. The method of data transmission according to claim 1, wherein the transmitting occurs over a plurality of time periods, wherein for each time period, no more than one of the plurality of bursts is transmitted.

16. The method of data transmission according to claim 1, wherein the transmitting occurs over a plurality of time periods, wherein for at least one time period, more than one of the plurality of bursts is transmitted.

17. The method of data transmission according to claim 1, wherein for each frequency band occupied by one of the plurality of bursts, no other one of the plurality of bursts occupies the frequency band.

18. The method of data transmission according to claim 1, wherein for at least one given frequency band occupied by one of the plurality of bursts, at least one other of the plurality of bursts occupies the given frequency band.

19. The method of data transmission according to claim 1, wherein none of the plurality of frequency bands overlap.

20. The method of data transmission according to claim 1, wherein at least one of the plurality of frequency bands overlap.

21. The method of data transmission according to claim 1, wherein the transmitting step comprises transmitting the plurality of bursts from a single signal launcher.

22. The method of data transmission according to claim 1, wherein the transmitting step comprises transmitting the plurality of bursts such that the data is not transmitted by less than all of the plurality of bursts.

23. The method of data transmission according to claim 1, wherein each of the plurality of bursts by itself does not carry the data.

24. The method of data transmission according to claim 1, wherein, for each of the plurality of bursts, a time of transmission of the burst relative to the rest of the plurality of bursts occurs according to an expected propagation delay of the burst.

25. The method of data transmission according to claim 1, wherein each burst occupies at least one of the plurality of frequency bands, but less than all of the plurality of frequency bands.

26. The method of data transmission according to claim 1, wherein said transmitting includes transmitting the plurality of bursts over an optical fiber.

27. The method of data transmission according to claim 1, wherein said transmitting includes transmitting the plurality of bursts over a cable having at least one conductor.

28. The method of data transmission according to claim 1, wherein said transmitting includes transmitting the plurality of bursts over a wireless transmission channel.

29. A method of data transmission, said method comprising:
    defining a plurality of frequency bands;
    transmitting a plurality of bursts, each burst occupying at least one of a plurality of frequency bands;
    wherein one of the plurality of bursts occupies a different one of the plurality of frequency bands than another one of the plurality of bursts;
    wherein a bandwidth of each of the plurality of bursts is at least two percent of the center frequency of the burst;
    wherein plurality of bursts transmit data.

\* \* \* \* \*